(12) United States Patent
Machida et al.

(10) Patent No.: US 10,362,246 B2
(45) Date of Patent: Jul. 23, 2019

(54) SOLID-STATE IMAGE PICKUP DEVICE, METHOD OF DRIVING THE SAME, AND ELECTRONIC APPARATUS

(71) Applicant: SONY CORPORATION, Tokyo (JP)

(72) Inventors: Takashi Machida, Tokyo (JP); Minoru Ishida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/845,244

(22) Filed: Dec. 18, 2017

(65) Prior Publication Data

US 2018/0124335 A1 May 3, 2018

Related U.S. Application Data

(63) Continuation of application No. 15/574,540, filed as application No. PCT/JP2017/005417 on Feb. 15, 2017.

(30) Foreign Application Priority Data

Mar. 31, 2016 (JP) .................................. 2016-069981

(51) Int. Cl.
| | |
|---|---|
| H04N 5/335 | (2011.01) |
| H04N 5/369 | (2011.01) |
| H04N 5/3745 | (2011.01) |
| H04N 5/355 | (2011.01) |
| H01L 27/30 | (2006.01) |

(52) U.S. Cl.
CPC .......... H04N 5/355 (2013.01); H01L 27/307 (2013.01); H04N 5/35563 (2013.01); H04N 5/379 (2018.08); H04N 5/3745 (2013.01); H04N 5/37457 (2013.01)

(58) Field of Classification Search
None
See application file for complete search history.

(56) References Cited

U.S. PATENT DOCUMENTS

| | | | |
|---|---|---|---|
| 9,147,704 B2* | 9/2015 | Li | ...................... H01L 27/14607 |
| 9,332,200 B1* | 5/2016 | Hseih | ...................... H04N 5/363 |

* cited by examiner

*Primary Examiner* — Mark T Monk
(74) *Attorney, Agent, or Firm* — Sheridan Ross P.C.

(57) ABSTRACT

A solid-state image pickup device according to the present disclosure includes: a pixel array unit, unit pixels being arranged in the pixel array unit, the unit pixels each including a plurality of photoelectric conversion sections; and a driving unit that changes a sensitivity ratio of the plurality of photoelectric conversion sections by performing intermittent driving with respect to storing of signal charges of the plurality of photoelectric conversion sections. That is, the solid-state image pickup device according to the present disclosure changes a sensitivity ratio of the plurality of photoelectric conversion sections by performing intermittent driving with respect to storing of signal charges of the plurality of photoelectric conversion sections.

18 Claims, 52 Drawing Sheets

SOLID-STATE IMAGE PICKUP DEVICE, METHOD OF DRIVING THE SAME, AND ELECTRONIC APPARATUS

CROSS REFERENCE TO RELATED APPLICATIONS

This application is a continuation of U.S. patent application Ser. No. 15/574,540, filed Nov. 16, 2017, which is a national stage application under 35 U.S.C. 371 and claims the benefit of PCT Application No. PCT/JP2017/005417 having an international filing date of Feb. 15, 2017, which designated the United States, which PCT application claimed the benefit of Japanese Patent Application No. 2016-069981 filed Mar. 31, 2016, the disclosures of which are incorporated herein by reference in their entirety.

TECHNICAL FIELD

The present disclosure relates to a solid-state image pickup device, a method of driving the same, and an electronic apparatus.

BACKGROUND ART

In a solid-state image pickup device, from a unit pixel including a photoelectric conversion section, an output signal substantially linear with respect to the amount of charges stored in the photoelectric conversion section by photoelectric conversion is obtained. Then, the dynamic range of the solid-state image pickup device is uniquely determined by the amount of charges (amount of saturated charges) that the unit pixel can store in the photoelectric conversion section and the noise level. That is, the lower limit of the output level of the solid-state image pickup device is limited by the noise level, and the upper limit thereof is limited by the saturation level of the photoelectric conversion section. As a result, the dynamic range of the solid-state image pickup device is uniquely determined by the amount of saturated charge and the noise level of the photoelectric conversion section.

In the past, as a technology for expanding the dynamic range of the solid-state image pickup device, the following three methods have been known.
(1) Time division method: expand a dynamic range by capturing a plurality of images with different sensitivities due to a difference in storing time by time division and combining the plurality of images captured by time division (see, for example, Patent Literature 1)
(2) Spatial division method: expand a dynamic range by providing a plurality of pixels with different sensitivities and combining a plurality of images captured by the plurality of pixels with different sensitivities (see, for example, Patent Literature 2)
(3) In-pixel memory addition method: expand a dynamic range by providing, in each pixel, a memory that stores charges overflowed from a photoelectric conversion section to increase the amount of charges that can be stored in a period of time of exposure (see, for example, Patent Literature 3)

CITATION LIST

Patent Literature

Patent Literature 1: Japanese Patent Application Laid-open No. 2001-346096

Patent Literature 2: Japanese Patent Application Laid-open No. 1993-64083

Patent Literature 3: Japanese Patent Application Laid-open No. 2005-328493

DISCLOSURE OF INVENTION

Technical Problem

The existing technologies described in the above-mentioned Patent Literature 1 to Patent Literature 3 have the following problems.
(1) Time division method described in Patent Literature 1: although the dynamic range can be expanded by increasing the number of division in time division, artifacts occur when the number of division is increased.
(2) Spatial division method described in Patent Literature 2: although the dynamic range can be expanded by increasing the number of division in spatial division, image quality is deteriorated due to reduction in the resolution or the like when the number of division is increased.
(3) In-pixel memory addition method described in Patent Literature 3: since the memory capacity is limited, there is a limit to the dynamic range that can be expanded.

It is an object of the present disclosure to provide a solid-state image pickup device, a method of driving the same, and an electronic apparatus including the solid-state image pickup device that are capable of expanding a dynamic range by capturing a plurality of images with a sensitivity ratio that can be arbitrarily controlled by a method different from a time division method, a spatial division method, and an in-pixel memory addition method.

Solution to Problem

In order to achieve the above-mentioned object, a solid-state image pickup device according to the present disclosure includes:

a pixel array unit, unit pixels being arranged in the pixel array unit, the unit pixels each including a plurality of photoelectric conversion sections; and a driving unit that changes a sensitivity ratio of the plurality of photoelectric conversion sections by performing intermittent driving with respect to storing of signal charges of the plurality of photoelectric conversion sections.

Further, in order to achieve the above-mentioned object, an electronic apparatus according to the present disclosure includes the solid-state image pickup device having the above-mentioned configuration as an imaging unit.

In order to achieve the above-mentioned object, a solid-state image pickup device according to the present disclosure includes:

in driving the solid-state image pickup device including a pixel array unit, unit pixels being arranged in the pixel array unit, the unit pixels each including a plurality of photoelectric conversion sections, changing a sensitivity ratio of the plurality of photoelectric conversion sections by performing intermittent driving with respect to storing of signal charges of the plurality of photoelectric conversion sections.

In the solid-state image pickup device having the above-mentioned configuration, the method of driving the same, or the electronic apparatus, the sensitivity ratio of the plurality of photoelectric conversion sections can be arbitrarily controlled by a method of performing intermittent driving (intermittent driving), which is different from a time division method, a spatial division method, and an in-pixel memory addition method, with respect to storing of signal charges of a plurality of photoelectric conversion sections. Then, by capturing a plurality of images with the sensitivity ratio that can be arbitrarily controlled, it is possible to expand the dynamic range.

Advantageous Effects of Invention

In accordance with the present disclosure, since the sensitivity ratio of the plurality of photoelectric conversion sections can be arbitrarily controlled by intermittent driving with respect to storing of signal charges of a plurality of photoelectric conversion sections, the dynamic range can be freely changed as compared with the case where the sensitivity difference is physically provided.

It should be noted that the effect described here is not necessarily limitative and may be any effect described in the present disclosure. Further, the effects described herein are merely examples and are not limited, and additional effects may be provided.

MODE(S) FOR CARRYING OUT THE INVENTION

Figure 1:
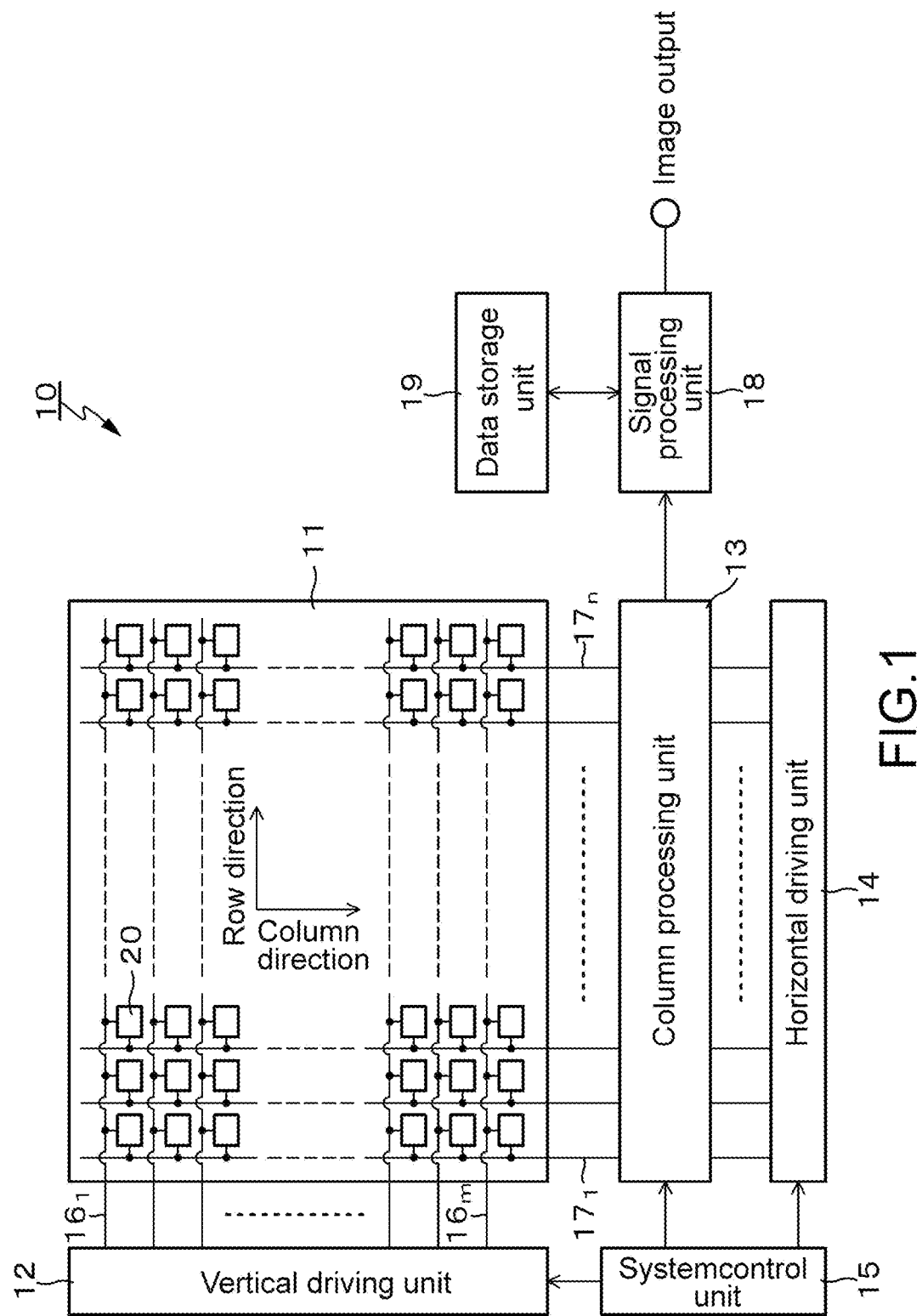
FIG. 1 is a system configuration diagram schematically showing a system configuration of a CMOS image sensor to which the technology of the present disclosure is applied.

Hereinafter, embodiments for carrying out the technology of the present disclosure (hereinafter, referred to as "embodiments") will be described in detail with reference to the drawings. The technology of the present disclosure is not limited to the embodiments, and various numerical values, materials, and the like in the embodiments are merely examples. In the following description, the same components or components having the same function will be denoted by the same reference symbols, and duplicate description will be omitted. Note that descriptions will be made in the following order.

1. Solid-state Image Pickup Device, Method of Driving the Same, and Electronic Apparatus according to Present Disclosure, and General Description
2. Solid-state Image Pickup Device to which Technology of Present Disclosure Is Applied
   2-1. Basic System Configuration
   2-2. Another System Configuration
3. Description of Noise Removal Processing
   3-1. Processing Example 1 of Noise Removal Processing
   3-2. Processing Example 2 of Noise Removal Processing
4. Usage Example of Solid-state Image Pickup Device to which Technology of Present Disclosure Is Applied
5. First Embodiment (Example in which Discharge Destination of Signal Charge of Second Photodiode Is Power Source $V_{DD}$)
   5-1. Circuit Configuration of Unit Pixel
   5-2. Circuit Operation of Unit Pixel
   5-3. Method of Expanding Dynamic Range
6. Second Embodiment (Example in which Discharge Destination of Second Photodiode Is First Photodiode)
   6-1. Circuit Configuration of Unit Pixel
   6-2. Circuit Operation of Unit Pixel
   6-3. Modified Example 1 of Second Embodiment
   6-4. Modified Example 2 of Second Embodiment
7. Third Embodiment (Example in which FD Selector Switch Is Placed between Transfer Transistor and Reset Transistor on First Photodiode Side)
   7-1. Circuit Configuration of Unit Pixel
   7-2. Circuit Operation in High-conversion Efficiency Mode
   7-3. Circuit Operation in Low-conversion Efficiency Mode
8. Fourth Embodiment (Example in which FD Selector Switch Is Placed Between Transfer Transistor and Reset Transistor on Second Photodiode Side)
   8-1. Circuit Configuration of Unit Pixel
   8-2. Circuit Operation of Unit Pixel
9. Fifth Embodiment (Example in which Second Embodiment, Third Embodiment, and Fourth Embodiment Are Combined)
   9-1. Circuit Configuration of Unit Pixel
   9-2. Circuit Operation of Unit Pixel
   9-3. Arithmetic Processing for Pixel Signal
10. Sixth Embodiment (Example in which Sensitivity of Photodiode Is Adaptively Controlled)
   10-1. Configuration of Control System
   10-2. Flow of Processing of Control System
11. Operations and Effects of First Embodiment to Sixth Embodiment
12. Modified Examples of First Embodiment to Sixth Embodiment
13. Electronic Apparatus according to Present Disclosure (Example of Imaging Apparatus)

14. Seventh Embodiment (Example in which Mechanism Adjusting Exposure Time Period of Unit Pixel for each Pixel Is Provided)
    14-1. System Configuration
    14-2. Internal Configuration of Unit Pixel
    14-3. Three-dimensional Configuration of System
    14-4. Planar Layout of Unit Pixel
    14-5. Subject-to-brightness Evaluation at Certain Point in One Exposure Period
    14-6. Analysis of Pixel Data and Control of Imaging Conditions
    14-7. Control Flow of Exposure Time Period
    14-7-1. Case where Exposure Is Continued with Duty Ratio=100%
    14-7-2. Case where Exposure Is Continued with Duty Ratio=50%
    14-7-3. Case where Exposure Is Continued with Duty Ratio=25%
    14-7-4. Regarding Output of First and Second Photoelectric conversion sections Obtained by Exposure Operation
    14-8. Modified Example 1 of Seventh Embodiment (Example in which One Pixel Control Unit and Pixel Signal Processing Unit Are Responsible for Control and Signal Processing of Plurality of Unit Pixels)
    14-9. Modified Example 2 of Seventh Embodiment (Example in which Unit Pixel Includes One Photoelectric conversion section)
    14-10. Modified Example 3 of Seventh Embodiment (Example in which Capacity of Charge Storing Unit Is Changed for each Pixel depending on Subject Brightness)
    14-11. Modified Example 4 of Seventh Embodiment (Example in which Exposure-time-period control and Capacity Control of Charge Storing Unit Are Provided)
15. Configuration of Present Disclosure
    <Solid-State Image Pickup Device, Method of Driving the Same, and Electronic Apparatus According to Present Disclosure, and General Description>

In a solid-state image pickup device, a method of driving the same, and an electronic apparatus according to the present disclosure, the plurality of photoelectric conversion sections may each be configured to include a first photoelectric conversion section and a second photoelectric conversion section. Further, the unit pixels may be configured to include a charge-voltage conversion section, a first transfer gate unit, a second transfer gate unit, and a discharge gate unit, the first transfer gate unit transferring charges photoelectrically converted by the first photoelectric conversion section to the charge-voltage conversion section, the second transfer gate unit transferring charges photoelectrically converted by the second photoelectric conversion section to the charge-voltage conversion section, the discharge gate unit discharging the charges photoelectrically converted by the second photoelectric conversion section.

In the solid-state image pickup device, the method of driving the same, and the electronic apparatus according to the present disclosure including the above-mentioned favorable configuration, the discharge gate unit may be configured to discharge the charges photoelectrically converted by the second photoelectric conversion section to the first photoelectric conversion section. Further, the intermittent driving may be intermittent driving by a pulse signal for driving the discharge gate unit and the second transfer gate unit.

Further, in the solid-state image pickup device, the method of driving the same, and the electronic apparatus according to the present disclosure including the above-mentioned favorable configuration, the driving unit may be configured to cause the second transfer gate unit and the discharge gate unit to alternately operate with the same frequency in an exposure period so that conduction periods of the second transfer gate unit and the discharge gate unit do not overlap. Further, a gate electrode forming the discharge gate unit may be configured to be provided to overlap with a part of the first photoelectric conversion section.

Further, in the solid-state image pickup device, the method of driving the same, and the electronic apparatus according to the present disclosure including the above-mentioned favorable configuration, the discharge gate unit may be configured to include two gate units arranged in series between the second photoelectric conversion section and the first photoelectric conversion section. At this time, favorably, of the two gate units, the gate unit on a side of the first photoelectric conversion section includes a gate electrode provided to overlap with a part of the first photoelectric conversion section.

Alternatively, in the solid-state image pickup device, the method of driving the same, and the electronic apparatus according to the present disclosure including the above-mentioned favorable configuration, the unit pixels may each be configured to include an amplification transistor, a reset transistor, and a first switching gate unit, the amplification transistor outputting voltage converted by the charge-voltage conversion section, the reset transistor resetting the charge-voltage conversion section, the first switching gate unit being provided between the first transfer gate unit and the reset transistor. Further, the charge-voltage conversion section may be configured to have a first area and a second area, the first area being surrounded by the first transfer gate unit, the amplification transistor, and the first switching gate unit, the second area being surrounded by the first switching gate unit, the reset transistor, and the second transfer gate unit.

Further, in the solid-state image pickup device, the method of driving the same, and the electronic apparatus according to the present disclosure including the above-mentioned favorable configuration, the first switching gate unit may be configured to be capable of switching a high-conversion efficiency mode and a low-conversion efficiency mode with respect to the charge-voltage conversion section when reading signal charges of the first photoelectric conversion section. Further, the unit pixels may each be configured to include a capacitive element connected to the second area.

Alternatively, in the solid-state image pickup device, the method of driving the same, and the electronic apparatus according to the present disclosure including the above-mentioned favorable configuration, the unit pixels may each be configured to include an amplification transistor, a reset transistor, and a second switching gate unit, the amplification transistor outputting voltage converted by the charge-voltage conversion section, the reset transistor resetting the charge-voltage conversion section, the second switching gate unit being provided between the second transfer gate unit and the reset transistor. Further, the charge-voltage conversion section may be configured to have a first area and a second area, the first area being surrounded by the first transfer gate unit, the amplification transistor, and the second switching gate unit, the second area being located between the second transfer gate unit and the second switching gate unit. Further, the unit pixels may each be configured to include a capacitive element connected to the second area.

Alternatively, in the solid-state image pickup device, the method of driving the same, and the electronic apparatus according to the present disclosure including the above-mentioned favorable configuration, the unit pixels may each be configured to include an amplification transistor, a reset transistor, a first switching gate unit, and a second switching gate unit, the amplification transistor outputting voltage converted by the charge-voltage conversion section, the reset transistor resetting the charge-voltage conversion section, the first switching gate unit being provided between the first transfer gate unit and the reset transistor, the second switching gate unit being provided between the second transfer gate unit and the reset transistor. Further, the charge-voltage conversion section may be configured to have a first area, a second area, and a third area, the first area being surrounded by the first transfer gate unit, the amplification transistor, and the first switching gate unit, the second area being surrounded by the first switching gate unit, the second switching gate unit, and the reset transistor, the third area being located between the second transfer gate unit and the second switching gate unit. Further, the unit pixels may each be configured to include a capacitive element connected to the third area.

Alternatively, in the solid-state image pickup device, the method of driving the same, and the electronic apparatus according to the present disclosure including the above-mentioned favorable configuration, the plurality of photoelectric conversion sections may each be configured to include a first photoelectric conversion section and a second photoelectric conversion section. Further, the unit pixels may each be configured to include a charge storing unit, a first transfer gate unit, second and third transfer gate units, a fourth transfer gate unit, a discharge gate unit, an exposure-time-period control section, and an amount-of-charge evaluation section. The first transfer gate unit transfers charges photoelectrically converted by the first photoelectric conversion section to the charge-voltage conversion section. The second and third transfer gate units each couple potentials of the charge storing unit and the charge-voltage conversion section. The fourth transfer gate unit transfers charges photoelectrically converted by the second photoelectric conversion section to the charge storing unit. The discharge gate unit discharges the charges photoelectrically converted by the second photoelectric conversion section. The exposure-time-period control section controls an exposure time period of an exposure operation in the second photoelectric conversion section by controlling conduction/non-conduction of the fourth transfer gate unit and the discharge gate unit. The amount-of-charge evaluation section evaluates an amount of charges stored in the charge storing unit at a point in a period of one exposure operation in the second photoelectric conversion section. At this time, it is favorable that an overflow path is formed on a lower portion of a gate electrode of the fourth transfer gate unit, the overflow path transferring charges overflowed from the second photoelectric conversion section to the charge storing unit. Further, the exposure-time-period control section may be configured to control, depending on an evaluation result of the amount-of-charge evaluation section, the exposure time period after evaluation by the amount-of-charge evaluation section in the one exposure operation in the second photoelectric conversion section.

A solid-state image pickup device, a method of driving the same, and an electronic apparatus according to the present disclosure may be configured to include a pixel array unit including unit pixels, the unit pixels each including a photoelectric conversion section;

a driving unit that performs intermittent driving with respect to storing of signal charges of the photoelectric conversion section; and a control system that controls an exposure time period of the photoelectric conversion section on the basis of a signal level obtained from the photoelectric conversion section.

Further, in the solid-state image pickup device, the method of driving the same, and the electronic apparatus according to the present disclosure including the above-mentioned favorable configuration, the control system may be configured to include a subject brightness evaluation section and an exposure-time-period control section. The subject brightness evaluation section evaluates brightness of a subject on the basis of the signal level obtained from the photoelectric conversion section. The exposure-time-period control section controls an exposure time period by controlling a pulse width of a pulse signal that performs intermittent driving with respect to storing of signal charges of the photoelectric conversion section on the basis of an evaluation result of the subject brightness evaluation section.

In a solid-state image pickup device, a method of driving the same, and an electronic apparatus according to the present disclosure may be configured to include a pixel array unit including unit pixels, the unit pixels each including a photoelectric conversion section. Further, the unit pixels may each be configured to include a charge storing unit, a transfer gate unit, a discharge gate unit, an exposure-time-period control section, and an amount-of-charge evaluation section. The transfer gate unit transfers charges photoelectrically converted by the photoelectric conversion section to the charge storing unit. The discharge gate unit discharges the charges photoelectrically converted by the photoelectric conversion section. The exposure-time-period control section controls an exposure time period of an exposure operation in the photoelectric conversion section by controlling conduction/non-conduction of the transfer gate unit and the discharge gate unit. The amount-of-charge evaluation section evaluates an amount of charges stored in the charge storing unit at a point in a period of one exposure operation in the photoelectric conversion section. Further, the exposure-time-period control section may be configured to control, depending on an evaluation result of the amount-of-charge evaluation section, the exposure time period after evaluation by the amount-of-charge evaluation section in the one exposure operation by the photoelectric conversion section.

<Solid-State Image Pickup Device to which Technology of Present Disclosure is Applied>

[Basic System Configuration]

FIG. 1 is a system configuration diagram schematically showing a configuration of a solid-state image pickup device, e.g., a CMOS image sensor of one type of X-Y address type solid-state image pickup device, to which the technology of the present disclosure is applied. Note that the CMOS image sensor is an image sensor created by applying or partially using a CMOS process.

A CMOS image sensor 10 according to this application example includes a pixel array unit 11 formed on a semiconductor substrate (semiconductor chip) (not shown), and a peripheral circuit unit integrated on the same semiconductor substrate as the semiconductor substrate on which the pixel array unit 11 is formed. The peripheral circuit unit includes, for example, a vertical driving unit 12, a column processing unit 13, a horizontal driving unit 14, and a system control unit 15.

The CMOS image sensor 10 further includes a signal processing unit 18 and a data storing unit 19. The signal processing unit 18 and the data storing unit 19 may be mounted on the same substrate as the substrate of the CMOS image sensor 10, or may be placed on a substrate different from the substrate of the CMOS image sensor 10. Further, processing of the signal processing unit 18 and the data storing unit 19 may be performed by an external signal processing unit, e.g., DSP (Digital Signal Processor) circuit, provided on a substrate different from the substrate of the CMOS image sensor 10, or software.

The pixel array unit 11 has a configuration in which unit pixels (hereinafter, referred to simply as "pixels" in some cases) 20 each including a photoelectric conversion section that generates and stores photocharges corresponding to the amount of received light by performing photoelectric conversion are two-dimensionally arranged in a row direction and a column direction, i.e., in a matrix form. Note that the row direction represents the arrangement direction of the pixels in the pixel row (i.e., horizontal direction), and the column direction represents the arrangement direction of the pixels in the pixel column (i.e., vertical direction). The specific circuit configuration of the unit pixel 20 and details of the pixel structure will be described later.

In the pixel array unit 11, with respect to the pixel arrangement in a matrix form, pixel drive lines 16 ($16_1$ to $16_m$) are wired along the row direction for each pixel row, and vertical signal lines 17 (171 to 17n) are wired along the column direction for each pixel column. The pixel drive line 16 transmits a drive signal to be described later for performing driving when reading a signal from a pixel. Although one wiring is shown for the pixel drive line 16 in FIG. 1, the pixel drive line 16 is not limited to one wiring. One end of the pixel drive line 16 is connected to an output end of the vertical driving unit 12 corresponding to each row.

The vertical driving unit 12 includes a shift register, an address decoder, and the like, and drives the pixels of the pixel array unit 11 at the same time or row by row, for example. That is, the vertical driving unit 12 constitutes a driving unit that drives each pixel of the pixel array unit 11, together with the system control unit 15 that controls the vertical driving unit 12. Although illustration of the specific configuration of the vertical driving unit 12 is omitted, in general, the vertical driving unit 12 includes two scanning system of a read scanning system and a sweep scanning system.

In order to read a signal from the unit pixel 20, the read scanning system sequentially selects and scans the unit pixels 20 of the pixel array unit 11 row by row. The signal read from the unit pixel 20 is an analog signal. The sweep scanning system performs sweep scanning on a reading line on which read scanning is to be performed by the read scanning system, preceding the read scanning by a time for shutter speed.

By the sweep scanning performed by the sweep scanning system, unnecessary charges are swept from the photoelectric conversion section of the unit pixels 20 in the reading line, thereby resetting the photoelectric conversion sections. Then, by sweeping the unnecessary charges (by resetting) by the sweep scanning system, a so-called electronic shutter operation is performed. Note that the electronic shutter operation represents an operation of discarding photocharges of the photoelectric conversion sections to start new exposure (start storing photocharges).

The signal read by the reading operation by the read scanning system corresponds to the amount of light received after the preceding reading operation or the electronic shutter operation. Then, a period from the reading timing by the preceding reading operation or the sweeping timing by the electronic shutter operation to the reading timing by the present reading operation is an exposure period of photocharges in a unit pixel.

The signals output from the unit pixels 20 in the pixel row selected and scanned by the vertical driving unit 12 are input to the column processing unit 13 through the corresponding vertical signal lines 17 for each pixel column. The column processing unit 13 performs, for pixel column of the pixel array unit 11, predetermined signal processing on the signals output from the pixels 20 in the selected row through the vertical signal lines 17, and temporarily holds the pixel signals after the signal processing.

Specifically, the column processing unit 13 performs, as the signal processing, at least noise removal processing, CDS (Correlated Double Sampling) processing, and DDS (Double Data Sampling) processing, for example. For example, by the CDS processing, fixed pattern noise unique to a pixel such as reset noise and variation in a threshold value of an amplification transistor in the pixel 20 is removed. It is also possible to convert an analog pixel signal into a digital signal and output the digital signal by causing the column processing unit 13 to have, for example, an AD (analog-digital) conversion function other than the function of noise removal processing.

The horizontal driving unit 14 includes a shift register, an address decoder, and the like, and sequentially selects a unit circuit corresponding to the pixel column of the column processing unit 13. By the selective scanning by the horizontal driving unit 14, the pixel signals subjected to signal processing in the column processing unit 13 for each unit circuit are sequentially output.

The system control unit 15 includes a timing generator that generates various timing signals, and the like, and performs drive control on the vertical driving unit 12, the column processing unit 13, the horizontal driving unit 14, and the like, on the basis of the various timings generated by the timing generator.

The signal processing unit 18 has at least an arithmetic processing function, and performs various kinds of signal processing such as arithmetic processing on the pixel signal output from the column processing unit 13. The data storing unit 19 temporarily stores data necessary for the signal processing performed by the signal processing unit 18.

In the CMOS image sensor 10 having the above-mentioned configuration, the technology of the present disclosure is characterized by the circuit configuration of the unit pixel 20 and the driving unit of the unit pixel 20, particularly, the driving timing of the vertical driving unit 12. The specific embodiment of the circuit configuration of the unit pixel 20 and the driving timing of the vertical driving unit 12 will be described later.

[Another System Configuration]

The CMOS image sensor 10 to which the technology of the present disclosure is applied is not limited to the one having the above-mentioned system configuration. Examples of another system configuration include the following system configurations.

Figure 2:
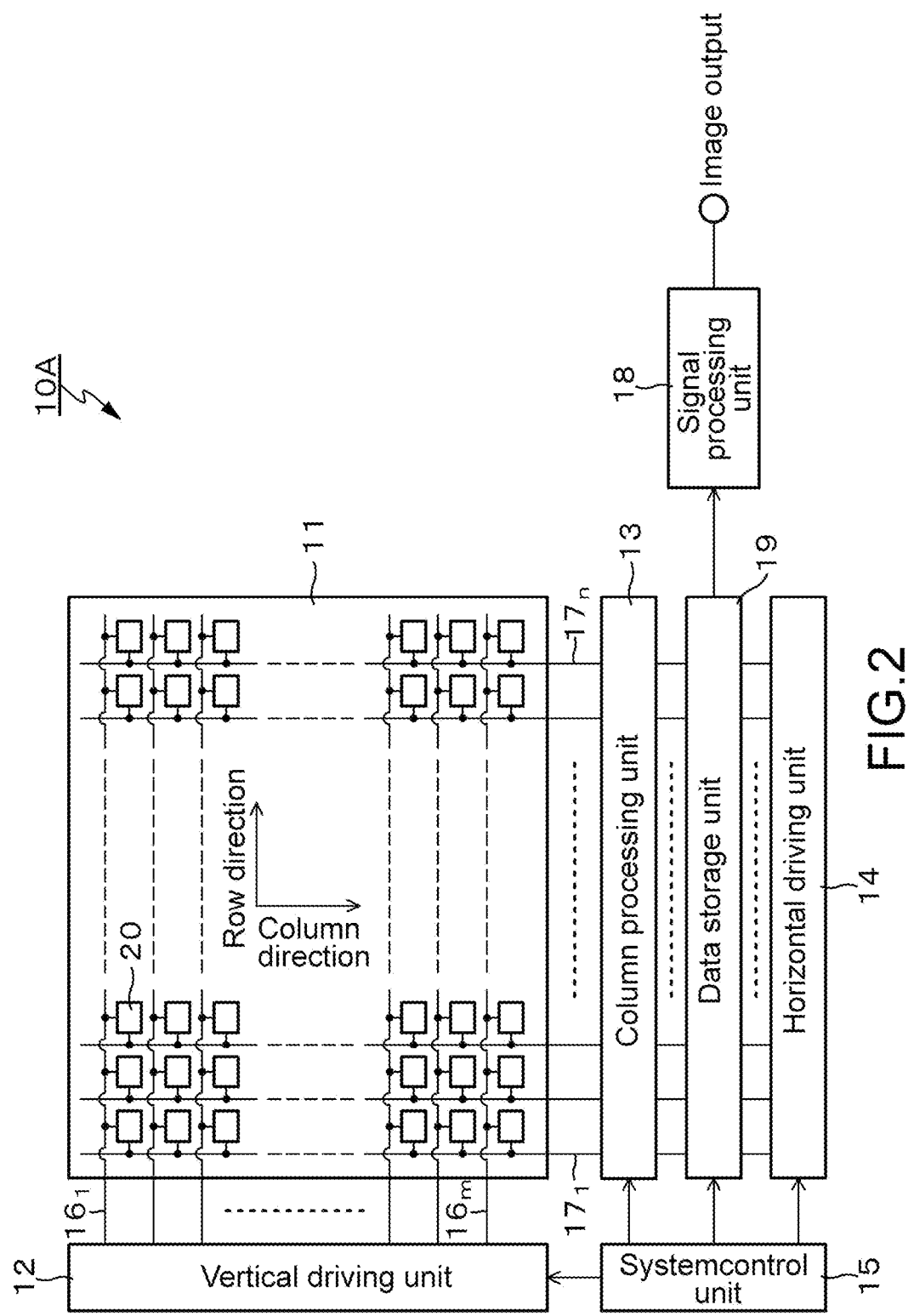
FIG. 2 is a system configuration diagram (Part 1) schematically showing another system configuration of the CMOS image sensor to which the technology of the present disclosure is applied.

For example, as shown in FIG. 2, a CMOS image sensor 10A having a system configuration in which the data storing unit 19 is placed at the subsequent stage of the column processing unit 13 and the pixel signal output from the column processing unit 13 is supplied to the signal processing unit 18 via the data storing unit 19 can be cited.

Figure 3:
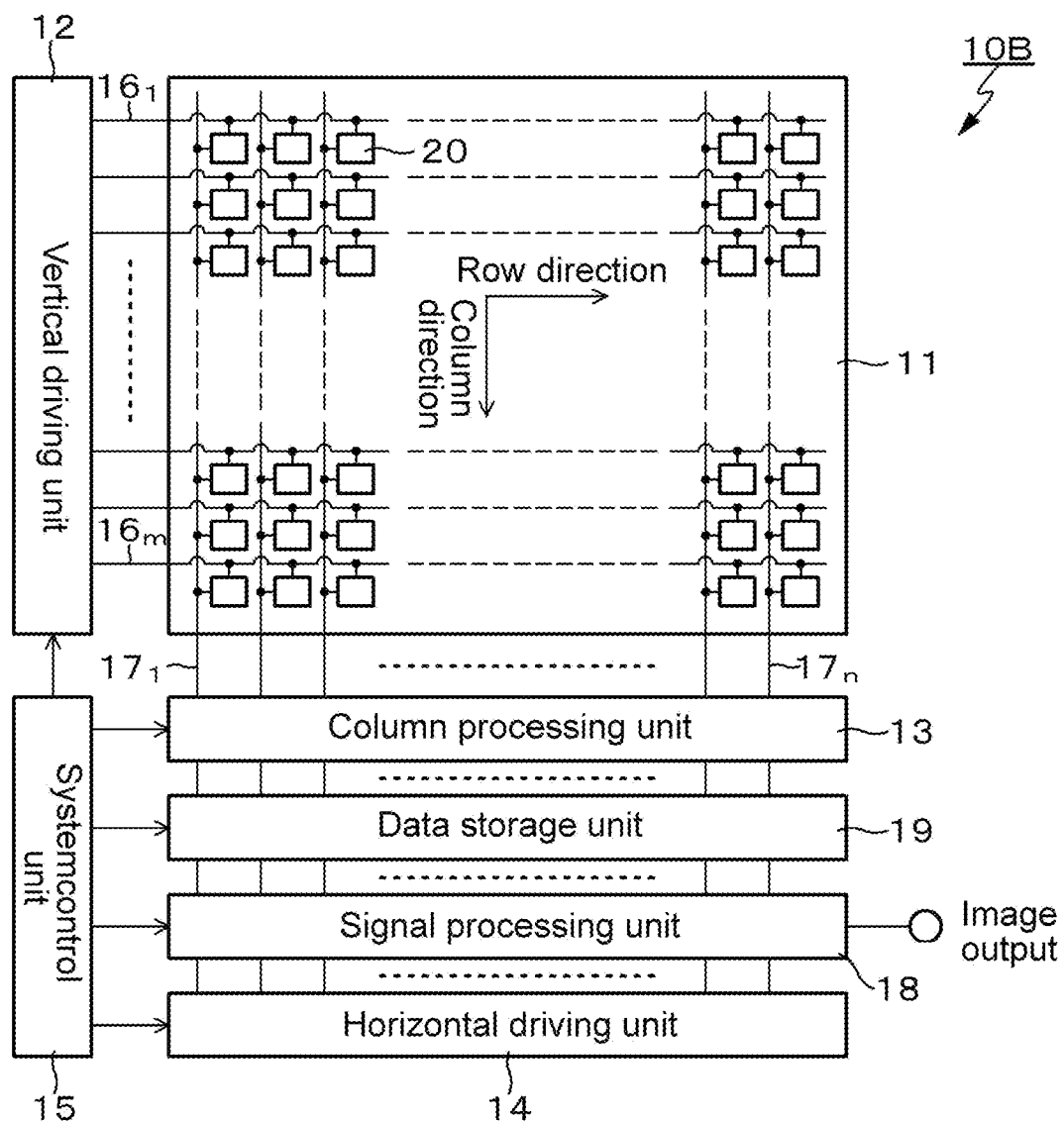
FIG. 3 is a system configuration diagram (Part 2) schematically showing another system configuration of the CMOS image sensor to which the technology of the present disclosure is applied.

Further, as shown in FIG. 3, a CMOS image sensor 10B having a system configuration in which the column processing unit 13 is caused to have an AD conversion function of performing AD conversion for each column or a plurality of columns of the pixel array unit 11, and the data storing unit 19 and the signal processing unit 18 are provided in parallel with respect to the column processing unit 13 can be cited.

<Description of Noise Removal Processing>

In the above-mentioned CMOS image sensor 10 (10A, 10B), a low-sensitivity data signal SL, a low-sensitivity reset signal NL, a high-sensitivity reset signal NH, and a high-sensitivity data signal SH are output from the unit pixel 20 to the vertical signal line 17 in the stated order. Alternatively, the high-sensitivity reset signal NH, the high-sensitivity data signal SH, the low-sensitivity data signal SL, and the low-sensitivity reset signal NL are output from the unit pixel 20 to the vertical signal line 17 in the stated order.

Then, in the signal processing unit at the subsequent stage, e.g., the column processing unit 13 and the signal processing unit 18 shown in FIG. 1 to FIG. 3, predetermined noise removal processing and signal processing are performed on the low-sensitivity data signal SL, the low-sensitivity reset signal NL, the high-sensitivity reset signal NH, and the high-sensitivity data signal SH. The specific configuration of the unit pixel 20 that outputs the low-sensitivity data signal SL, the low-sensitivity reset signal NL, the high-sensitivity reset signal NH, and the high-sensitivity data signal SH will be described in detail in the embodiment to be described later.

Hereinafter, taking a case of outputting the low-sensitivity data signal SL, the low-sensitivity reset signal NL, the high-sensitivity reset signal NH, and the high-sensitivity data signal SH to the vertical signal line 17 in the stated order as an example, an example of noise removal processing in the column processing unit 13 and arithmetic processing in the signal processing unit 18 will be described.

[Processing Example 1 of Noise Removal Processing]

First, the column processing unit 13 generates a low-sensitivity difference signal SNL by taking a difference between the low-sensitivity data signal SL and the low-sensitivity reset signal NL. Therefore, the low-sensitivity difference signal SNL=the low-sensitivity data signal SL−the low-sensitivity reset signal NL. Next, the column processing unit 13 generates a high-sensitivity difference signal SNH by taking a difference between the high-sensitivity data signal SH and the high-sensitivity reset signal NH. Therefore, the high-sensitivity difference signal SNH=the high-sensitivity data signal SH−the high-sensitivity reset signal NH.

As described above, in a processing example 1, DDS processing by which fixed pattern noise unique to a pixel such as variation in a threshold value of an amplification transistor in the pixel 20 is removed but reset noise is not removed is performed on the low-sensitivity signals SL and NL. CDS processing by which fixed pattern noise unique to a pixel such as reset noise and variation in a threshold value of an amplification transistor in the pixel 20 is removed is performed on the high sensitivity signals SH and NH. Further, in the processing example 1, since it is arithmetic processing that does not need to use a frame memory, there is an advantage that the circuit configuration can be simplified and the cost can be reduced.

[Processing Example 2 of Noise Removal Processing]

In a processing example 2 of noise removal processing, a storing means, e.g., frame memory is required to use information of the previous frame. Therefore, the arithmetic processing of the processing example 2 is performed by, for example, using the data storing unit 19 as the storing means in the signal processing unit 18 or using a frame memory in an external DSP circuit.

Specifically, first, the column processing unit 13 generates the low-sensitivity difference signal SNL by taking a difference between the low-sensitivity data signal SL and the low-sensitivity reset signal NL in the previous frame. Therefore, the low-sensitivity difference signal SNL=the low-sensitivity data signal SL−the low-sensitivity reset signal NL. Next, the column processing unit 13 generates the high-sensitivity difference signal SNH by taking a difference between the high-sensitivity data signal SH and the high-sensitivity reset signal NH. Therefore, the high-sensitivity difference signal SNH=the high-sensitivity data signal SH−the high-sensitivity reset signal NH.

As described above, in the processing example 2 of noise removal processing, CDS processing by which fixed pattern noise unique to a pixel such as reset noise and variation in a threshold value of an amplification transistor in the pixel 20 is removed is performed also on the low-sensitivity signals SL and NL. Therefore, according to the processing example 2, although a storing means such as a frame memory is required, there is an advantage that reset noise can be significantly reduced as compared with the processing example 1.

<Usage Example of Solid-State Image Pickup Device to which Technology of Present Disclosure is Applied>

Figure 4:
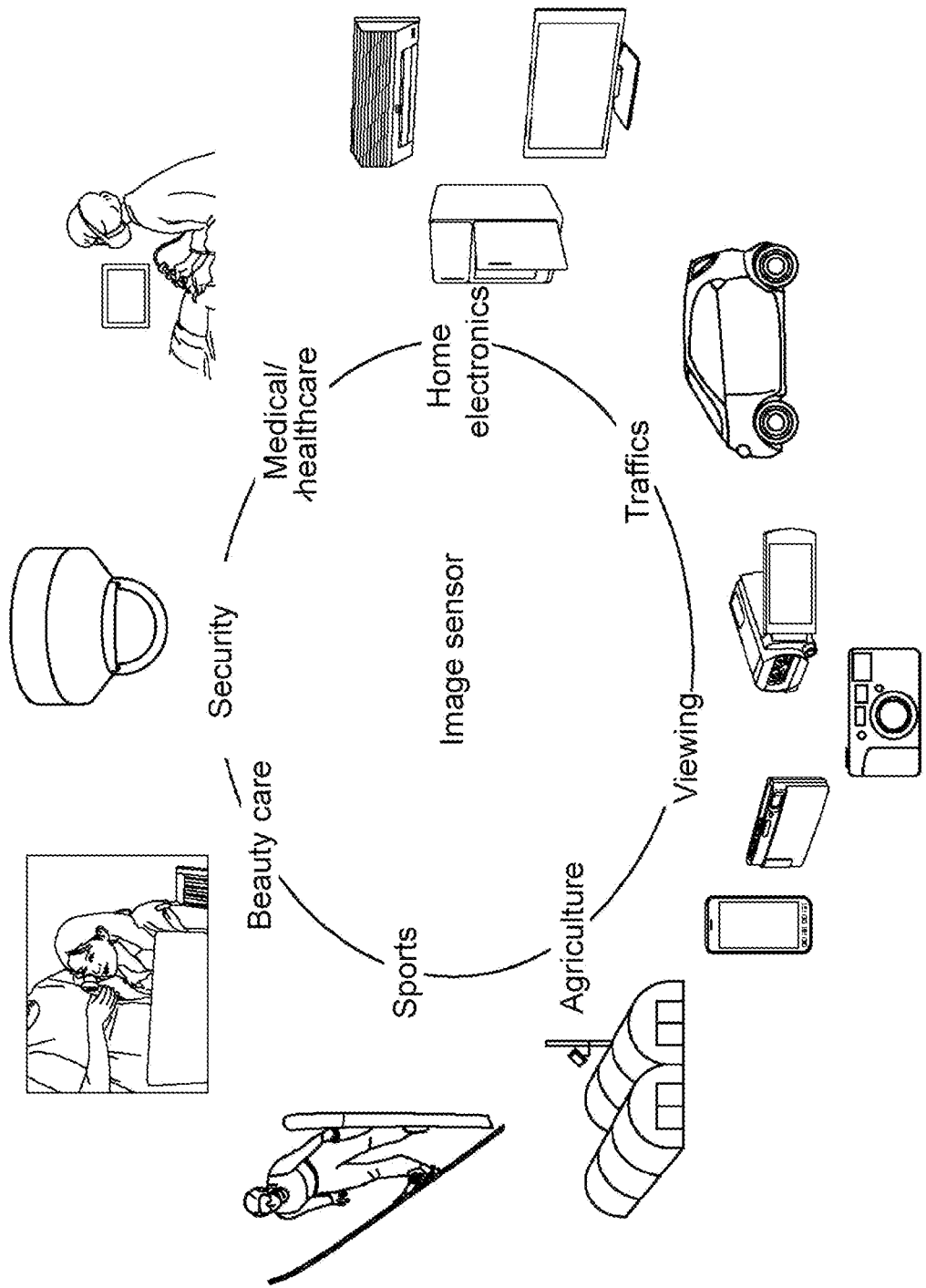
FIG. 4 is a diagram showing a usage example of the CMOS image sensor to which the technology of the present disclosure is applied.

Next, a usage example of a CMOS image sensor to which the technology of the present disclosure is applied will be described. FIG. 4 is a diagram showing a usage example of the CMOS image sensor to which the technology of the present disclosure of the above-mentioned configuration is applied.

The above-mentioned CMOS image sensor 10 (10A, 10B) can be used in various apparatuses that senses light such as visible light, infrared light, ultraviolet light, and X-rays as follows, for example.

- An apparatus for photographing images to be viewed, such as a digital camera and a camera-equipped mobile apparatus
- An apparatus used in the traffic field, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like
- An apparatus used in the home electronics field such as a television receiver, a refrigerator, and an air conditioner, for photographing gestures of users and executing apparatus operations according to the gestures
- An apparatus used in the medical and healthcare filed, such as an endoscope and an apparatus that performs blood vessel photographing by receiving infrared light
- An apparatus used in the security field, such as a surveillance camera for crime-prevention purposes and a camera for person authentication purposes
- An apparatus used in the beauty care field, such as a skin measurement apparatus that photographs skins and a microscope that photographs scalps
- An apparatus used in the sports field, such as an action camera and a wearable camera for sports purposes
- An apparatus in the agriculture field, such as a camera for monitoring states of fields and crops First Embodiment A first Embodiment relates to a solid-state image pickup device and a method of driving the same, and more specifically, the circuit configuration of the unit pixel 20 and a basic form of a driving timing of the vertical driving unit 12. A solid-state image pickup device and a method of driving the same according to the first embodiment of the present disclosure will be described with reference to FIGS. 5 to 9.

Figure 5:
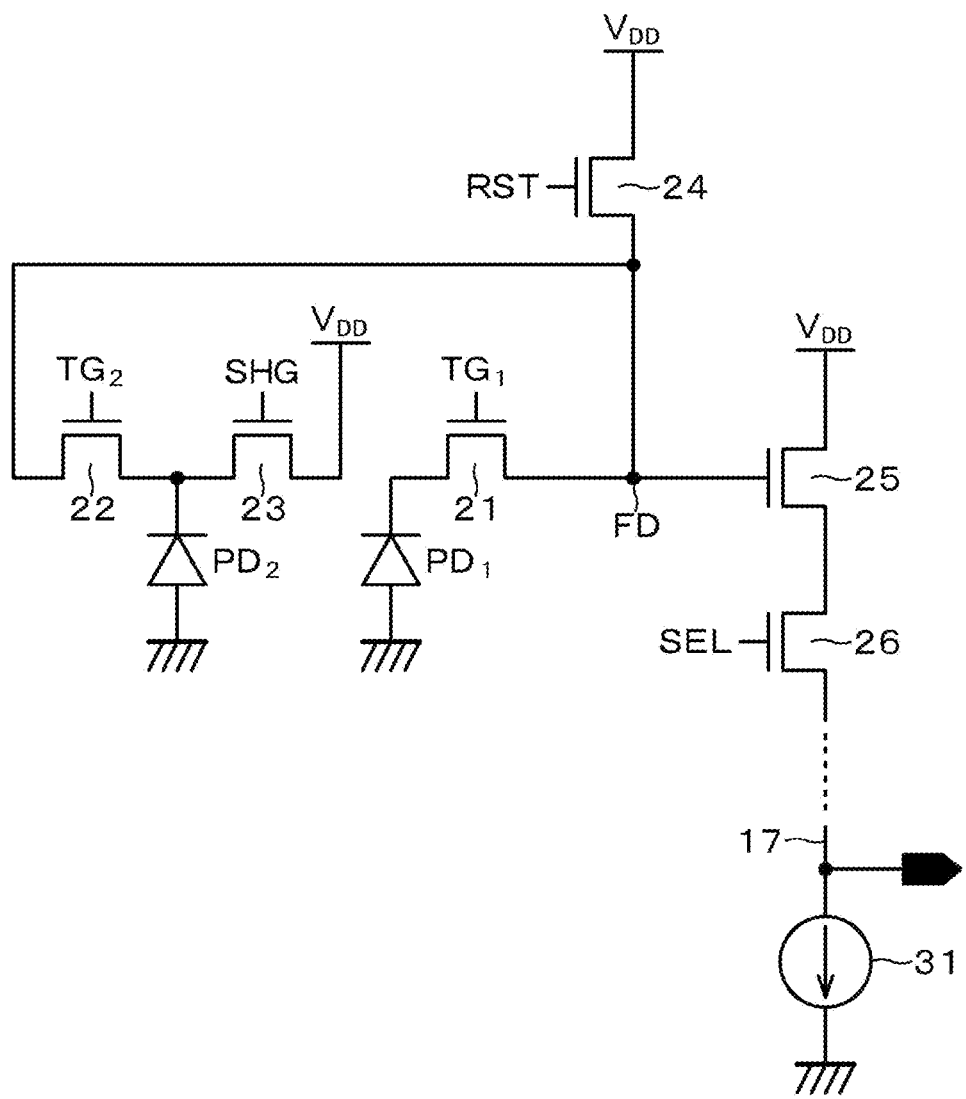
FIG. 5 is a circuit diagram showing a circuit configuration of a unit pixel according to a first embodiment.
Figure 6:
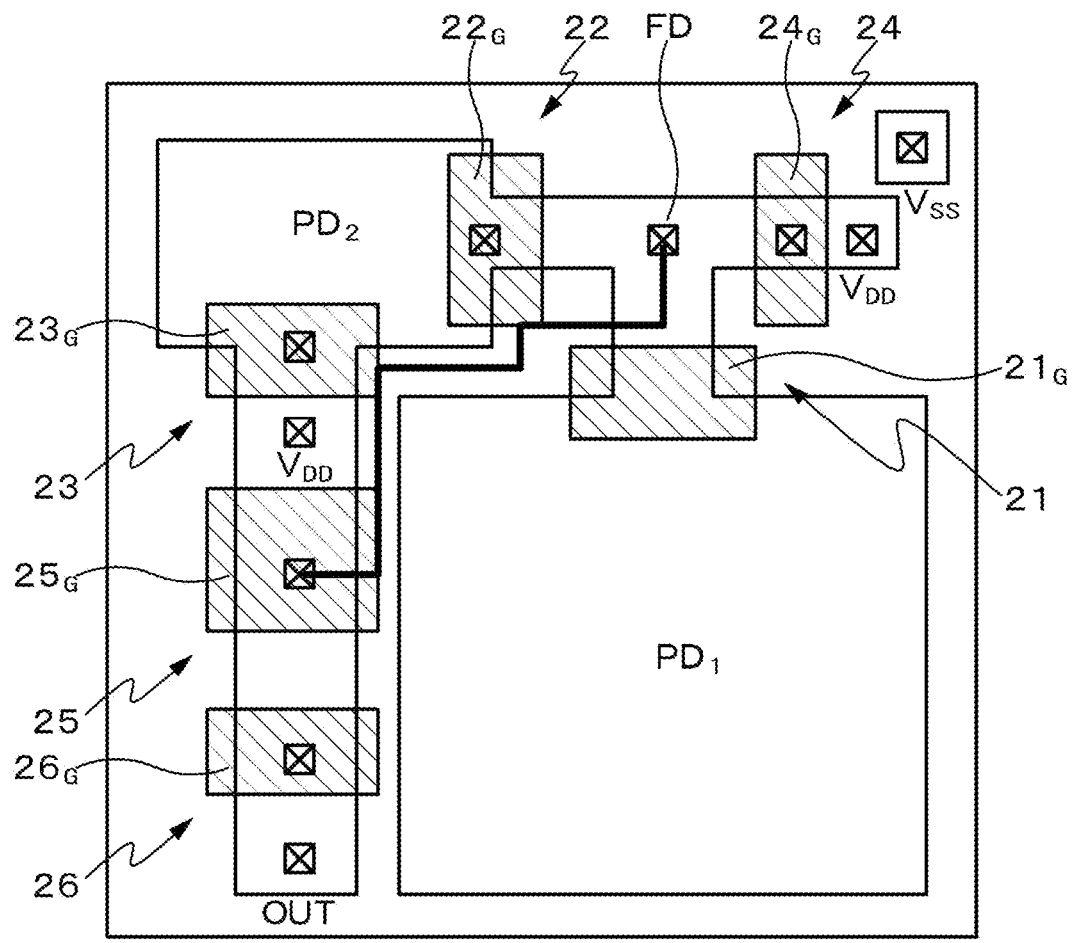
FIG. 6 is a layout diagram showing a planar layout of the unit pixel according to the first embodiment.

The circuit configuration of the unit pixel 20 according to the first embodiment is shown in FIG. 5, and a planar layout of the unit pixel 20 according to the first embodiment is shown in FIG. 6.

[Circuit Configuration of Unit Pixel]

The unit pixel 20 according to the first embodiment includes, for example, two photodiodes of the first photodiode $PD_1$ and the second photodiode $PD_2$ as a plurality of photoelectric conversion sections. The unit pixel 20 includes a transfer transistor (transfer gate unit) 21, a transfer transistor 22, a shutter transistor (discharge gate unit) 23, a reset transistor 24, an amplification transistor 25, and a selection transistor 26 In addition to the first photodiode $PD_1$ and the second photodiode $PD_2$.

Note that as six transistors of the transfer transistor 21, the transfer transistor 22, the shutter transistor 23, the reset transistor 24, the amplification transistor 25, and the selection transistor 26, N-type MOSFETs are used here, for example. However, the combination of the conductive types of the six transistors 21 to 26 exemplified here is merely an example, and not limited thereto. This also applies to each embodiment to be described later.

With respect to this unit pixel 20, a plurality of pixel drive lines as the above-mentioned pixel drive lines 16 ($16_1$ to $16_m$) are commonly wired to each pixel in the same pixel row. The plurality of pixel drive lines are connected to output ends of the vertical driving unit 12 corresponding to the respective pixel rows in units of pixel rows. The vertical driving unit 12 appropriately outputs a transfer signal $TG_1$, a transfer signal $TG_2$, a shutter signal SHG, a reset signal RST, and a selection signal SEL to the plurality of pixel drive lines.

Anode electrodes of the first photodiode $PD_1$ and the second photodiode $PD_2$ are connected to a low potential side power source $V_{ss}$ (e.g., ground), and the first photodiode $PD_1$ and the second photodiode $PD_2$ photoelectrically convert the received light into photocharges (here, photoelectrons) of the amount of charges corresponding to the amount of light, and store the photocharges. A cathode electrode of the first photodiode $PD_1$ is electrically connected to a gate electrode of the amplification transistor 25 via the transfer transistor 21. Similarly, a cathode electrode of the second photodiode $PD_2$ is electrically connected to a gate electrode of the amplification transistor 25 via the transfer transistor 22.

Note that an area electrically connected to the gate electrode of the amplification transistor 25 is a floating diffusion (floating diffusion area/impurity diffusion area) FD. The floating diffusion FD is a charge-voltage conversion section that converts charges into voltage.

To a gate electrode $21_G$ of the transfer transistor 21, the transfer signal $TG_1$ that is active at a high level (e.g., $V_{DD}$ level) is supplied from the vertical driving unit 12. The transfer transistor 21 is made conductive in response to the transfer signal $TG_1$, thereby transferring photocharges photoelectrically converted by the first photodiode $PD_1$ and stored in the photodiode $PD_1$ to the floating diffusion FD. To gate electrode $22_G$ of the transfer transistor 22, the transfer signal $TG_2$ that is active at a high level is supplied from the vertical driving unit 12. The transfer transistor 22 is made conductive in response to the transfer signal $TG_2$, thereby transferring photocharges photoelectrically converted by the second photodiode $PD_2$ and stored in the photodiode $PD_2$ to the floating diffusion FD.

The shutter transistor 23 is connected between a cathode electrode of the second photodiode $PD_2$ and a high potential side power source $V_{DD}$. To a gate electrode $23_G$ of the shutter transistor 23, the shutter signal SHG that is active at a high level is supplied from the vertical driving unit 12. The shutter transistor 23 is made conductive in response to the shutter signal SHG, thereby discharging (discarding) charges stored in the second photodiode $PD_2$ to the high potential side power source $V_{DD}$, for example. That is, in this embodiment, the high potential side power source $V_{DD}$ is a discharging unit of charges for the second photodiode $PD_2$.

The reset transistor 24 is connected between the high potential side power source $V_{DD}$ and the floating diffusion FD. To a gate electrode $24_G$ of the reset transistor 24, the reset signal RST that is active at a high level is supplied from the vertical driving unit 12. The reset transistor 24 is made conductive in response to the reset signal RST and discards charges of the floating diffusion FD to a node of the voltage $V_{DD}$, thereby resetting the floating diffusion FD.

A gate electrode $25_G$ and a drain electrode of the amplification transistor 25 are respectively connected to the floating diffusion FD and the high potential side power source $V_{DD}$. The amplification transistor 25 is an input unit of a source follower that reads signals obtained by photoelectric conversion by the first photodiode $PD_1$ or the second photodiode $PD_2$. That is, a source electrode of the amplification transistor 25 is connected to the vertical signal line 17 via the selection transistor 26. Then, the amplification transistor 25 and a current source 31 connected to one end of the vertical signal line 17 constitute a source follower that converts voltage of the floating diffusion FD into a potential of the vertical signal line 17.

For example, a drain electrode and a source electrode of the selection transistor 26 are respectively connected to the source electrode of the amplification transistor 25 and the vertical signal line 17. To a gate electrode $26_G$ of the selection transistor 26, the selection signal SEL that is active at a high level is supplied from the vertical driving unit 12. The selection transistor 26 is made conductive in response to the selection signal SEL, thereby transmitting, to the vertical signal line 17, the signal output from the amplification transistor 25 with the unit pixel 20 being in a selected state.

Note that a circuit configuration in which the selection transistor 26 is connected between the high potential side power source $V_{DD}$ and the drain electrode of the amplification transistor 25 may be employed. Further, in this example, as the pixel circuit of the unit pixel 20, a 6 Tr configuration including the transfer transistor 21, the transfer transistor 22, the shutter transistor 23, the reset transistor 24, the amplification transistor 25, and the selection transistor 26, i.e., six transistors (Tr), is taken as an example, but it does not necessarily need to employ the 6 Tr configuration. For example, a 5 Tr configuration in which the selection transistor 26 is omitted and the amplification transistor 25 is caused to have the function of the selection transistor 26, or a configuration in which the number of transistor is increased as appropriate may be employed. This also applies to each embodiment to be described later.

[Circuit Operation of Unit Pixel]

Figure 7:
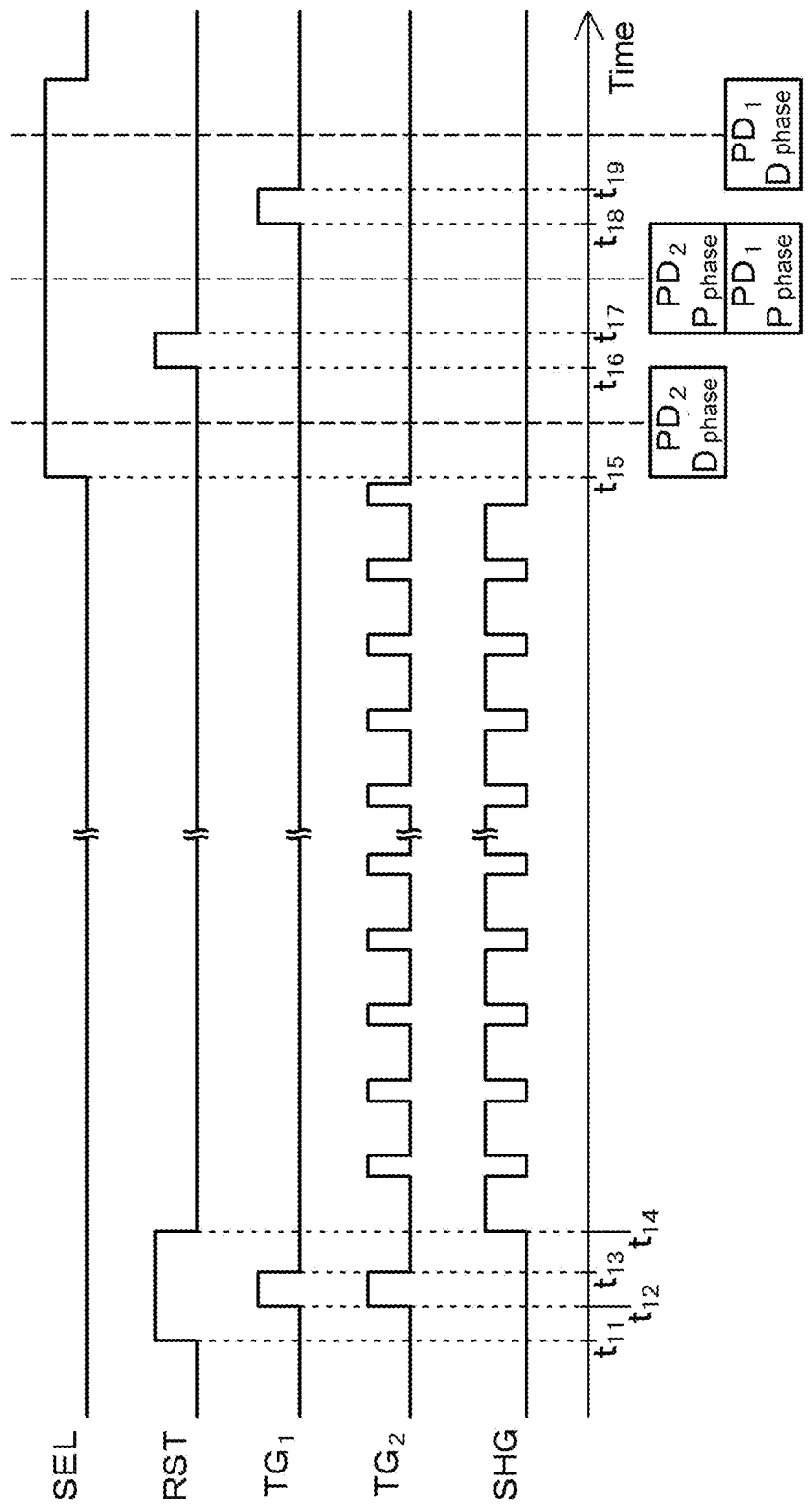
FIG. 7 is a timing waveform chart for describing a circuit operation of the unit pixel according to the first embodiment.

Next, the circuit operation of the unit pixel 20 having the above-mentioned configuration according to the first embodiment will be described using a timing waveform chart of FIG. 7. FIG. 7 shows waveforms of the selection signal SEL, the reset signal RST, the transfer signal $TG_1$, the transfer signal $TG_2$, and the shutter signal SHG output from the vertical driving unit 12.

The reset signal RST is made active (in a high-level state) at a time $t_{11}$ to make the reset transistor 24 conductive, and the transfer signal $TG_1$ and the transfer signal $TG_2$ are made active at a time $t_{12}$ when the reset signal RST is active. This makes the transfer transistor 21 and the transfer transistor 22 conductive, thereby resetting the first photodiode $PD_1$ and the second photodiode $PD_2$. It goes without saying that the reset signal RST is made active to make the reset transistor 24 conductive, thereby resetting also the floating diffusion FD.

In the period in which the reset signal RST is active, the transfer signal $TG_1$ is made inactive (in a low-level state) to make the transfer transistor 21 nonconductive at a time $t_{13}$, thereby starting storing, in the first photodiode $PD_1$, of signal charges photoelectrically converted by the photodiode $PD_1$ (starting exposure). Also in the second photodiode $PD_2$, the transfer signal $TG_2$ is made inactive to make the transfer transistor 22 nonconductive at the time $t_{13}$, thereby starting storing of photoelectrically converted signal charges in the photodiode $PD_2$.

Next, after making the reset signal RST inactive at a time $t_{14}$ to make the reset transistor 24 nonconductive, the active state and the inactive state of the shutter signal SHG and the transfer signal $TG_2$ are alternately repeated. Since the shutter transistor 23 is made conductive when the shutter signal SHG is made active, signal charges stored in the second photodiode $PD_2$ are discharged to the high potential side power source $V_{DD}$. Further, since the transfer transistor 23 is made conductive when the transfer signal $TG_2$ is made active, signal charges stored in the second photodiode $PD_2$ are transferred to the floating diffusion FD.

In the case of alternately repeating this operation during the exposure period after the time $t_{14}$, only signal charges generated only in the period in which the transfer signal $TG_2$ is active excluding the period in which the shutter signal SHG is active, among signal charges photoelectrically converted by the second photodiode $PD_2$ in the exposure period, are transferred to the floating diffusion FD. Then, the signal charges transferred from the second photodiode $PD_2$ are stored and held in the floating diffusion FD. That is, in the exposure period after the time $t_{14}$, with respect to storing of the signal charges of the second photodiode $PD_2$, intermittent driving (hereinafter, referred to simply as "intermittent driving" in some cases) by pulse signals of the shutter signal SHG and the transfer signal $TG_2$ is performed.

Reading of the signals charge-voltage converted by the floating diffusion FD is performed from the signals of the second photodiode $PD_2$ stored in the floating diffusion FD.

Specifically, the selection signal SEL is made active at a time $t_{15}$ to make the selection transistor 26 conductive, thereby making the unit pixel 20 in a selected state. Accordingly, the signals of the second photodiode $PD_2$ stored in the floating diffusion FD are read to the vertical signal line 17 via the amplification transistor 25 and the selection transistor 26. The signals of the second photodiode $PD_2$ read at this time are the above-mentioned low-sensitivity data (D phase) signals SL.

After that, in the period in which the selection signal SEL is active i.e., the period in which the unit pixel 20 is selected, the reset signal RST is made active at a time $t_{16}$ to make the reset transistor 24 conductive, thereby resetting the floating diffusion FD. Then, after making the reset signal RST inactive at a time $t_{17}$, the level of the floating diffusion FD is read to the vertical signal line 17. The signals read at this time are the above-mentioned low-sensitivity reset (P phase) signals NL. The low-sensitivity reset (P phase) signal NL at this time is also the above-mentioned high-sensitivity reset (P phase) signal NH for the next first photodiode $PD_1$.

Next, in the period in which the selection signal SEL is active, the transfer signal $TG_1$ is made active at a time $t_{18}$ to make the transfer transistor 21 conductive, thereby transferring the signal charges exposed/stored in the first photodiode $PD_1$ to the floating diffusion FD. Then, the level of the floating diffusion FD based on the transferred signal charges of the first photodiode $PD_1$ is read to the vertical signal line 17 via the amplification transistor 25 and the selection transistor 26. The signals of the first photodiode $PD_1$ read at this time are the above-mentioned high-sensitivity data (D phase) signals SH.

The circuit operation at the time of intermittent driving with respect to storing of the signal charges of the second photodiode $PD_2$ based on the above-mentioned pulse signals of the shutter signal SHG and the transfer signal $TG_2$ will be described in more detail using a timing waveform chart of FIG. 8A. This intermittent driving is realized by alternately operating the transfer transistor 22 and the shutter transistor 23 with the same frequency in the exposure period so that the conduction period does not overlap.

The timing waveform chart of FIG. 8 shows the state where the shutter signal SHG and the transfer signal $TG_2$ are alternately driven for active time periods $T_{11}$ and $T_{12}$, respectively. Accordingly, only the signal charges photoelectrically converted in the entire exposure period$\times T_{11}/(T_{11}+T_{12})$ are transferred to the floating diffusion FD via the transfer transistor 22. That is, the sensitivity can be effectively reduced to $T_{11}/(T_{11}+T_{12})$. By changing the time periods $T_{11}$ and $T_{12}$, it is possible to arbitrarily adjust the sensitivity.

Incidentally, although a reduction in sensitivity can be realized by a shuttering time period even with a single short shutter, a problem such as LED flicker occurs in the case of imaging under LED illumination. The LED is not always lit and is blinking at a certain frequency. Therefore, in the case of a short shutter, the pixel where the LED disappeared is taken when the exposure timing overlaps with the turn-off timing of the LED blinking. This is the LED flicker. Therefore, from the viewpoint of the LED flicker and the like, one short shutter is not favorable.

Figure 8A:
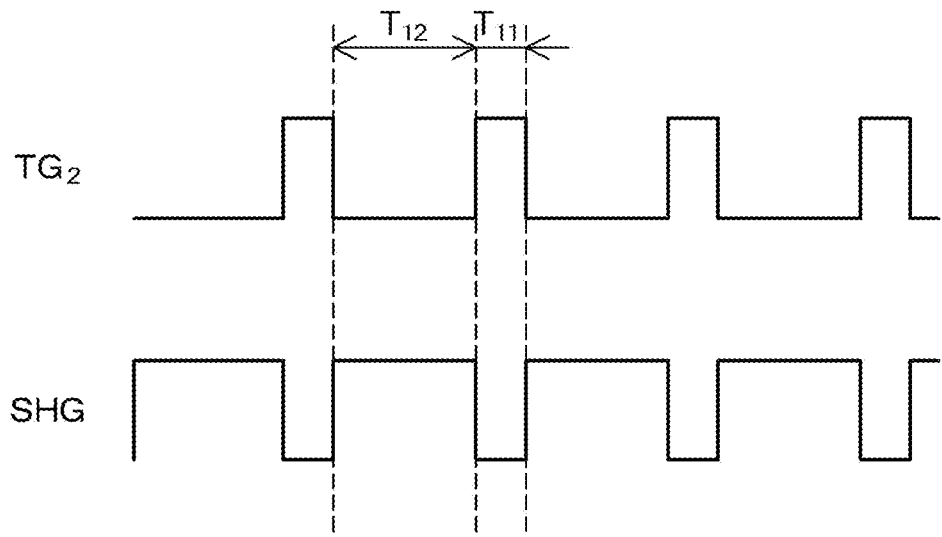
FIG. 8A is a timing waveform chart for more specifically describing the circuit operation at the time of intermittent driving with respect to storing of signal charges on the basis of pulse signals of a shutter signal and a transfer signal.
Figure 8B:
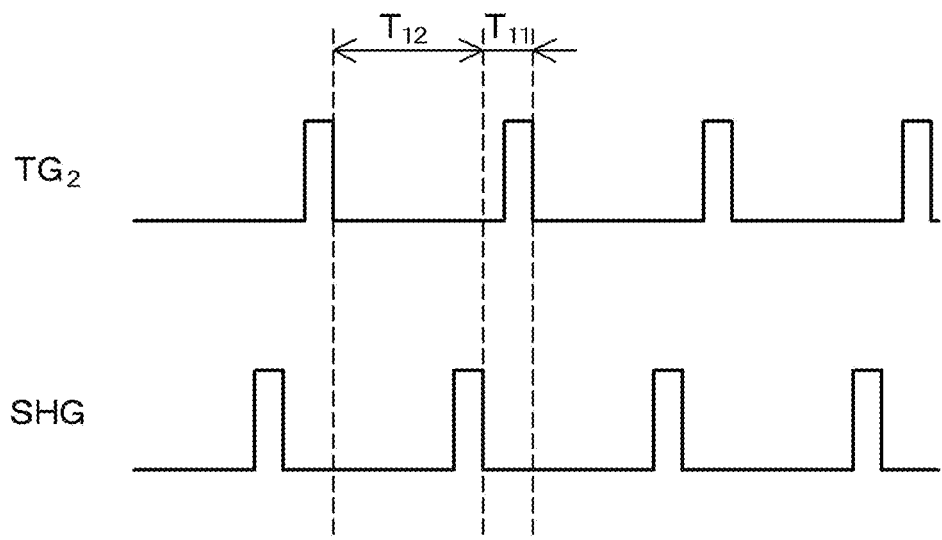
FIG. 8B is a timing waveform chart as a modified example of the intermittent driving shown in FIG. 8A.

Note that although the shutter signal SHG and the transfer signal $TG_2$ are exclusively operated in the operation based on the driving timing shown in FIG. 8A, the operation is not limited thereto. That is, as long as there is a pulse width capable of completely transferring signal charges, the operation based on the driving timing shown in FIG. 8B may be used. Specifically, the period from the falling of a pulse signal of one of the shutter signal SHG and the transfer signal $TG_2$ to the falling of a pulse signal of the other is the time period $T_{11}/T_{12}$, and thus, effects similar to those in the case of the operation based on the driving timing shown in FIG. 8A can be obtained.

[Method of Expanding Dynamic Range]

Next, a method of expanding a dynamic range by using the signal charge read by the above-mentioned circuit operation in the unit pixel 20 according to the first embodiment will be described with reference to FIG. 9.

Figure 9:
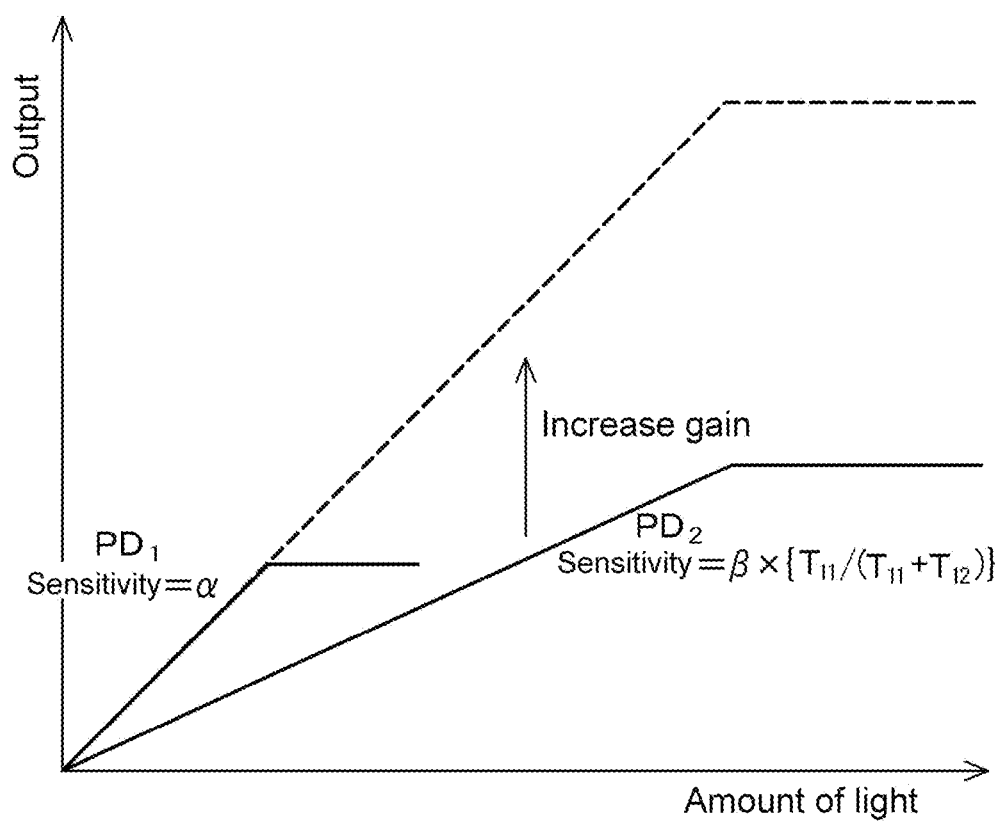
FIG. 9 is an explanatory diagram for expansion of a dynamic range of the unit pixel according to the first embodiment.

In FIG. 9, the horizontal axis represents the amount of incident light, and the vertical axis represents the output (number of electrons). The assumption is made that the sensitivity of the first photodiode $PD_1$ per unit time is $\alpha$, and the sensitivity of the second photodiode $PD_2$ per unit time is $\beta$. The output of the first photodiode $PD_1$ is increased with the slope of the sensitivity $\alpha$ with respect to the amount of light, and converges when reaching the saturation level of the first photodiode $PD_1$. Meanwhile, the output of the second photodiode $PD_2$ is increase with the slope of $\beta \times \{T11/(T11+T12)\}$ with respect to the amount of light, and converges when the floating diffusion FD as the transfer destination by the transfer transistor 22 is saturated.

Although it is described in FIG. 9 that the saturation level of the floating diffusion FD is larger than the saturation level of the first photodiode $PD_1$, it does not fail even in the case where they are substantially the same or the saturation level of the floating diffusion FD is smaller. However, the effect of expanding the dynamic range is larger as the saturation level of the floating diffusion FD is increased.

In this way, the gain the signal of the second photodiode $PD_2$ is increased by the amount corresponding to the sensitivity ratio of the first photodiode $PD_1$ and the second photodiode $PD_2$, and the output with the same slope (sensitivity) as that of the first photodiode $PD_1$ is obtained. Then, by using the signal of the first photodiode $PD_1$ for the amount of light before the saturation of the first photodiode $PD_1$, and the signal of the second photodiode $PD_2$ whose gain is increased for the amount of light higher than that, the dynamic range can be increased.

Note that it is inappropriate to use the output of the second photodiode $PD_2$ whose gain is increased in the entire area. This is because the second photodiode $PD_2$ presumes the holding in the floating diffusion FD, and thus, the noise component of the second photodiode $PD_2$ is larger than that in the first photodiode $PD_1$. Therefore, the influence of noise on the output becomes large in a region where the output is small.

As described above, in the solid-state image pickup device and the method of driving the same according to the first embodiment, with respect to the storing of signal charges of the second photodiode $PD_2$, intermittent driving is performed by pulse signals of the shutter signal SHG and the transfer signal $TG_2$ in the exposure period. Note that with respect to the storing of signal charges of the first photodiode $PD_1$, since the sensitivity of the first photodiode $PD_1$ is set to be relatively high, the storing of signal charges is performed in the entire exposure period (with the duty ratio of 100%). BY the intermittent driving with respect to the storing of signal charges of the second photodiode $PD_2$, the sensitivity ratio of the first photodiode $PD_1$ and the second photodiode $PD_2$ can be controlled.

Then, by capturing a plurality of images with arbitrarily controllable sensitivity ratio, it is possible to expand the dynamic range as described above. Further, since the sensitivity ratio of the first photodiode $PD_1$ and the second photodiode $PD_2$ can be arbitrarily controlled by the intermittent driving with respect to the storing of signal charges of the second photodiode $PD_2$, the dynamic range can be freely changed as compared with the case where the sensitivity difference is physically provided.

Figure 10A:
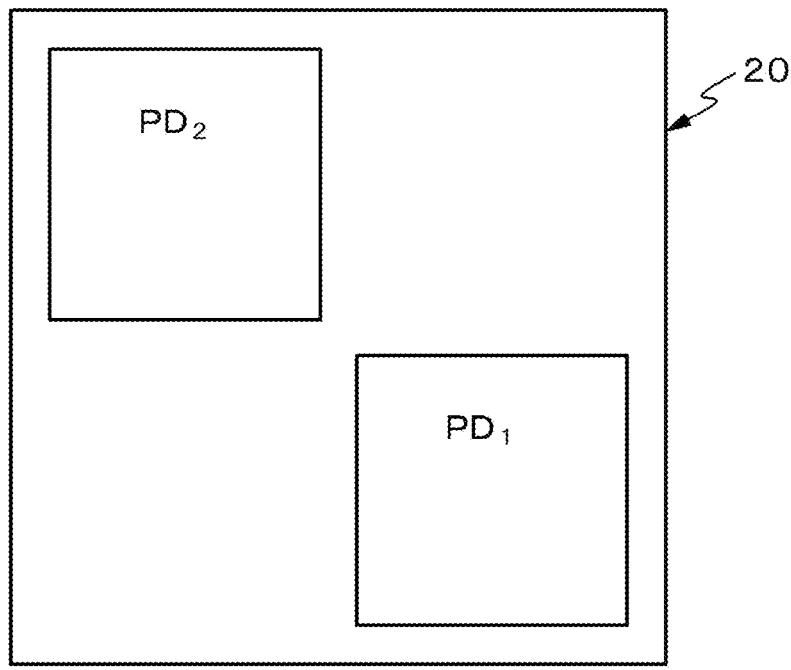
FIG. 10A is a layout diagram in the case where sizes of a first photodiode and a second photodiode are the same.
Figure 10B:
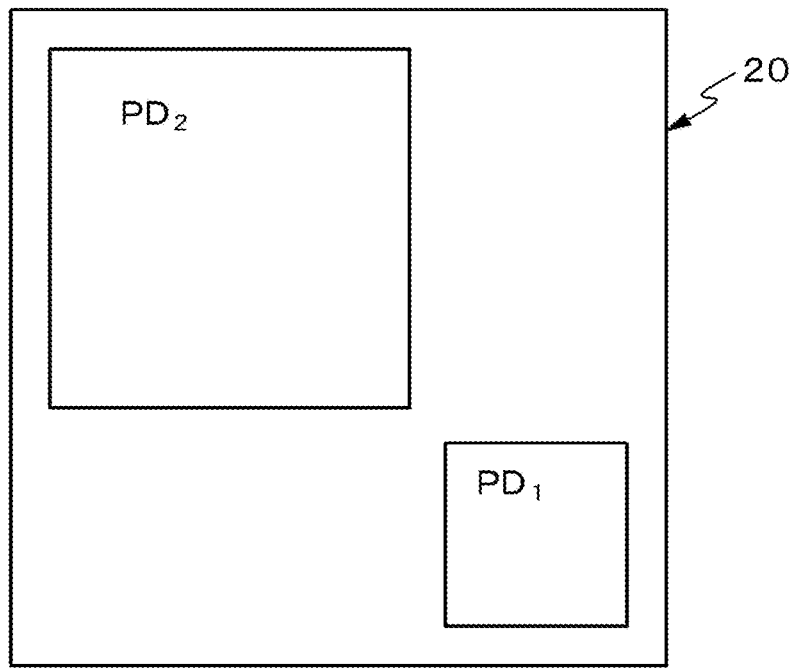
FIG. 10B is a layout diagram in the case where the second photodiode is larger than the first photodiode.

Further, since the sensitivity difference of the first photodiode $PD_1$ and the second photodiode $PD_2$ can be controlled by the intermittent driving with respect to the storing of signal charges, the size relationship between the first photodiode $PD_1$ and the second photodiode $PD_2$ does not matter. That is, a structure in which the size of the first photodiode $PD_1$ is the same as that of the second photodiode $PD_2$ as shown in FIG. 10A, or a structure in which the second photodiode $PD_2$ is larger than the first photodiode $PD_1$ may be used. As described above, since the size relationship between the first photodiode $PD_1$ and the second photodiode $PD_2$ does not matter, it is possible to increase the degree of freedom of the layout of the unit pixel 20.

Second Embodiment

Figure 11:
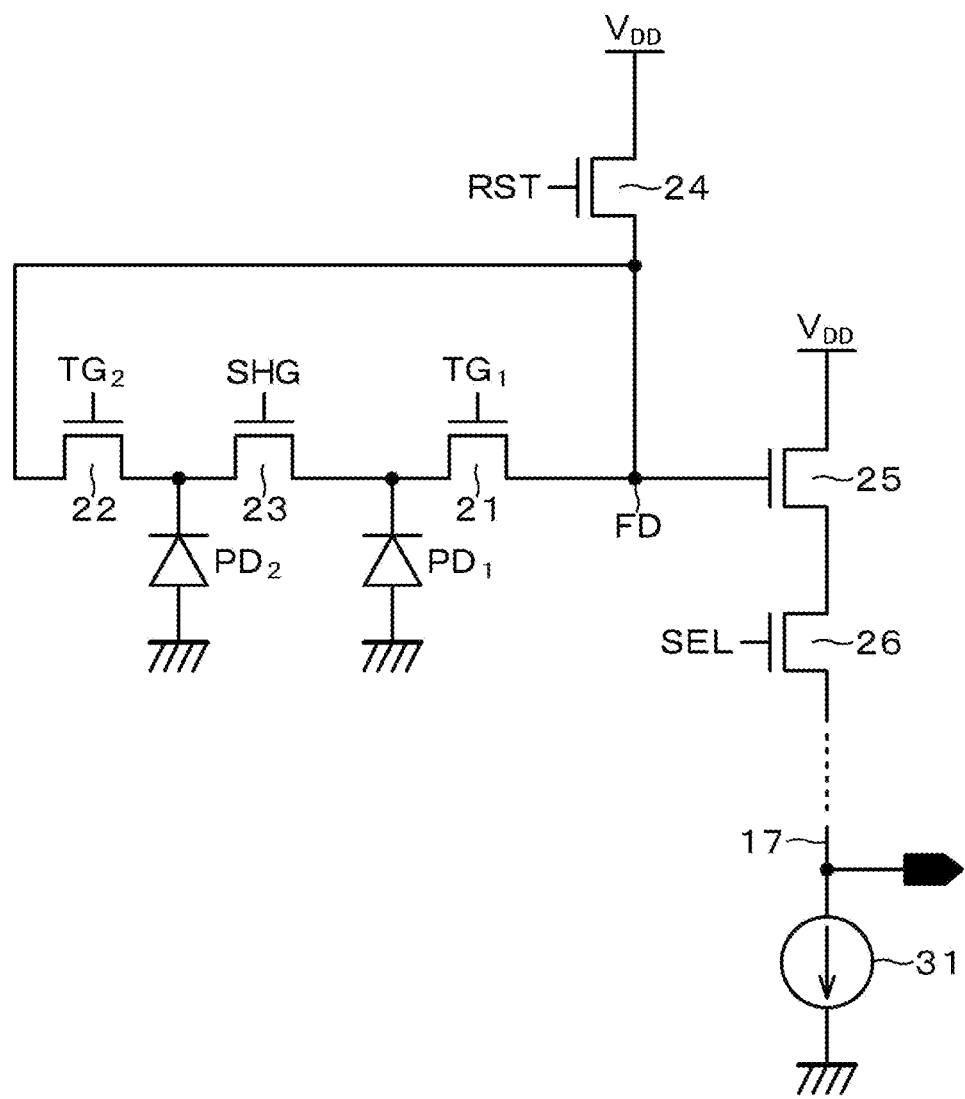
FIG. 11 is a circuit diagram showing a circuit configuration of a unit pixel according to a second embodiment.

While the discharge destination of the charges of the second photodiode $PD_2$ is the high potential side power source $V_{DD}$ in the first embodiment, it is the first photodiode $PD_1$ in a second embodiment. A solid-state image pickup device and a method of driving the same according to the second embodiment of the present disclosure will be described with reference to FIGS. 11 to 13. FIG. 11 is a circuit diagram showing the circuit configuration of the unit pixel 20 according to the second embodiment.

[Circuit Configuration of Unit Pixel]

The constituent elements of the unit pixel 20 according to the second embodiment are the same as the constituent elements of the unit pixel 20 according to the first embodiment. That is, the unit pixel 20 according to the second embodiment includes the transfer transistor 21, the transfer transistor 22, the shutter transistor 23, the reset transistor 24, the amplification transistor 25, and the selection transistor 26, in addition to the first photodiode $PD_1$ and the second photodiode $PD_2$.

Then, the shutter transistor 23 is connected between a cathode electrode of the first photodiode $PD_1$ and a cathode electrode of the second photodiode $PD_2$. That is, the signal charge of the second photodiode $PD_2$ is discharged not to the high potential side power source $V_{DD}$ but to the first photodiode $PD_1$, and added to the signal charge of the photodiode $PD_1$.

Figure 12:
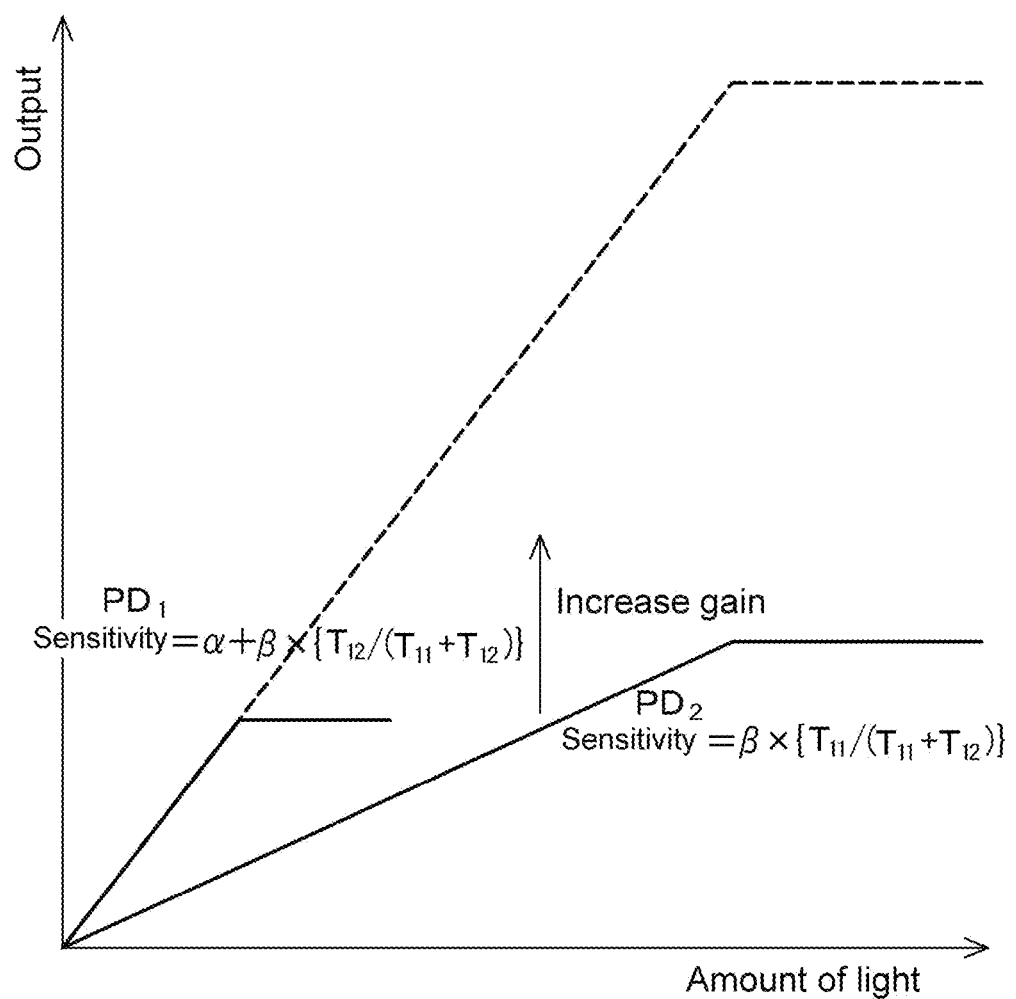
FIG. 12 is an explanatory diagram for expansion of a dynamic range of the unit pixel according to the second embodiment.

FIG. 12 is an explanatory diagram for expansion of a dynamic range of the unit pixel 20 according to the second embodiment. As shown in FIG. 12, by adding the signal charge of the second photodiode $PD_2$ to the signal charge of the first photodiode $PD_1$, the sensitivity of the first photodiode $PD_1$ becomes larger than that in the first embodiment, i.e., $\alpha+\beta\times\{T12/(T11+T12)\}$. Accordingly, since the sensitivity difference between the first photodiode $PD_1$ and the second photodiode $PD_2$ can be provided, it is possible to further expand the dynamic range.

[Circuit Operation of Unit Pixel]

Next, the circuit operation of the unit pixel 20 having the above-mentioned configuration according to the second embodiment will be described using a potential diagram of FIG. 13.

Figure 13:
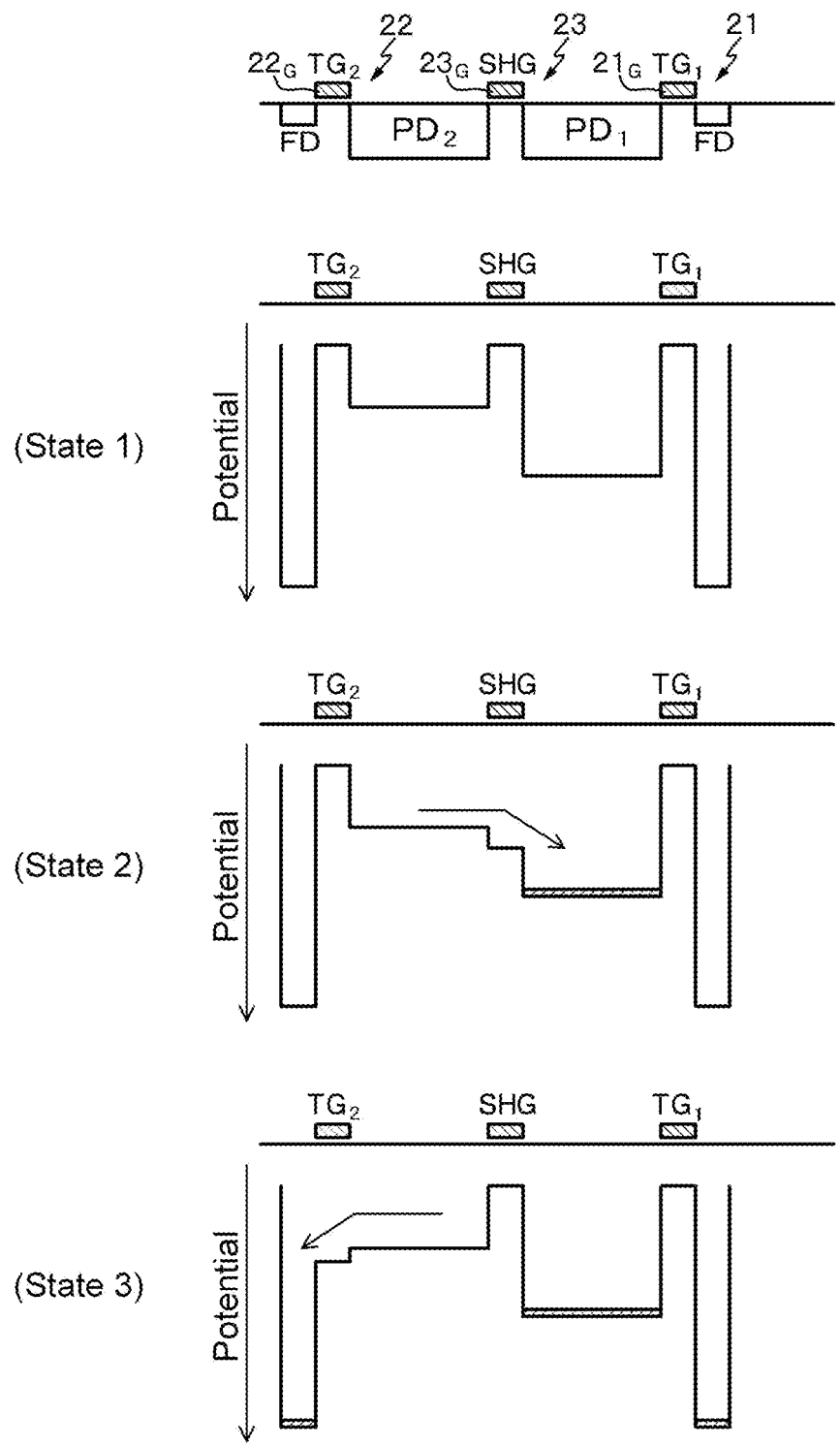
FIG. 13 is a potential diagram for describing a circuit operation of the unit pixel according to the second embodiment.

On the uppermost part of FIG. 13, the cross-sectional structures of the transfer transistor 22, the second photodiode $PD_2$, the shutter transistor 23, the first photodiode $PD_1$, and the transfer transistor 21 are shown. Further, in a state 1, a state 2, and a state 3, the potential of the above-mentioned cross-section at the time of each operation is shown. Note that although the signal charge generated in the first photodiode $PD_1$ is not shown in each operation state in FIG. 13 for simplicity, a signal is generated in the first photodiode $PD_1$ in the same way as a signal charge is generated in the second photodiode $PD_2$ in the actual operation.

As shown in FIG. 12, the shutter transistor 23 is provided between the first photodiode $PD_1$ and the second photodiode $PD_2$. In this case, the potential of the first photodiode $PD_1$ is set to be deeper than the potential of the second photodiode $PD_2$ (state 1).

Under such a potential relationship, intermittent driving with respect to storing of signal charges of the second photodiode $PD_2$ by pulse signals of the shutter signal SHG and the transfer signal $TG_2$ is performed. In this intermittent driving, since the potential under the gate electrode $23_G$ of the shutter transistor 23 becomes deep in the period in which the shutter signal SHG is active, the signal charges of the second photodiode $PD_2$ are transferred to the first photodiode $PD_1$ (state 2). Accordingly, as shown in FIG. 12, the effect of improving the sensitivity of the first photodiode $PD_1$ is obtained.

Further, in the intermittent driving with respect to storing of the signal charges of the second photodiode $PD_2$, since the potential under the gate electrode $22_G$ of the transfer transistor 22 becomes deep in the period in which the transfer signal $TG_2$ is active, the signal charges of the second photodiode $PD_2$ are transferred to the floating diffusion FD (state 3).

Modified Example 1 of Second Embodiment

Figure 14:
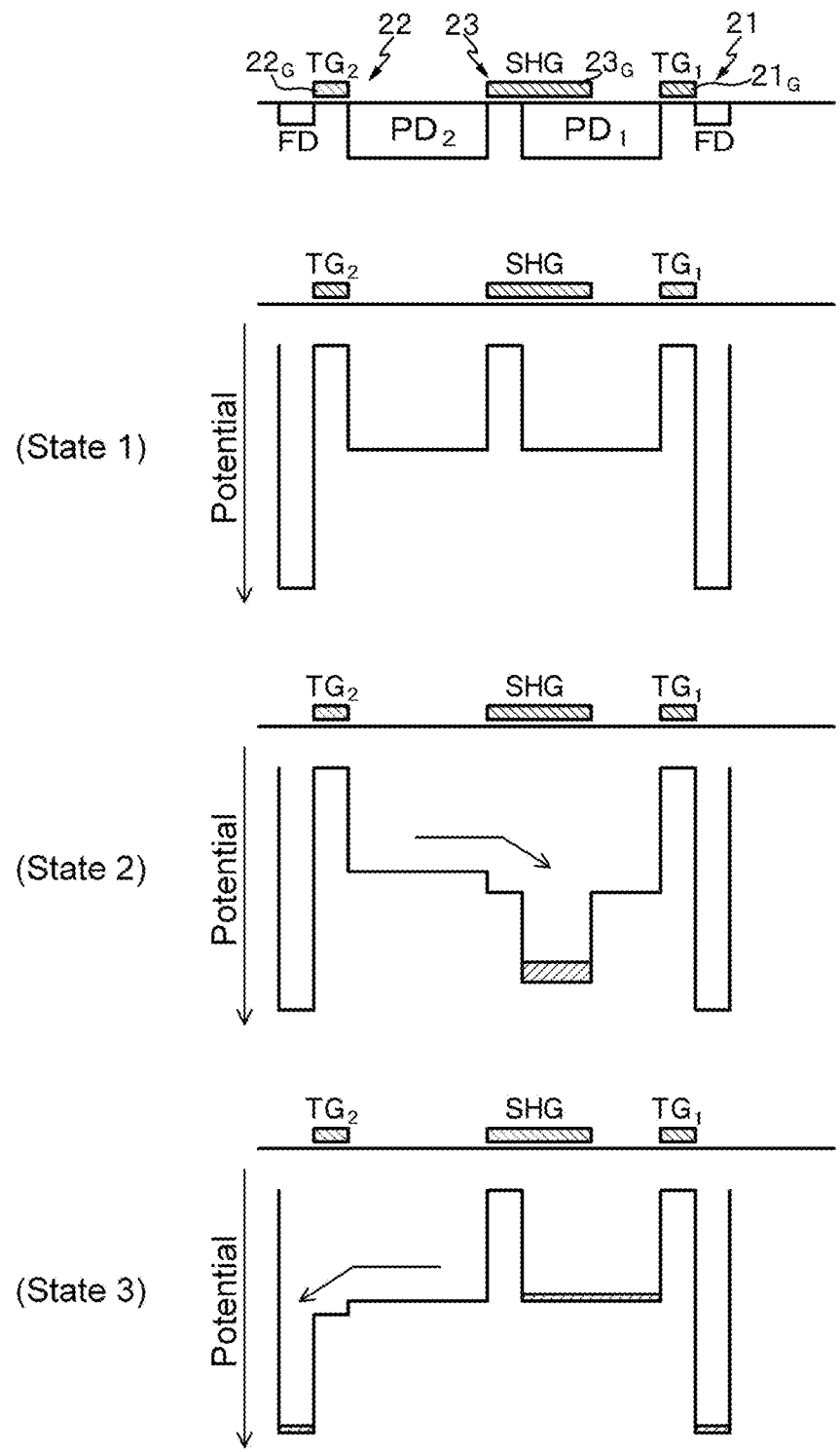
FIG. 14 is a potential diagram for describing a circuit operation of a unit pixel according to a modified example 1 of the second embodiment.

FIG. 14 is a potential diagram for describing a circuit operation of the unit pixel 20 according to a modified example 1 of the second embodiment. On the uppermost part of FIG. 14, cross-sectional structures of the transfer transistor 22, the second photodiode $PD_2$, the shutter transistor 23, the first photodiode $PD_1$, and the transfer transistor 21 are shown.

As shown in FIG. 14, in the modified example 1 of the second embodiment, the gate electrode $23_G$ of the shutter transistor 23 is extended to above the first photodiode $PD_1$ in the pixel structure. That is, the gate electrode $23_G$ of the shutter transistor 23 is provided so as to overlap with a part of the first photodiode $PD_1$. At this time, the potential relationship between the first photodiode $PD_1$ and the second photodiode $PD_2$ may be substantially the same (state 1). Alternatively, the second photodiode $PD_2$ may be shallower than the first photodiode $PD_1$.

By using such a pixel structure, in the case of making the shutter signal SHG active and making the shutter transistor 23 conductive, the potential under the gate electrode $23_G$ of the shutter transistor 23 together with the potential of the first photodiode $PD_1$ become deep (state 2). Therefore, even in the case where the potentials of the first photodiode $PD_1$ and the second photodiode $PD_2$ are substantially the same, it is possible to transfer the signal charges from the second photodiode $PD_2$ to the first photodiode $PD_1$.

Modified Example 2 of Second Embodiment

Figure 15:
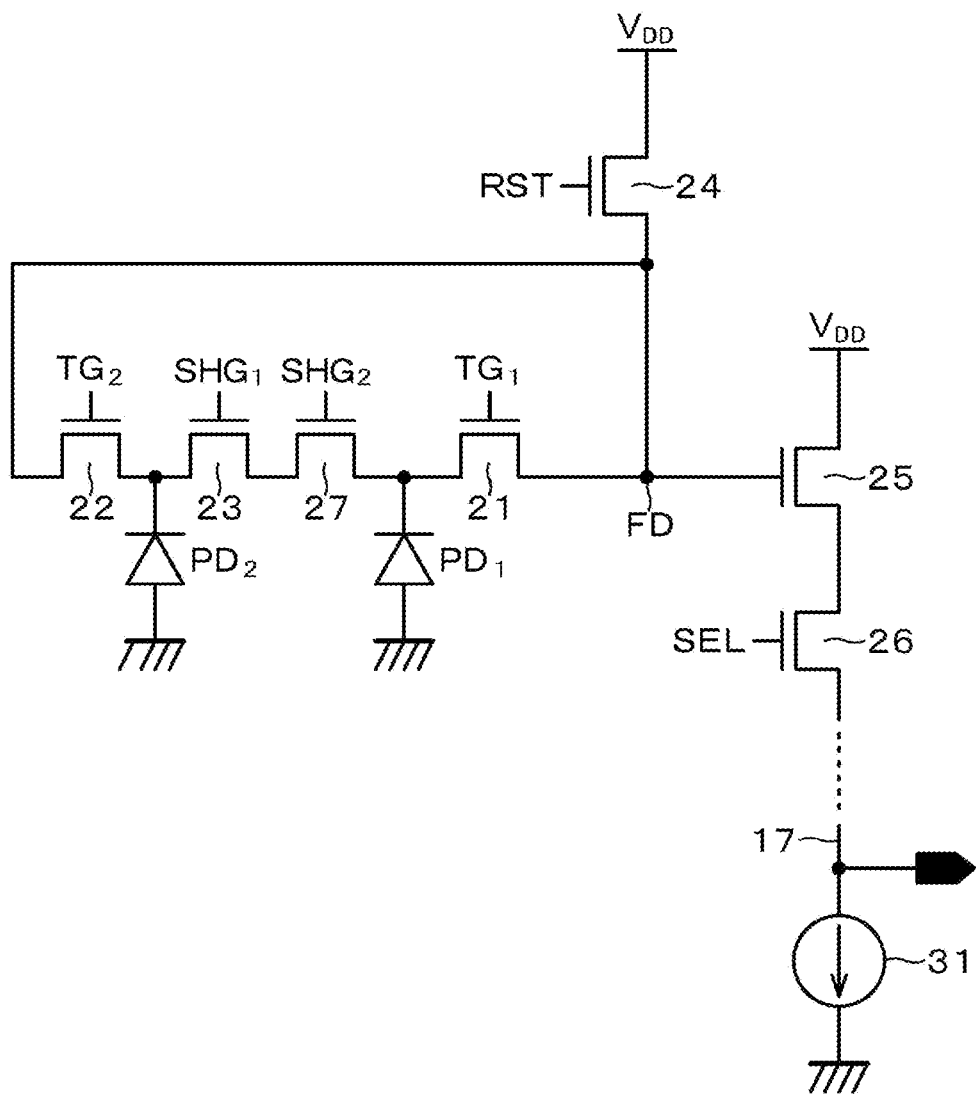
FIG. 15 is a circuit diagram showing a circuit configuration of a unit pixel according to a modified example 2 of the second embodiment.
Figure 16:
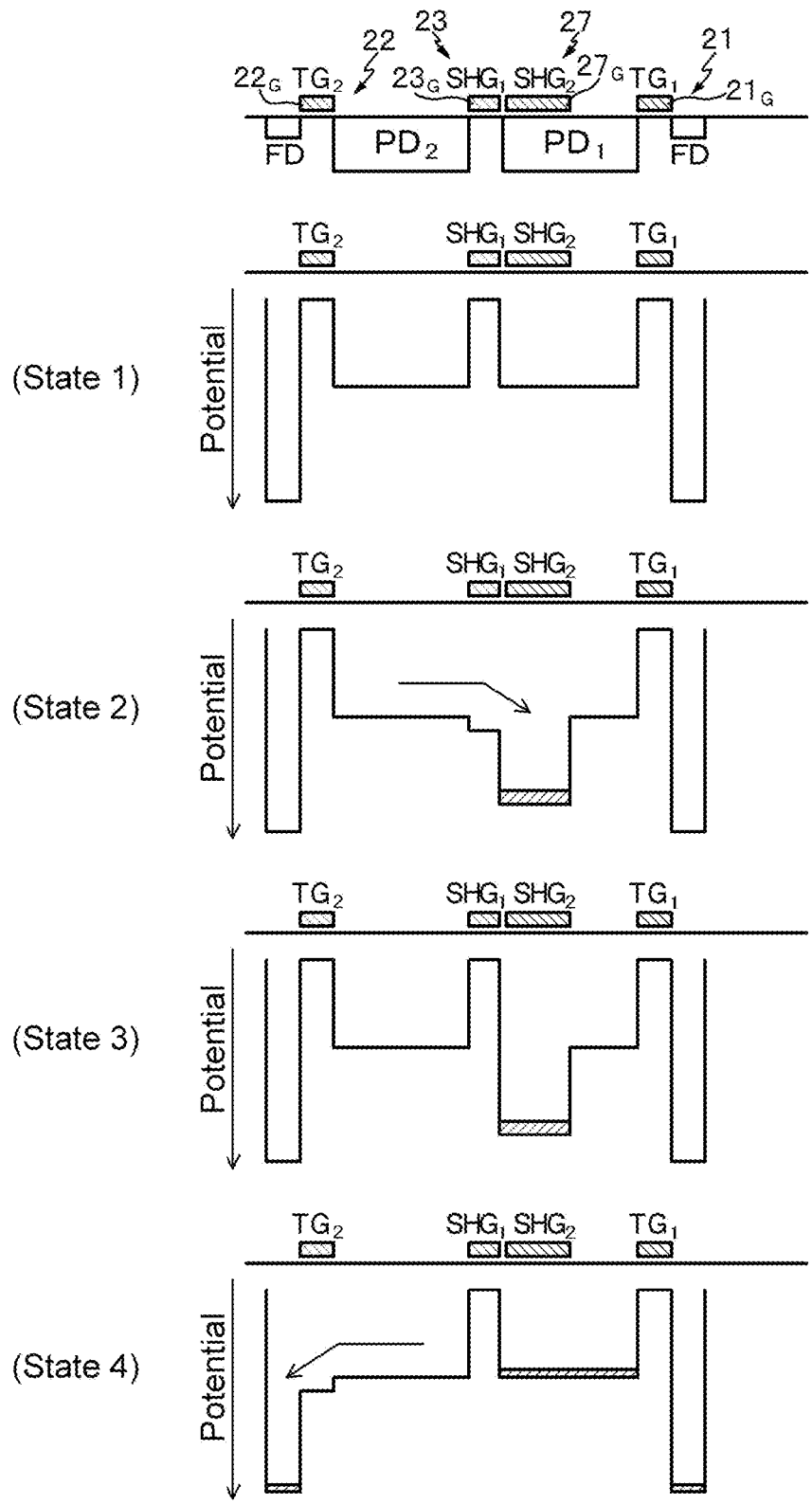
FIG. 16 is a potential diagram for describing a circuit operation of the unit pixel according to the modified example 2 of the second embodiment.

FIG. 15 is a circuit diagram showing a circuit configuration of a unit pixel according to a modified example 2 of the second embodiment. Further, FIG. 16 is a potential diagram for describing a circuit operation of the unit pixel 20 according to the modified example 2. On the uppermost part of FIG. 16, cross-sectional structures of the transfer transistor 22, the second photodiode $PD_2$, the shutter transistor 23, the first photodiode $PD_1$, and the transfer transistor 21 are shown.

In the modified example 2 of the second embodiment, two transistors of the shutter transistor 23 and a shutter transistor 27 are arranged in series between the first photodiode $PD_1$ and the second photodiode $PD_2$ as the discharge gate units in the pixel structure. In the pixel structure according to this modified example 2, the shutter transistor 23 in the pixel structure according to the modified example 1 is divided into two. Specifically, as shown in the uppermost part of FIG. 16, of the two transistors arranged in series, the shutter transistor 27 on the side of the first photodiode $PD_1$ is provided so that a gate electrode 27G of the shutter transistor 27 overlaps with a part of the first photodiode $PD_1$.

Next, the circuit operation of the pixel structure according to the modified example 2 will be described with reference to the potential diagram of FIG. 16. In this example, the potential relationship between the first photodiode $PD_1$ and the second photodiode $PD_2$ is set to be substantially the same (state 1). In this state, a shutter signal SHG1 for driving the shutter transistor 23 and a shutter signal SHG2 for driving the shutter transistor 27 are simultaneously made active at the same timing as that of the above-mentioned shutter signal SHG (state 2).

Further, in the case of making the shutter signal SHG1 and the shutter signal SHG2 inactive, the circuit operation of making the shutter signal SHG1 inactive, and then making the shutter signal SHG2 inactive is performed (state 3). In the period in which the transfer signal $TG_2$ is active, since the potential under the gate electrode $22_G$ of the transfer transistor 22 becomes deep, the signal charges of the second photodiode $PD_2$ are transferred to the floating diffusion FD (state 4).

The modified example 2 of the second embodiment is characterized by performing the circuit operation as the state 3, i.e., making the shutter signal SHG1 inactive and then making the shutter signal SHG2 inactive. By using such a circuit operation, it is possible to make the shutter transistor 23 nonconductive first between the second photodiode $PD_2$ and the first photodiode $PD_1$. Therefore, it is possible to prevent charges from flowing back from the first photodiode $PD_1$ to the second photodiode $PD_2$ at the time of the operation of the shutter transistor 23 and the shutter transistor 27. In other words, since the potential relationship between the first photodiode $PD_1$ and the second photodiode $PD_2$ can be freely set, the degree of freedom of setting the potential relationship is increased.

Third Embodiment

A third embodiment is an example in which an FD switching transistor $28_1$ is placed between the transfer transistor 21 on the side of the first photodiode $PD_1$ and the reset transistor 24 as the first switching gate unit in the unit pixel 20 according to the second embodiment. The circuit configuration of the unit pixel 20 according to the third embodiment is shown in FIG. 17.

[Circuit Configuration of Unit Pixel]

Figure 17:
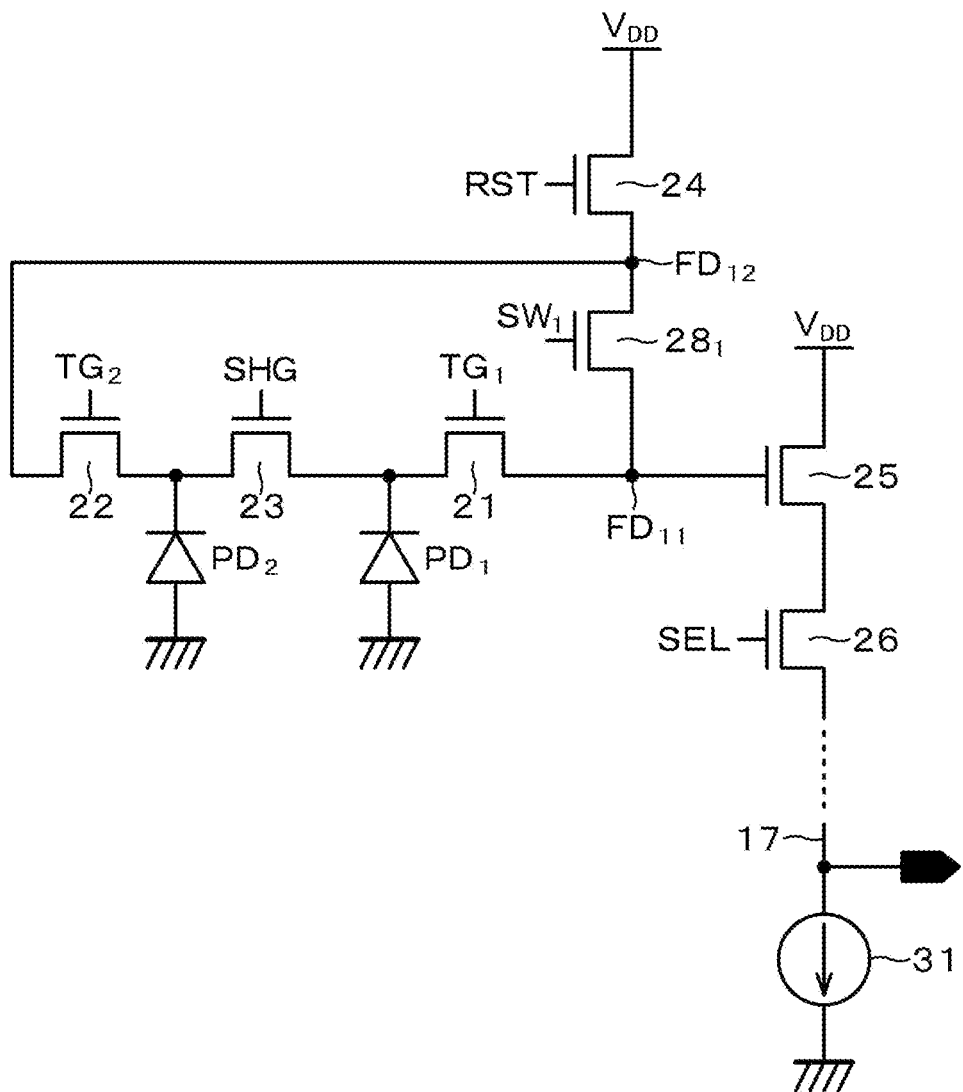
FIG. 17 is a circuit diagram showing a circuit configuration of a unit pixel according to a third embodiment.

As shown in FIG. 17, placing the FD switching transistor $28_1$ between the transfer transistor 21 and the reset transistor 24 is equivalent to dividing a part corresponding to the floating diffusion FD in the unit pixel 20 according to the second embodiment into two. Of the two divided parts, an area surrounded by the transfer transistor 21, the amplification transistor 25, and the FD switching transistor $28_1$ is a floating diffusion $FD_{11}$, and a second area surrounded by the FD switching transistor $28_1$, the reset transistor 24, and the transfer transistor 22 is a floating diffusion $FD_{12}$. To a gate electrode of the FD switching transistor $28_1$, the switch signal $SW_1$ that is active at a high level is supplied from the vertical driving unit 12 (see FIG. 1).

Under control by the switch signal $SW_1$ for driving the FD switching transistor $28_1$, it is possible to switch two modes of a high-conversion efficiency mode and a low-conversion efficiency mode with respect to the floating diffusion FD at the time of reading the signal charge of the first photodiode $PD_1$. In the high-conversion efficiency mode, an operation of using only the floating diffusion $FD_{11}$ as a charge-voltage conversion section is performed. In the low-conversion efficiency mode, an operation of making the FD switching transistor $28_1$ conductive to use the floating diffusion $FD_{11}$ and the floating diffusion $FD_{12}$ as a charge-voltage conversion section.

With the unit pixel 20 according to the third embodiment, it is possible to arbitrarily switch the high-conversion efficiency mode and the low-conversion efficiency mode by the FD switching transistor $28_1$ placed between the transfer transistor 21 and the reset transistor 24 for operation. Details of the operation in the high-conversion efficiency mode and the low-conversion efficiency mode will be described later.

Figure 18:
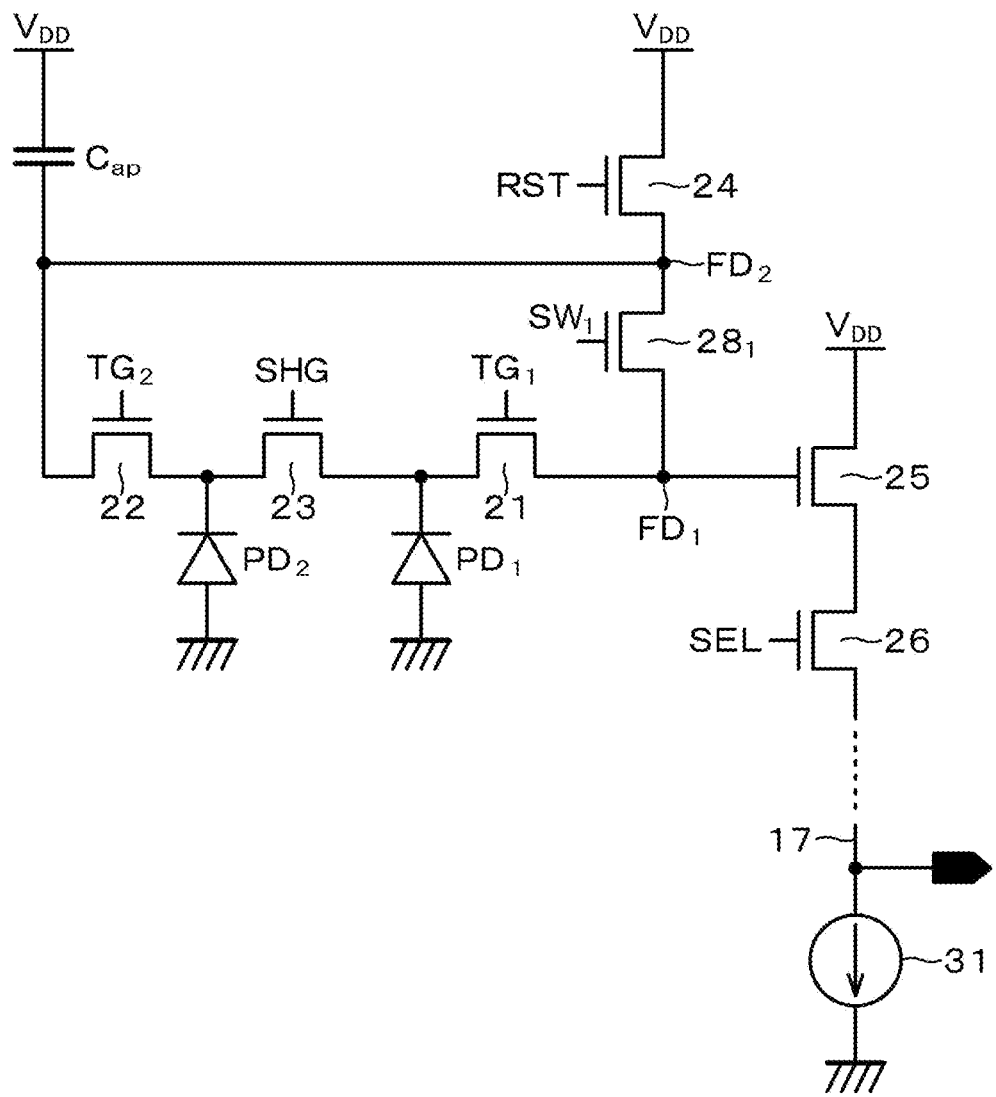
FIG. 18 is a circuit diagram showing another circuit configuration of the unit pixel according to the third embodiment.

Further, since the floating diffusion $FD_{12}$ can be separated from the floating diffusion $FD_{11}$ by the FD switching transistor $28_1$, it is possible to add a capacitive element $C_{ap}$ to the floating diffusion $FD_{12}$ as shown in FIG. 18. Examples of the capacitive element $C_{ap}$ include a MOS (Metal Oxide Semiconductor) capacitor and a MIM (Metal Insulator Metal) capacitor.

Since the conversion efficiency at the time of charge/voltage conversion by the floating diffusion $FD_{12}$ can be reduced and the amount of signal charges that can be held can be increased by adding the capacitive element $C_{ap}$ to the floating diffusion $FD_{12}$, it is possible to further expand the dynamic range.

Note that even in the case where the FD switching transistor $28_1$ is not placed between the transfer transistor 21 and the reset transistor 24, it is possible to add the capacitive element $C_{ap}$. However, since the conversion efficiency at the time of reading the signal charge of the first photodiode $PD_1$ is reduced, a configuration in which no FD switching transistor $28_1$ is placed is not favorable from a viewpoint of expanding the dynamic range.

[Circuit Operation in High-Conversion Efficiency Mode]

Figure 19:
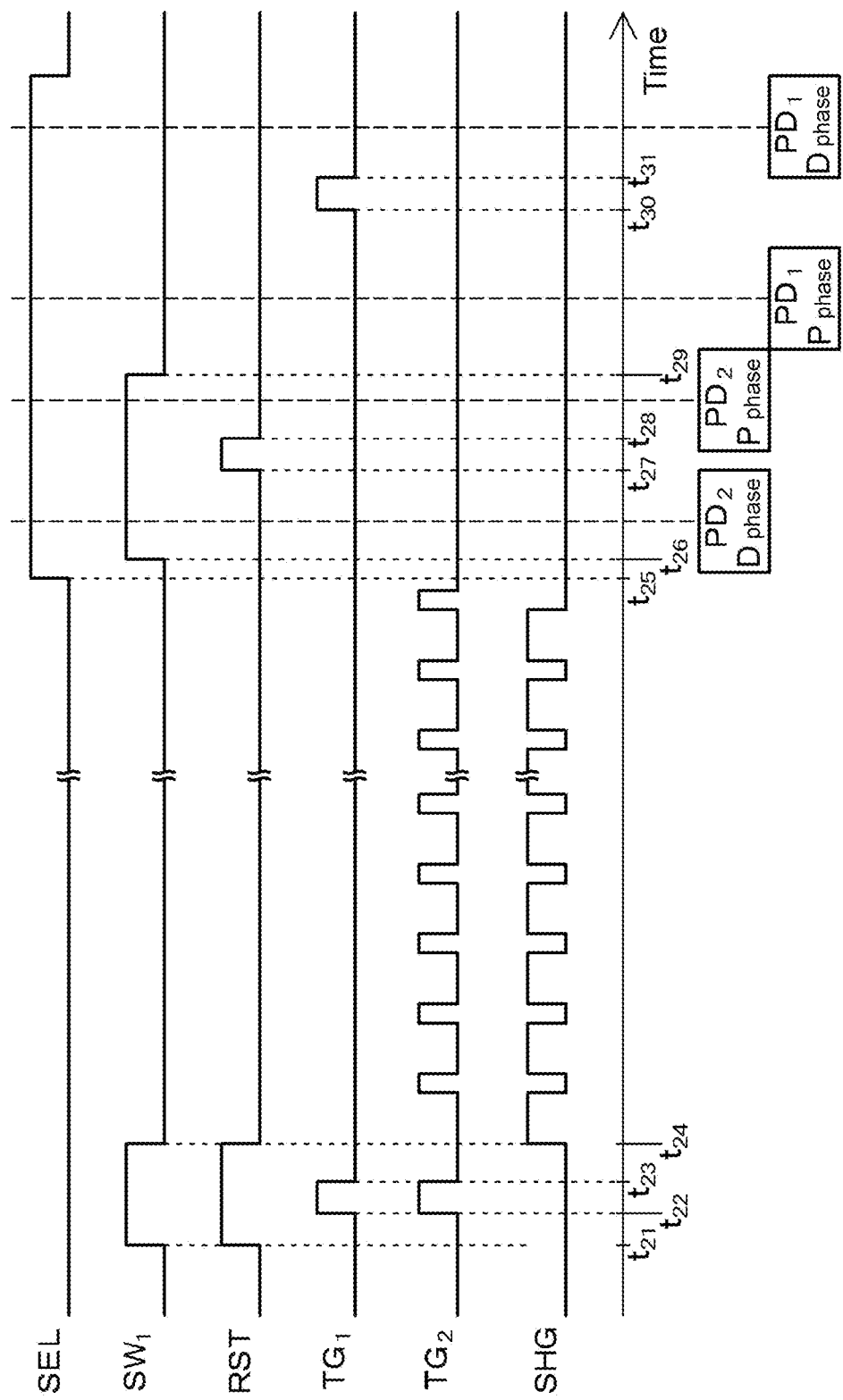
FIG. 19 is a timing waveform chart for describing a circuit operation of the unit pixel according to the third embodiment in a high-conversion efficiency mode.

The circuit operation in the high-conversion efficiency mode in the unit pixel 20 according to the third embodiment will be described using a timing waveform chart of FIG. 19. In FIG. 19, waveforms of the selection signal SEL, the switch signal $SW_1$, the reset signal RST, the transfer signal $TG_1$, the transfer signal $TG_2$, and the shutter signal SHG output from the vertical driving unit 12 are shown.

Before starting exposure, the switch signal $SW_1$ and the reset signal RST are made active at a time $t_{21}$ to reset the first photodiode $PD_1$, the second photodiode $PD_2$, the floating diffusion $FD_{11}$, and the floating diffusion $FD_{12}$. After that, the transfer signal $TG_1$ and the transfer signal $TG_2$ are made active at a time $t_{22}$.

In the period in which the reset signal RST is active, the transfer signal $TG_1$ is made inactive (in a low-level state) at a time $t_{23}$ to make the transfer transistor 21 nonconductive, thereby starting storing, in the first photodiode $PD_1$, of the signal charges photoelectrically converted by the photodiode $PD_1$ (starting exposure). Also in the second photodiode $PD_2$, the transfer signal $TG_2$ is made inactive at the time $t_{23}$ to make the transfer transistor 22 nonconductive, thereby starting storing, in the photodiode $PD_2$, of the photoelectrically converted signal charges.

Since the circuit operation after the start of exposure at the time $t_{23}$ is the same as that in the first embodiment, description thereof is omitted. Note that in the timing waveform chart of FIG. 19, although the switch signal $SW_1$ is made inactive in the exposure period, it may remain in the active state.

The unit pixel 20 is made in a selected state by making the selection signal SEL active at a time $t_{25}$ to make the selection transistor 26 conductive after intermittent driving with respect to storing of signal charges of the second photodiode $PD_2$ by the shutter signal SHG and the transfer signal $TG_2$ in the exposure period.

After that, in the period in which the selection signal SEL is active, i.e., the unit pixel 20 is being selected, the switch signal $SW_1$ is made active at a time $t_{26}$ to make the FD switching transistor $28_1$ conductive. Then, the D phase (low-sensitivity data signal SL) of the second photodiode $PD_2$ is read to the vertical signal line 17 through the FD switching transistor $28_1$, the amplification transistor 25, and the selection transistor 26. In the exposure period, in the case where the switch signal $SW_1$ has been made active, the active state thereof is continued.

Next, the reset signal RST is made active at a time $t_{27}$ to make the reset transistor 24 conductive, thereby resetting the floating diffusion $FD_{11}$ and the floating diffusion $FD_{12}$. Then, after making the reset signal RST inactive at a time $t_{28}$, the level of the floating diffusion FD ($FD_{11}$+$FD_{12}$) is read to the vertical signal line 17 as the P phase (low-sensitivity reset signal NL) of the second photodiode $PD_2$.

After that, by making the switch signal $SW_1$ inactive at a time $t_{29}$ to make the FD switching transistor $28_1$ nonconductive, the floating diffusion FD becomes only the floating diffusion $FD_{11}$. In this state, the level of the floating diffusion $FD_{11}$ is read to the vertical signal line 17 as the P phase (low-sensitivity reset signal NL) of the first photodiode $PD_1$.

Next, the transfer signal $TG_1$ is made active at a time $t_{30}$ to make the transfer transistor 21 conductive, thereby transferring the signal charges exposed/stored in the first photodiode $PD_1$ to the floating diffusion $FD_{11}$. Then, the level of the floating diffusion $FD_{11}$ is read to the vertical signal line 17 as the D phase (high-sensitivity data signal SH) of the first photodiode $PD_1$. After that, the transfer signal $TG_1$ is made inactive at a time $t_{31}$.

[Circuit Operation in Low-Conversion Efficiency Mode]

Figure 20:
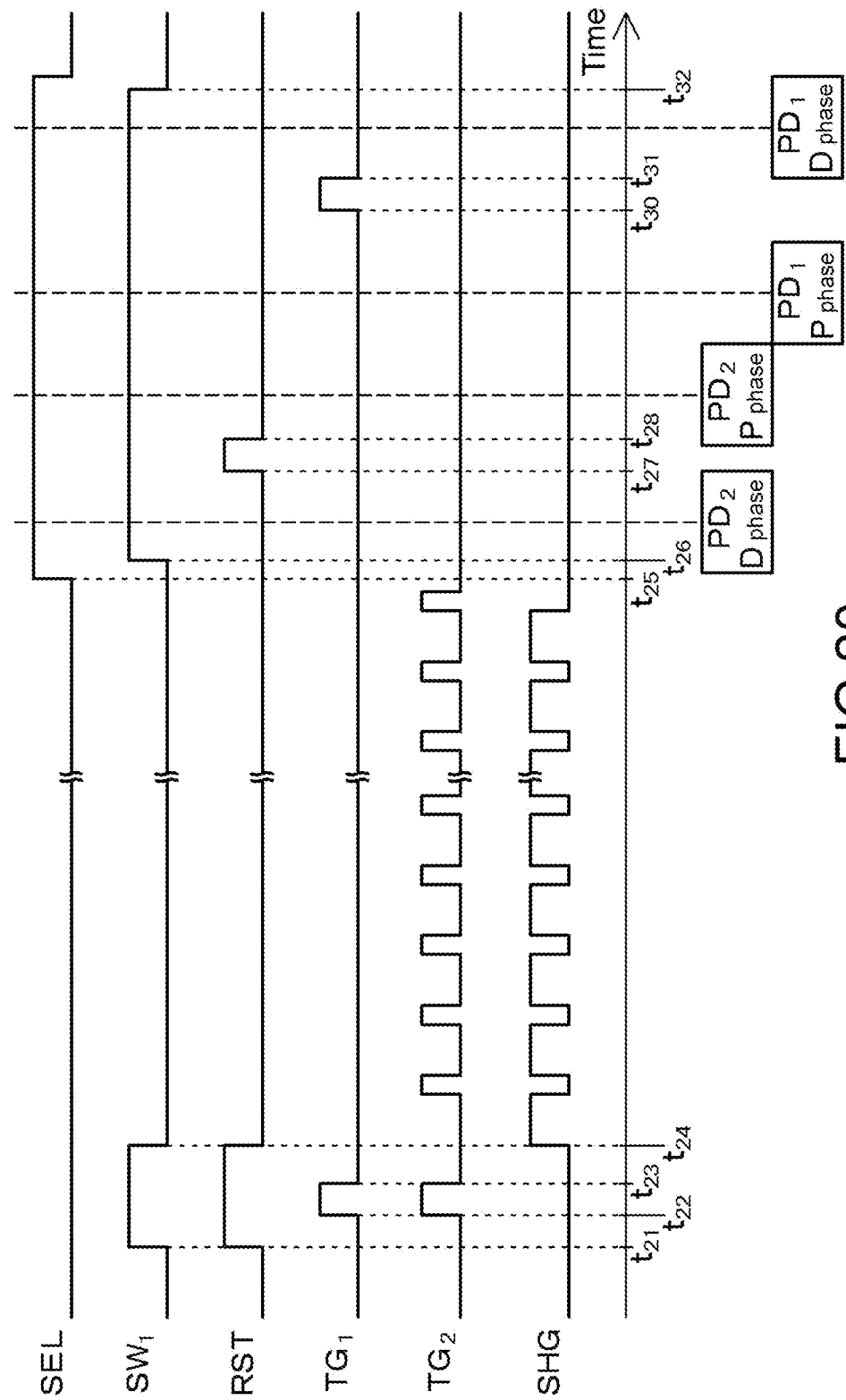
FIG. 20 is a timing waveform chart for describing a circuit operation of the unit pixel according to the third embodiment in a low-conversion efficiency mode.

Next, the circuit operation in the low-conversion efficiency mode in the unit pixel 20 according to the third embodiment will be described using a timing waveform chart of FIG. 20. In FIG. 20, waveforms of the selection signal SEL, the switch signal $SW_1$, the reset signal RST, the transfer signal $TG_1$, the transfer signal $TG_2$, and the shutter signal SHG output from the vertical driving unit 12 are shown similarly in FIG. 19.

In the case of the low-conversion efficiency mode, as shown in the timing waveform chart of FIG. 20, the switch signal $SW_1$ that has been made active at the time $t_{26}$ in the period in which the selection signal SEL is active is made inactive at a time $t_{32}$ after at the time $t_{31}$ at which the transfer signal $TG_1$ is made inactive. Accordingly, in the state where the floating diffusion FD is $FD_{11}$+$FD_{12}$, the P phase (low-sensitivity reset signal NL) and the D phase (high-sensitivity data signal SH) of the first photodiode $PD_1$ are read to the vertical signal line 17.

Note that although the circuit configuration of the unit pixel 20 according to the third embodiment has been described on the basis of the circuit configuration of the unit pixel 20 according to the second embodiment in the above, similar operations and effects can be obtained also with a circuit configuration in which the FD switching transistor $28_1$ is added to the circuit configuration of the unit pixel 20 according to the first embodiment.

Fourth Embodiment

A fourth embodiment is a modified example of the third embodiment. The third embodiment is an example in which the FD selector switch $28_1$ is placed between the transfer transistor 21 on the side of the first photodiode $PD_1$ and the reset transistor 24 as the first switching gate unit. Meanwhile, in the fourth embodiment, an FD selector switch $28_2$ is placed between the transfer transistor 22 on the side of the second photodiode $PD_2$ and the reset transistor 24 as a second switching gate unit. The circuit configuration of the unit pixel 20 according to the fourth embodiment is shown in FIG. 21.

[Circuit Configuration of Unit Pixel]

Figure 21:
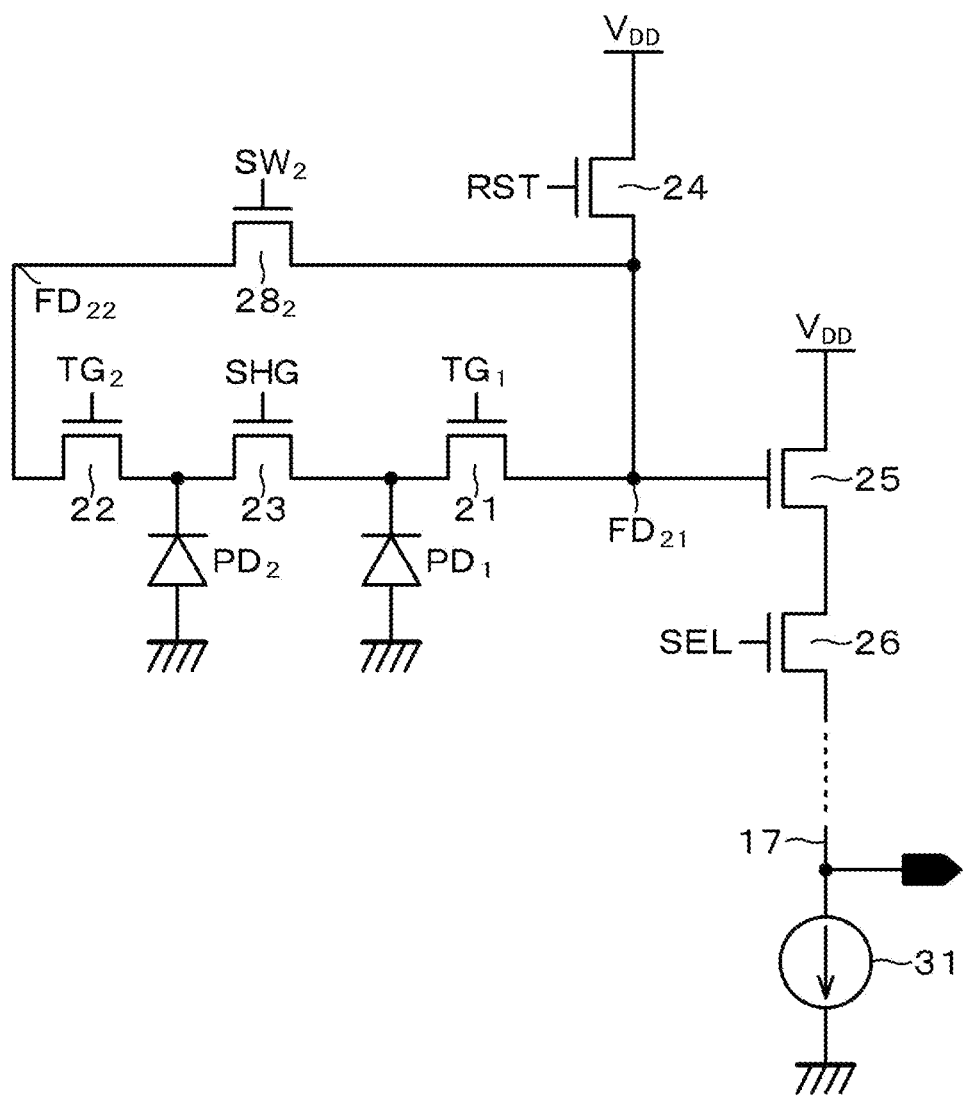
FIG. 21 is a circuit diagram showing a circuit configuration of a unit pixel according to a fourth embodiment.

As shown in FIG. 21, placing the FD switching transistor $28_2$ between the transfer transistor 22 and the reset transistor 24 is equivalent to dividing a part corresponding to the floating diffusion FD in the unit pixel 20 according to the second embodiment into two. Of the two divided parts, a first area surrounded by the transfer transistor 21, the amplification transistor 25, and the FD switching transistor $28_2$ is a floating diffusion $FD_{21}$, and a second area located between the transfer transistor 22 and the FD switching transistor $28_2$ is a floating diffusion $FD_{22}$. To a gate electrode of the FD switching transistor $28_2$, a switch signal $SW_2$ that is active at a high level is supplied from the vertical driving unit 12 (see FIG. 1).

With the unit pixel 20 according to the fourth embodiment, by placing the FD switching transistor $28_2$ between the transfer transistor 22 and the reset transistor 24, the signal of the first photodiode $PD_1$ can be read earlier than the signal of the second photodiode $PD_2$.

Figure 22:
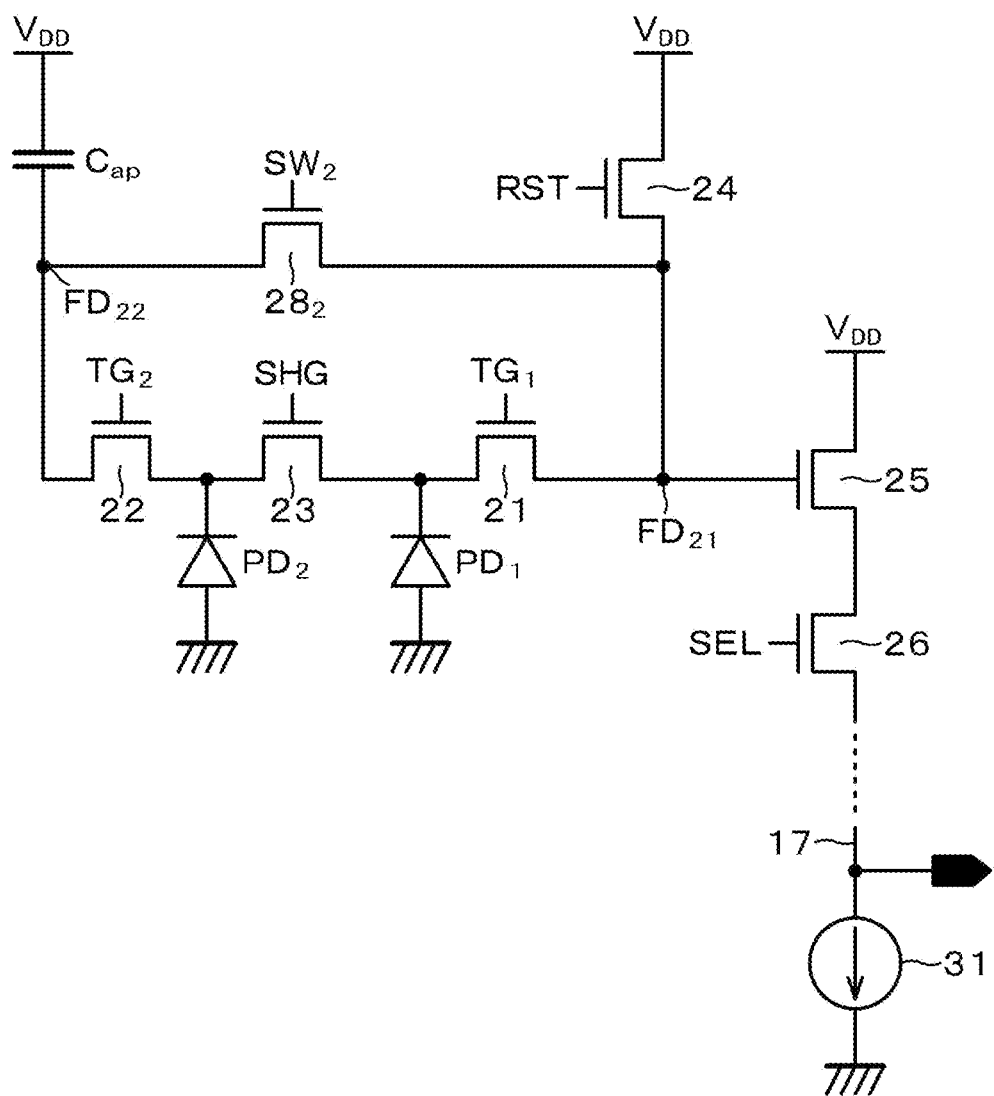
FIG. 22 is a circuit diagram showing another circuit configuration of the unit pixel according to the fourth embodiment.

Further, since the floating diffusion $FD_{22}$ can be separated from the floating diffusion $FD_{21}$ by the FD switching transistor $28_2$, it is possible to add the capacitive element $C_{ap}$ to the floating diffusion $FD_{22}$ as shown in FIG. 22. Accordingly, since the conversion efficiency of the floating diffusion $FD_{22}$ can be reduced and the amount of signal charges that can be held can be increased, it is possible to further expand the dynamic range.

Note that even in the case where the FD switching transistor $28_2$ is not placed between the transfer transistor 22 and the reset transistor 24, it is possible to add the capacitive element $C_{ap}$. However, since also the conversion efficiency at the time of reading the signal charge of the first photodiode $PD_1$ is reduced, a configuration where no FD switching transistor $28_2$ is placed is not favorable from a viewpoint of expanding the dynamic range.

[Circuit Operation of Unit Pixel]

Figure 23:
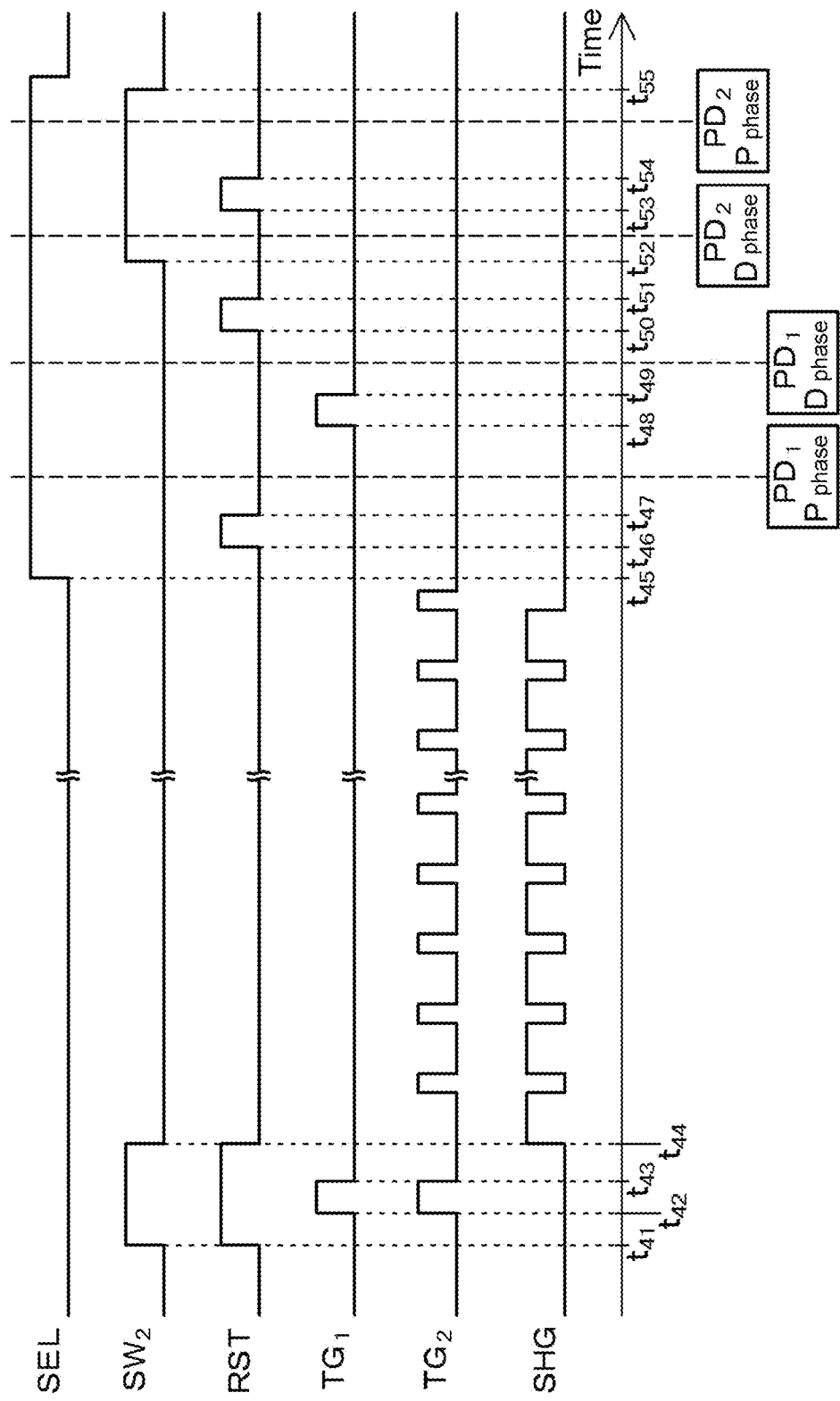
FIG. 23 is a timing waveform chart for describing a circuit operation of the unit pixel according to the fourth embodiment.

Next, the circuit operation of the unit pixel 20 having the above-mentioned configuration according to the fourth embodiment will be described using a timing waveform chart of FIG. 23. In FIG. 23, waveforms of the selection signal SEL, the switch signal $SW_2$, the reset signal RST, the transfer signal $TG_1$, the transfer signal $TG_2$, and the shutter signal SHG output from the vertical driving unit 12 are shown.

The circuit operation in the case of the fourth embodiment is an operation in a mode reading the signal of the first photodiode $PD_1$ earlier than the signal of the second photodiode $PD_2$. The operation in this mode will be specifically described below.

Before starting exposure, the switch signal $SW_2$ and the reset signal RST are made active at a time $t_{41}$ to reset the first photodiode $PD_1$, the second photodiode $PD_2$, the floating diffusion $FD_{21}$, and the floating diffusion $FD_{22}$. After that, the transfer signal $TG_1$ and the transfer signal $TG_2$ are made active at a time $t_{42}$.

Next, in the period in which the reset signal RST is active, the transfer signal $TG_1$ is made inactive at a time $t_{43}$ to make the transfer transistor 21 nonconductive, thereby starting storing, in the first photodiode $PD_1$ the signal charges photoelectrically converted by the photodiode $PD_1$ (starting exposure). Also in the second photodiode $PD_2$, the transfer signal $TG_2$ is made inactive at the time $t_{43}$ to make the transfer transistor 22 nonconductive, thereby starting storing, in the photodiode $PD_2$, of the photoelectrically converted signal charges.

Since the circuit operation after the start of exposure at the time $t_{43}$ is the same as that in the first embodiment, description thereof is omitted. In the example of FIG. 23, in the exposure period, the switch signal $SW_2$ is made inactive.

After intermittent driving with respect to storing of signal charges of the second photodiode $PD_2$ by the shutter signal SHG and the transfer signal $TG_2$ in the exposure period, the selection signal SEL is made active at a time $t_{45}$ to make the selection transistor 26 conductive, thereby making the unit pixel 20 in a selected state.

After that, in the period in which the selection signal SEL is active, i.e., the unit pixel 20 is being selected, the reset signal RST is made active at a time $t_{46}$ to make the reset transistor 24 conductive, thereby resetting the floating diffusion $FD_{21}$. Then, after making the reset signal RST inactive at a time $t_{47}$, the level of the floating diffusion $FD_{21}$ is read to the vertical signal line 17 as the P phase (high-sensitivity reset signal NH) of the first photodiode $PD_1$.

Next, the transfer signal $TG_1$ is made active at a time $t_{48}$ to make the transfer transistor 21 conductive, thereby transferring the signal charges exposed/stored in the first photodiode $PD_1$ to the floating diffusion $FD_{21}$. Then, the level of the floating diffusion $FD_{21}$ is read to the vertical signal line 17 as the D phase (high-sensitivity data signal SH) of the first photodiode $PD_1$.

Next, the reset signal RST is made active at a time $t_{50}$ to make the reset transistor 24 conductive, thereby resetting the floating diffusion $FD_{21}$. Then, the reset signal RST is made inactive at a time $t_{51}$. After that, the switch signal $SW_2$ is made active at a time $t_{52}$ to make the FD switching transistor $28_2$ conductive.

Since the FD switching transistor $28_2$ is made conductive, the signal charges of the second photodiode $PD_2$ stored in the floating diffusion $FD_{22}$ are held in the floating diffusion FD ($FD_{21}$+$FD_{22}$). Then, the level of the floating diffusion FD in this holding state is read to the vertical signal line 17 as the D phase (low-sensitivity data signal SL) of the second photodiode $PD_2$.

Next, in the period in which the switch signal $SW_2$ is active, the reset signal RST is made active at a time $t_{53}$ to make the reset transistor 24 conductive, thereby resetting the floating diffusion $FD_{22}$. Then, after making the reset signal RST inactive at a time $t_{54}$, the level of the floating diffusion $FD_{22}$ is read to the vertical signal line 17 as the P phase (low-sensitivity reset signal NL) of the second photodiode $PD_2$. After that, the switch signal $SW_2$ is made inactive at a time $t_{55}$.

Note that although the circuit configuration of the unit pixel 20 according to the fourth embodiment has been described on the basis of the circuit configuration of the unit pixel 20 according to the second embodiment in the above, similar operations and effects can be obtained even with a circuit configuration in which the FD switching transistor $28_2$ is added to the circuit configuration of the unit pixel 20 according to the first embodiment.

Further, the FD switching transistor $28_2$ in the fourth embodiment can be used as the low-conversion efficiency mode of the first photodiode $PD_1$ similarly to the FD switching transistor $28_1$ in the third embodiment. However, in this case, the order of reading signals is limited to the order of the second photodiode $PD_2$-> the first photodiode $PD_1$.

Fifth Embodiment

Figure 24:
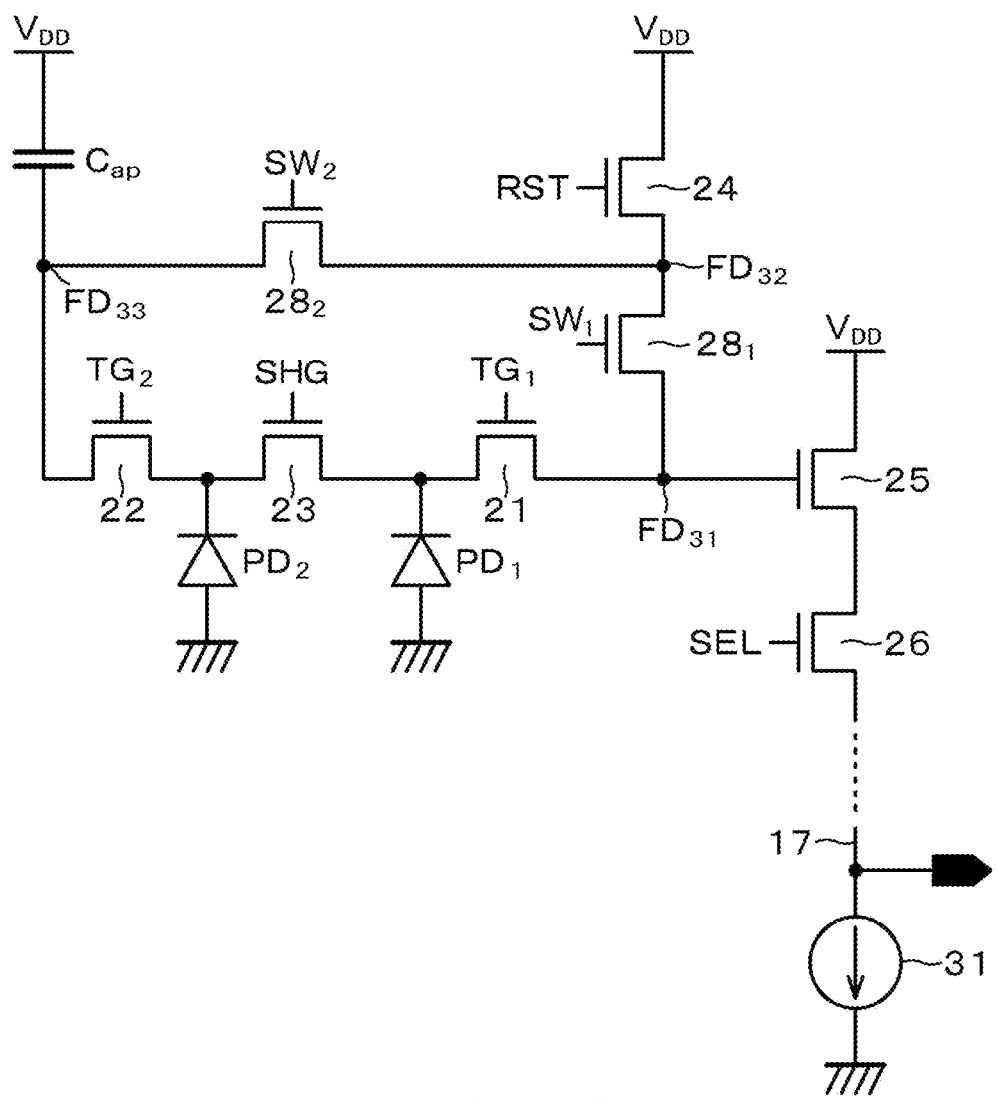
FIG. 24 is a circuit diagram showing a circuit configuration of a unit pixel according to a fifth embodiment.
Figure 25:
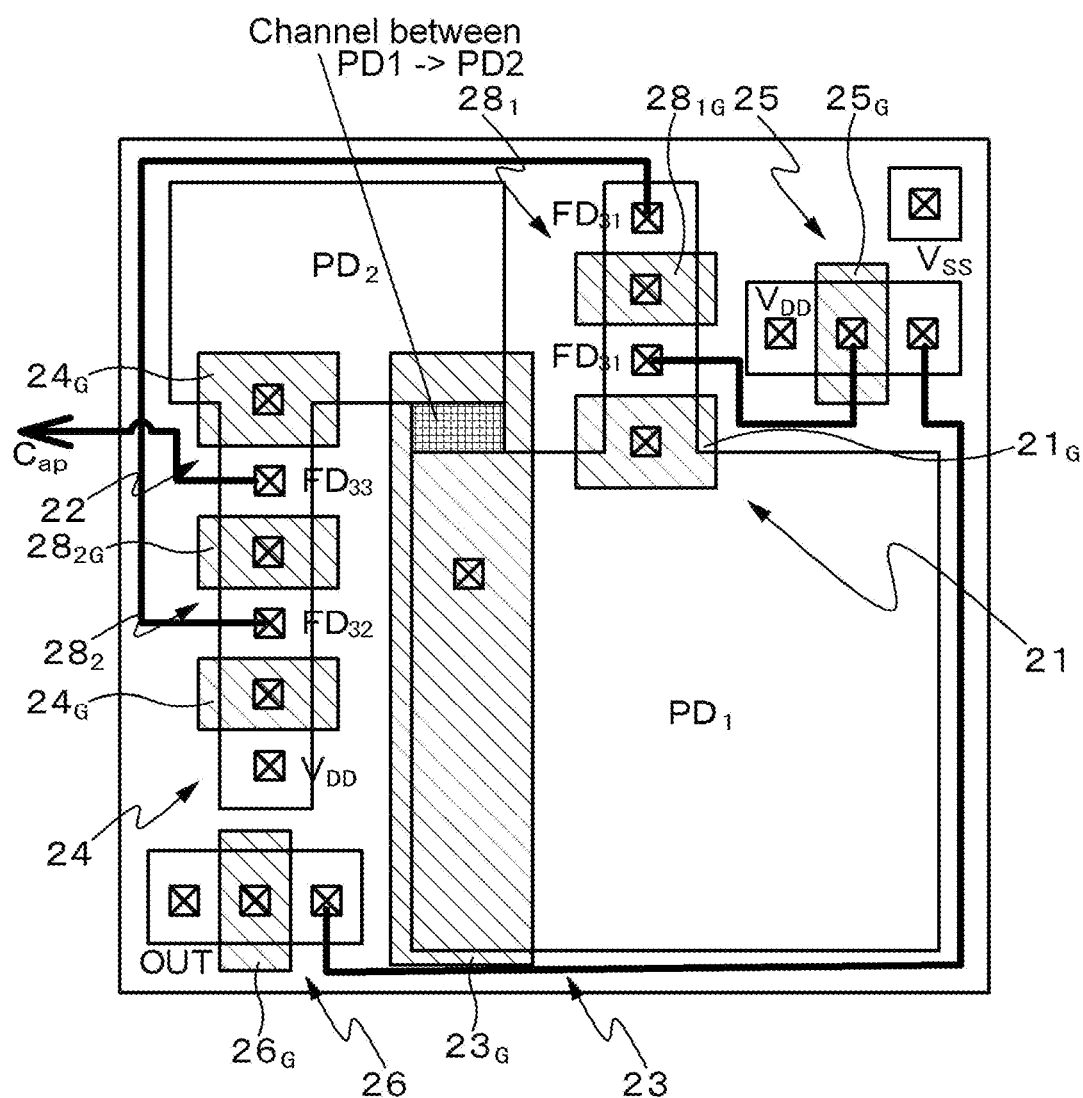
FIG. 25 is a layout diagram showing a planar layout of the unit pixel according to the fifth embodiment.

A fifth embodiment is a combination of the second embodiment, the third embodiment, and the fourth embodiment. The circuit configuration of the unit pixel 20 according to the fifth embodiment is shown in FIG. 24, and the configuration of the planar layout of the unit pixel 20 according to the fifth embodiment is shown in FIG. 25.

[Circuit Configuration of Unit Pixel]

In the fifth embodiment, two FD switching transistors are provided. Specifically, as shown in FIG. 24, the FD switching transistor $28_1$ placed between the transfer transistor 21 and the reset transistor 24 as the first switching gate unit, and the FD switching transistor $28_2$ placed between the transfer transistor 22 and the reset transistor 24 as the second switching gate unit are provided. To a gate electrode $28_{1G}$ of the FD switching transistor $28_1$, the switch signal $SW_1$ that is active at a high level is added. To a gate electrode $28_{2G}$ of the FD switching transistor $28_2$, the switch signal $SW_2$ that is active at a high level is added.

This equivalent to dividing a part corresponding to the floating diffusion FD in the unit pixel 20 according to the second embodiment into three. Of the three divided parts, a first area surrounded by the transfer transistor 21, the amplification transistor 25, and the FD switching transistor $28_1$ is a floating diffusion $FD_{31}$. Further, a second area surrounded by the FD switching transistor $28_1$, the FD switching transistor $28_2$, and the reset transistor 24 is a floating diffusion $FD_{32}$, and a third area located between the transfer transistor 22 and the FD switching transistor $28_2$ is a floating diffusion $FD_{33}$.

As described above, the conversion efficiency of the signal charges of the first photodiode $PD_1$ can be switched in three ways by selectively dividing the floating diffusion FD into three areas of the $FD_{31}$, $FD_{32}$, and $FD_{33}$ by the two FD switching transistors $28_1$ and $28_2$. Specifically, the three ways include the high-conversion efficiency in the case where the floating diffusion FD is only the $FD_{31}$, the low-conversion efficiency in the case of $FD_{31}+FD_{32}$, and the ultralow-conversion efficiency in the case of $FD_{31}+FD_{32}+FD_{33}$. Further, in the case of the high-conversion efficiency of only the $FD_{31}$ and the low-conversion efficiency of $FD_{31}+FD_{32}$, the order of reading the signals of the first photodiode $PD_1$ and the second photodiode $PD_2$ can be freely changed.

Further, since the floating diffusion $FD_{33}$ can be separated from the floating diffusion $FD_{32}$ by the FD switching transistor $28_2$, it is possible to add the capacitive element $C_{ap}$ to the floating diffusion $FD_{22}$. Accordingly, since the conversion efficiency of the floating diffusion $FD_{33}$ can be reduced and the amount of signal charges that can be held can be increased, it is possible to further expand the dynamic range.

[Circuit Operation of Unit Pixel]

Figure 26:
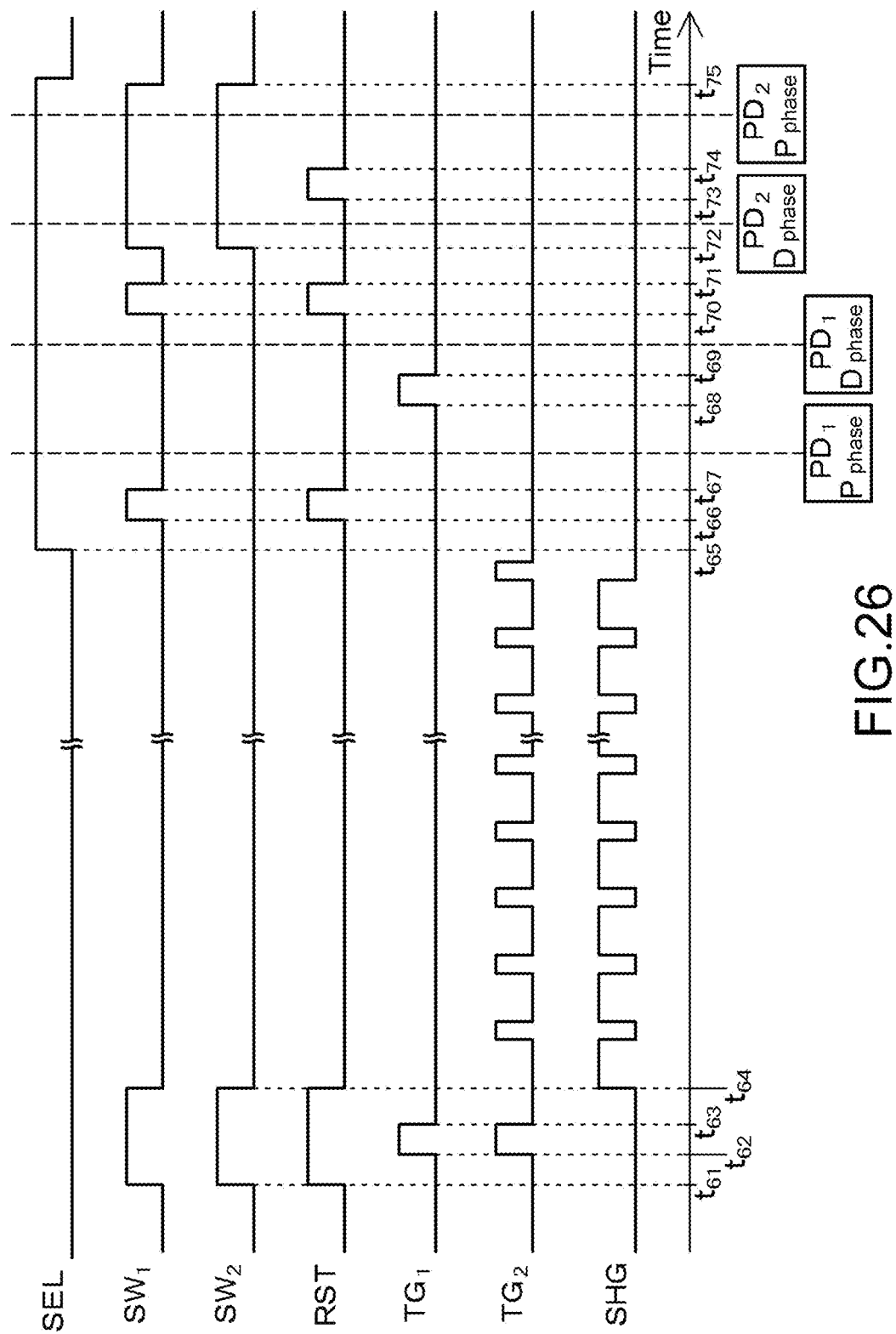
FIG. 26 is a timing waveform chart for describing a circuit operation of the unit pixel according to the fifth embodiment.

Next, the circuit operation of the unit pixel 20 having the above-mentioned configuration according to the fifth embodiment will be described using a timing waveform chart of FIG. 26. In FIG. 26, waveforms of the selection signal SEL, the switch signal $SW_1$, the switch signal $SW_2$, the reset signal RST, the transfer signal $TG_1$, the transfer signal $TG_2$, and the shutter signal SHG output from the vertical driving unit 12 are shown.

Now, as an example of the circuit operation of the unit pixel 20 according to the fifth embodiment, the operation in a case of reading the signal of the first photodiode $PD_1$ first in the high-conversion efficiency mode will be described.

Before starting exposure, the switch signal $SW_1$, the switch signal $SW_2$, and the reset signal RST are made active at a time $t_{61}$ to reset the first photodiode $PD_1$, the second photodiode $PD_2$, the floating diffusion $FD_{31}$, the floating diffusion $FD_{32}$, and the floating diffusion $FD_{33}$. After that, the transfer signal $TG_1$ and the transfer signal $TG_2$ are made active at a time $t_{62}$.

Next, in the period in which the reset signal RST is active, the transfer signal $TG_1$ is made inactive at a time $t_{63}$ to make the transfer transistor 21 nonconductive, thereby starting storing, in the first photodiode $PD_1$, of signal charges photoelectrically converted by the photodiode $PD_1$ (starting exposure). Also in the second photodiode $PD_2$, the transfer signal $TG_2$ is made inactive at the time $t_{63}$ to make the transfer transistor 22 nonconductive, thereby starting storing, in the photodiode $PD_2$, of the photoelectrically converted signal charges.

Since the circuit operation after the exposure start at the time $t_{63}$ is the same as that in the first embodiment, description thereof is omitted. In the example of FIG. 23, in the exposure period, the switch signal $SW_1$ and the switch signal $SW_2$ are made inactive.

In the exposure period, after intermittent driving with respect to storing of signal charges of the second photodiode $PD_2$ by the shutter signal SHG and the transfer signal $TG_2$, the selection signal SEL is made active at a time $t_{65}$ to make the selection transistor 26 conductive, thereby making the unit pixel 20 in a selected state.

After that, in the period in which the selection signal SEL is active, the switch signal $SW_1$ and the reset signal RST are made active at a time $t_{66}$ to reset the floating diffusion $FD_{31}$. Then, after making the switch signal $SW_1$ and the reset signal RST inactive at a time $t_{67}$, the level of the floating diffusion $FD_{31}$ is read to the vertical signal line 17 as the P phase (high-sensitivity reset signal NH) of the first photodiode $PD_1$.

Next, the transfer signal $TG_1$ is made active at a time $t_{68}$ to make the transfer transistor 21 conductive, thereby transferring the signal charges exposed/stored in the first photodiode $PD_1$ to the floating diffusion $FD_{31}$. Then, the level of the floating diffusion $FD_{31}$ is read to the vertical signal line 17 as the D phase (high-sensitivity data signal SH) of the first photodiode $PD_1$.

Next, the switch signal $SW_1$ and the reset signal RST are made active at a time $t_{70}$, thereby resetting the floating diffusion $FD_{31}$. Then, the switch signal $SW_1$ and the reset signal RST are made inactive at a time $t_{71}$. After that, the switch signal $SW_1$ and the switch signal $SW_2$ are made active at a time $t_{72}$ to make the FD switching transistor $28_1$ and the FD switching transistor $28_2$ conductive.

Since the FD switching transistor $28_1$ and the FD switching transistor $28_2$ are made conductive, the signal charges of the second photodiode $PD_2$ stored in the floating diffusion $FD_{33}$ are held in the floating diffusion FD ($FD_{31}+FD_{32}+FD_{33}$). Then, the level of the floating diffusion FD in this holding state is read to the vertical signal line 17 as the D phase (low-sensitivity data signal SL) of the second photodiode $PD_2$.

Next, in the period in which the switch signal $SW_1$ and the switch signal $SW_2$ are active, the reset signal RST is made active at a time $t_{73}$ to reset the floating diffusion $FD_{33}$. Then, after making the reset signal RST inactive at a time $t_{74}$, the level of the floating diffusion $FD_{33}$ is read to the vertical signal line 17 as the P phase (low-sensitivity reset signal NL) of the second photodiode $PD_2$. After that, the switch signal $SW_1$ and the switch signal $SW_2$ are made inactive at a time $t_{75}$.

Although the operation in the case of reading the signal of the first photodiode $PD_1$ in the high-conversion efficiency mode has been described in the above, it only needs to make the FD switching transistor $28_1$ nonconductive at the time of reading the P phase/D phase of the first photodiode $PD_1$ in the case of reading in the low-conversion efficiency mode. Further, by replacing the P phase/D phase of the first photodiode $PD_1$ and replacing the P phase/D phase of the second photodiode $PD_2$, the order of reading the signals of the first photodiode $PD_1$ and the second photodiode $PD_2$ can be also changed.

[Arithmetic Processing for Pixel Signal]

Now, arithmetic processing for a pixel signal in the signal processing unit 18 in the case of using the unit pixel 20 according to the fifth embodiment as the unit pixel 20 in the CMOS image sensor 10 (10A, 10B) will be described.

Processing Example 1 of Arithmetic Processing for Pixel Signal

First, a processing example 1 of arithmetic processing for a pixel signal will be described. In the processing example 1, in the case where the low-sensitivity difference signal SNL falls within a predetermined range, the signal processing unit 18 calculates the ratio of the low-sensitivity difference signal SNL and the high-sensitivity difference signal SNH as a gain for each pixel, each plurality of pixels, each color, or each particular pixel in a common pixel unit, or uniformly for all the pixels, and generates a gain table. Then, the signal processing unit 18 calculates the product of the low-sensitivity difference signal SNL and the gain table as a correction value for the low-sensitivity difference signal SNL.

Assumption is made that the gain is represented by G and the correction value for the low-sensitivity difference signal SNL (hereinafter, referred to as "correction low-sensitivity difference signal") is represented by SNL'. The gain G and the correction low-sensitivity difference signal SNL' can be obtained on the basis of the following formulae (1) to (4).

$$G = SNH/SNL = (Cfd_{31} + Cfd_{32} + Cfd_{33})/Cfd_{31} \times SENS\_H/SENS\_L \quad (1)$$

$$SENS\_H = \alpha + \beta \times \{T_2/(T_1 + T_2)\} \quad (2)$$

$$SENS\_L = \beta \times \{T_2/(T_1 + T_2)\} \quad (3)$$

$$SNL' = G \times SNL \quad (4)$$

Note that $Cfd_{31}$, $Cfd_{32}$, and $Cfd_{33}$ respectively represent the capacity values of the floating diffusion $FD_{31, 32, and 33}$, $\alpha$ represents the sensitivity per unit time of the first photodiode $PD_1$, and $\beta$ represents the sensitivity per unit time of the second photodiode $PD_2$. Therefore, the gain G is equivalent to the product of the sensitivity ratio and the capacity ratio.

Figure 27:
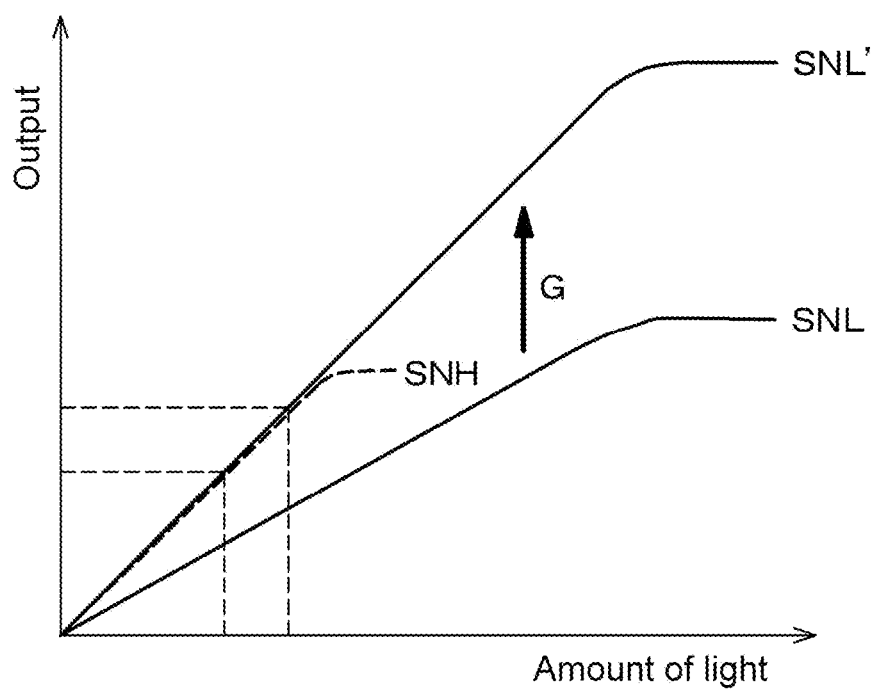
FIG. 27 is a diagram showing a relationship between a low-sensitivity difference signal SNL, a high-sensitivity difference signal SNH, and a correction low-sensitivity difference signal SNL' with respect to the amount of incident light.

In FIG. 27, the relationship between the low-sensitivity difference signal SNL, the high-sensitivity difference signal SNH, and the correction low-sensitivity difference signal SNL' with respect to the amount of incident light is shown.

Figure 28A:
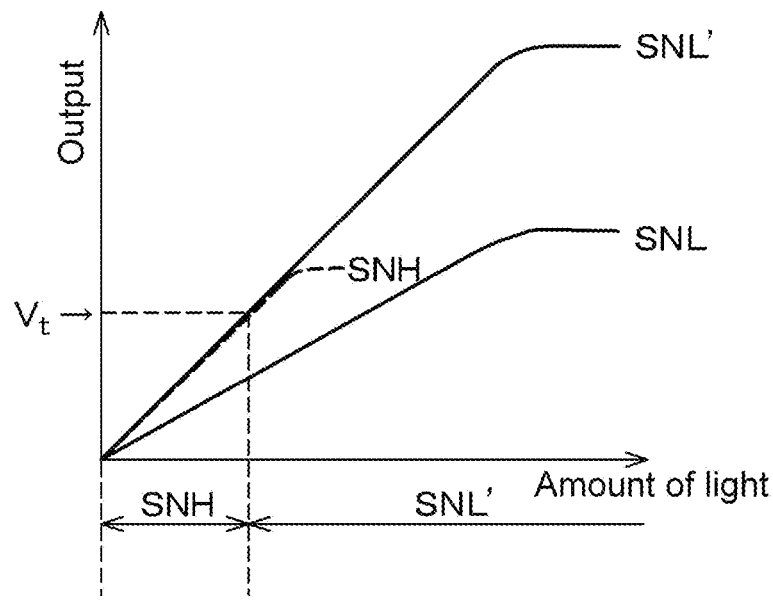
FIG. 28A is an explanatory diagram of a processing example 1 of arithmetic processing for a pixel signal.

Next, as shown in FIG. 28A, the signal processing unit 18 performs signal processing by using a predetermined threshold value $V_t$ set in advance. The predetermined threshold value $V_t$ is set in advance before the high-sensitivity difference signal SNH is saturated in the optical response characteristics and in the area in which the optical response characteristics are linear.

Then, in the case where the high-sensitivity difference signal SNH does not reach the predetermined threshold value $V_t$, the signal processing unit 18 outputs the high-sensitivity difference signal SNH as a pixel signal SN of a pixel to be processed. That is, in the case where SNH<$V_t$, the pixel signal SN=the high-sensitivity difference signal SNH.

Meanwhile, in the case where the high-sensitivity difference signal SNH is not more than the predetermined threshold value $V_t$, the signal processing unit 18 outputs the correction low-sensitivity difference signal SNL' of the low-sensitivity difference signal SNL as the pixel signal SN of the pixel to be processed. That is, in the case where $V_t$ SNH, the pixel signal SN=the correction low-sensitivity difference signal SNL'.

Processing Example 2 of Arithmetic Processing for Pixel Signal

Figure 28B:
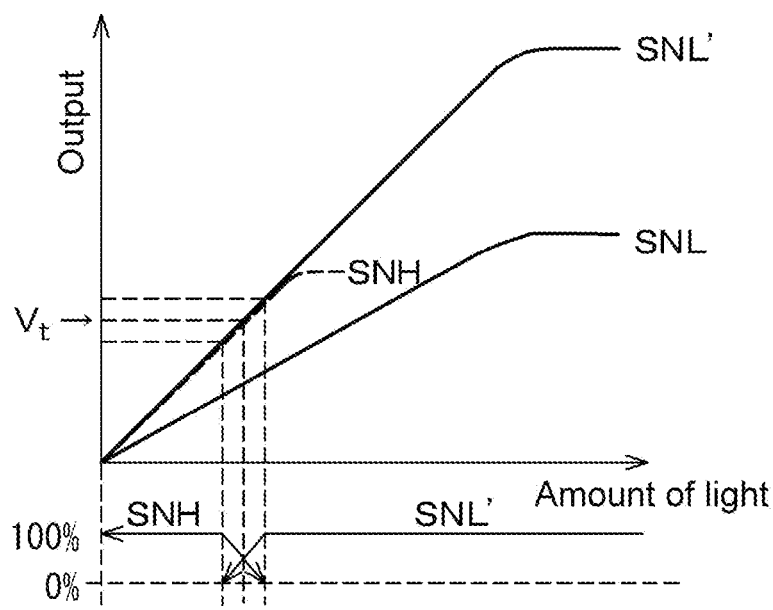
FIG. 28B is an explanatory diagram of a processing example 2 of the arithmetic processing for a pixel signal.

Next, a processing example 2 of arithmetic processing for a pixel signal will be described. In the processing example 2, as shown in FIG. 28B, in the case where the high-sensitivity difference signal SNH falls within a predetermined range, the signal processing unit 18 combines the correction low-sensitivity difference signal SNL' and the high-sensitivity difference signal SNH at a ratio set in advance, and outputs it as the pixel signal SN.

For example, the signal processing unit 18 gradually changes the combination ratio of the correction low-sensitivity difference signal SNL' and the high-sensitivity difference signal SNH as follows in the range around the predetermined threshold value $V_t$ as a reference. The predetermined threshold value $V_t$ is a value set in advance before the high-sensitivity difference signal SNH is saturated in the optical response characteristics and in the area in which the optical response characteristics are linear, as described above.

In the case where SNH<$V_t$×0.90, SN=SNH
In the case where $V_t$×0.90≤SNH<$V_t$×0.94,
 SN=0.9×SNH+0.1×SNL'
In the case where $V_t$×0.94≤SNH<$V_t$×0.98,
 SN=0.7×SNH+0.3×SNL'
In the case where $V_t$×0.98≤SNH<$V_t$×1.02,
 SN=0.5×SNH+0.5×SNL'
In the case where $V_t$×1.02≤SNH<$V_t$×1.06,
 SN=0.3×SNH+0.7×SNL'
In the case where $V_t$×1.06≤SNH<$V_t$×1.10,
 SN=0.1×SNH+0.9×SNL'
in the case where $V_t$×1.10≤SNH,
 SN=SNL'

Incidentally, in the case of using the unit pixel 20 according to the first embodiment to the fourth embodiment, since the capacity and the sensitivity at the time of reading the high-sensitivity data signal SH and the high-sensitivity reset signal NH are variable, the value of the gain G in the above-mentioned formula (1) varies depending on the value of the capacity/sensitivity.

In the signal processing unit 18, by performing the above-mentioned arithmetic processing of the processing example 1 or the processing example 2, it is possible to more smoothly switch from the signal at the time of low illuminance to the signal at the time of high illuminance.

Sixth Embodiment

Figure 29:
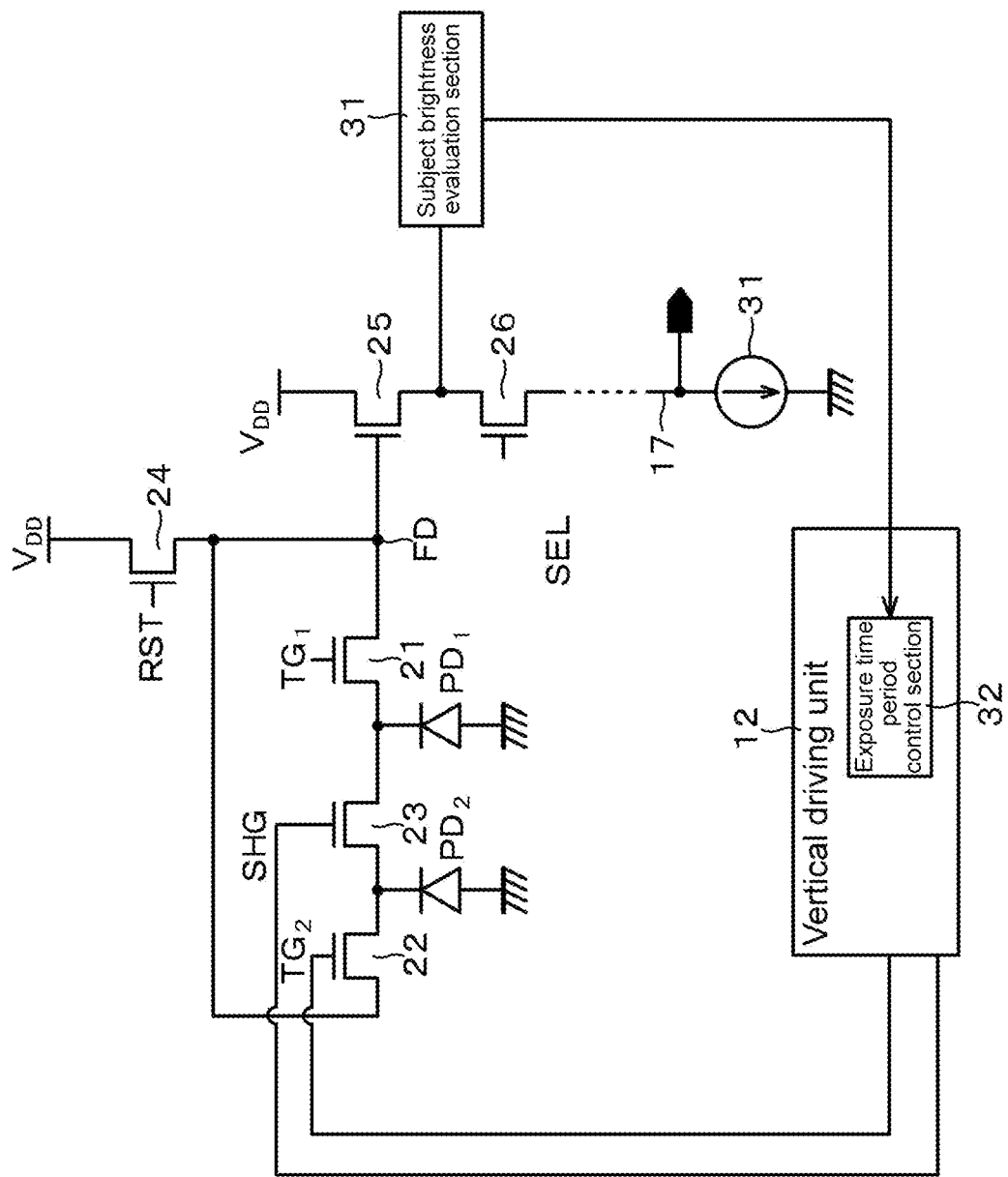
FIG. 29 is a configuration diagram showing an example of a unit pixel according to a sixth embodiment, and a control system of the unit pixel.

A sixth embodiment is an example in which the sensitivity of the photodiode is adaptively controlled depending on the subject brightness. An example of the configuration of the unit pixel 20 and the control system thereof according to the sixth embodiment is shown in FIG. 29. In FIG. 29, the unit pixel 20 according to the second embodiment shown in FIG. 11 is used as a base.

[Configuration of Control System]

As shown in FIG. 29, the control system of the unit pixel 20 according to the sixth embodiment includes a subject brightness evaluation section 31 and an exposure-timeperiod control section 32, and is configured to control the exposure time period of the second photodiode PD$_2$ on the basis of the signal level obtained from the second photodiode PD$_2$ as an intermittent driving target.

In this control system, the subject brightness evaluation section 31 evaluates the subject brightness on the basis of the level of the floating diffusion FD input to the amplification transistor 25. The exposure-time-period control section 32 is formed in, for example, the vertical driving unit 12, and controls the exposure time period on the basis of the evaluation result of the subject brightness evaluation section 31. The exposure time period is determined by the pulse widths of the transfer signal TG$_2$ and the shutter signal SHG. Therefore, the exposure-time-period control section 32 controls the pulse widths of the pulse signals of the transfer signal TG$_2$ and the shutter signal SHG as intermittent driving targets.

[Flow of Processing of Control System]

Figure 30:
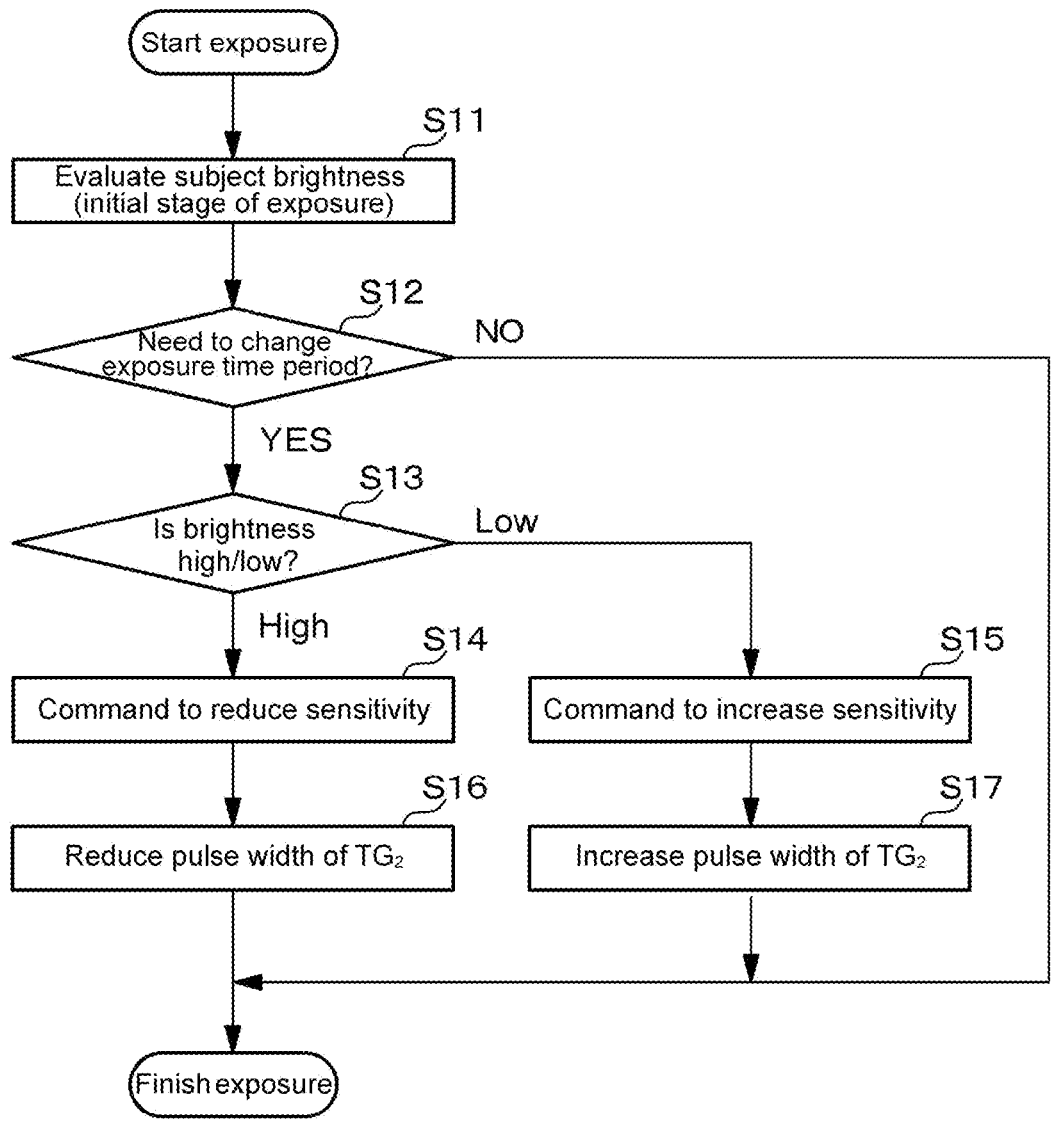
FIG. 30 is a flowchart showing flow of processing of the control system of the unit pixel according to the sixth embodiment.

Next, flow of processing of the control system of the unit pixel 20 according to the sixth embodiment will be described using a flowchart of FIG. 30.

In the case of starting exposure, the signal of the second photodiode PD$_2$ is read to the floating diffusion FD by intermittent driving by the pulse signal of the transfer signal TG$_2$. At the initial stage of this exposure period, the subject brightness evaluation section 31 evaluates the subject brightness on the basis of the signal level read to the floating diffusion FD (Step S11), and determines whether or not the exposure time period needs to be changed (Step S12).

Then, in the case where the exposure time period needs to be changed, the subject brightness evaluation section 31 determines whether the subject brightness is higher or lower than the reference (Step S13), and supplies a command to reduce the sensitivity of the second photodiode PD$_2$ to the exposure-time-period control section 32 in the case where the subject brightness is high (Step S14). Further, in the case where the subject brightness is low, the subject brightness evaluation section 31 supplies a command to increase the sensitivity of the second photodiode PD$_2$ to the exposure-time-period control section 32 (Step S15).

When receiving the command from the subject brightness evaluation section 31, the exposure-time-period control section 32 performs control to reduce the pulse width of the transfer signal TG$_2$ in the case where it is the command to reduce the sensitivity of the second photodiode PD$_2$ (Step S16). Further, the exposure-time-period control section 32 performs control to increase the pulse width of the transfer signal TG$_2$ in the case where it is the command to increase the sensitivity of the second photodiode PD$_2$ (Step S17).

Note that although the subject brightness is evaluated by two-stage evaluation of high/low in this example, the subject brightness is not limited thereto and may be evaluated by multiple-stage evaluation of three or more stages.

Figure 31:
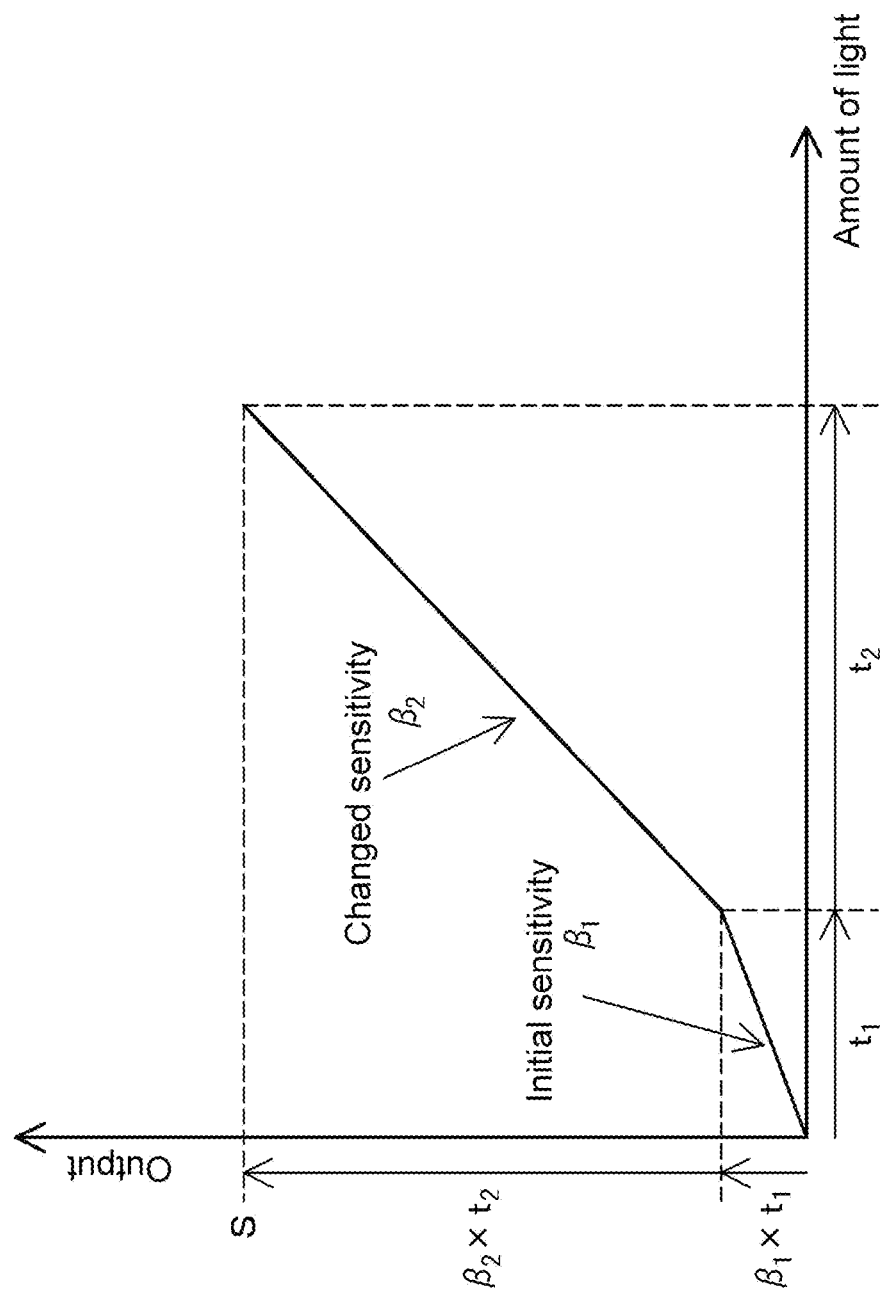
FIG. 31 is an explanatory diagram of the processing of the control system of the unit pixel according to the sixth embodiment.

By the above-mentioned series of control by the control system of the unit pixel 20 according to the sixth embodiment, it is possible to adaptively control the sensitivity of the second photodiode PD$_2$ in one exposure period depending on the subject brightness. Then, under the control by the control system, the signal obtained from the second photodiode PD$_2$ corresponds to a signal S shown in FIG. 31. Since the timing at which the pulse width of the transfer signal TG$_2$ is changed is known, the exposure time periods t$_1$, t$_2$ before and after the sensitivity change and respective sensitivities (=sensitivities determined by the pulse width) β$_1$, β$_2$ with respect to the entire exposure time period are known. Therefore, the signal S obtained in the entire exposure period can be represented by the following formula.

$$S = \beta_1 \times t_1 + \beta_2 \times t_2$$

Therefore, it is possible to convert it into a signal in the case of exposure in the entire period with an arbitrary sensitivity.

Figure 32:
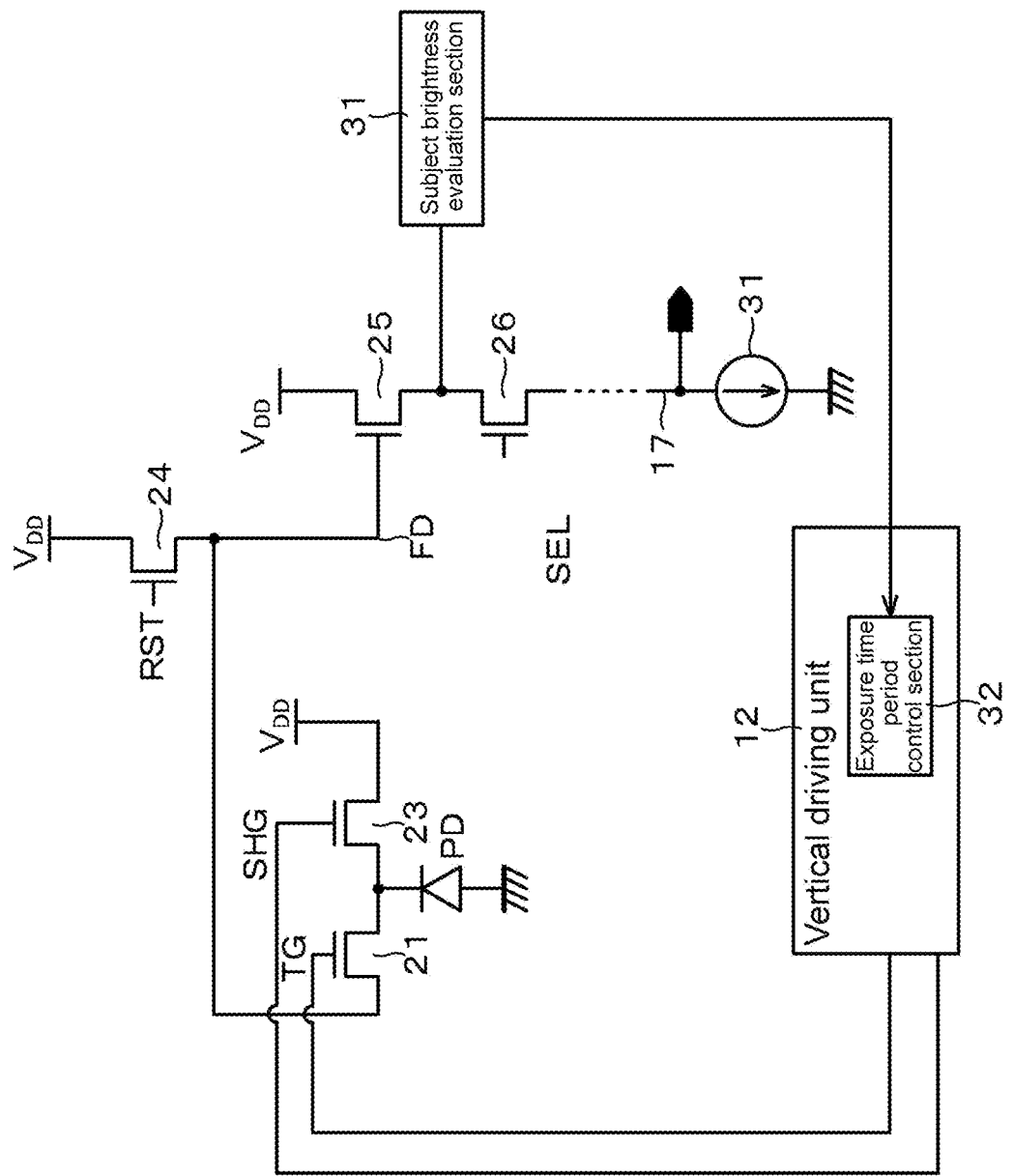
FIG. 32 is a configuration diagram showing another example of configurations of the unit pixel according to the sixth embodiment and the control system of the unit pixel

Note that although an example in which the sensitivity of the second photodiode PD$_2$ is adaptively controlled depending on the subject brightness has been described on the basis of the unit pixel 20 according to the second embodiment including the two photodiodes PD$_1$ and PD$_2$ in this embodiment, it is not limited thereto. That is, the control of the photodiode PD depending on the subject brightness can be applied also to the unit pixel 20 including one photodiode PD as shown in FIG. 32. In this case, the discharge destination of the photodiode PD is the high potential side power source V$_{DD}$ similarly to the case of the first embodiment.

Further, even in the case where there are a plurality of FD switching transistors 28 between the transfer transistor 22 on the side of the second photodiode PD$_2$ and the floating diffusion FD as in the case of the third embodiment, the fourth embodiment, and the fifth embodiment, this embodiment can be applied similarly by making the DF switching transistors 28 conductive in the exposure period.

<Operations and Effects of First Embodiment to Sixth Embodiment>

With the CMOS image sensor 10 (10A, 10B) including the unit pixel 20 according to the first embodiment to the sixth embodiment described above, the following operations and effects can be obtained. That is, since the sensitivity ratio of the first photodiode PD$_1$ and the second photodiode PD$_2$ can be arbitrarily controlled by intermittent driving with respect to storing of signal charges of the second photodiode PD$_2$, it is possible to freely change the dynamic range as compared with the case where the sensitivity difference is physically provided.

Further, in the CMOS image sensor 10 (10A, 10B), it is possible to increase the level at which the low-sensitivity data signal SL is saturated by adding the capacitive element C$_{ap}$ to the second photodiode PD$_2$ having a low sensitivity. Accordingly, it is possible to increase the maximum value of the dynamic range while maintaining the minimum value of the dynamic range, and expand the dynamic range.

For example, in an in-vehicle image sensor, a phenomenon called LED flicker in which a subject that blinks such as an LED light source cannot be imaged depending on the timing of blinking occurs in some cases. This LED flicker occurs because the dynamic range of the existing solid-state image pickup device is low and the exposure time period needs to be adjusted for each subject, for example.

That is, the existing solid-state image pickup device increases the exposure time period for a subject having a low illuminance and reduces the exposure time period for a subject having a high illuminance, in order to support subjects having various illuminances. Accordingly, it is possible to support subjects having various illuminances even in a low dynamic range. Meanwhile, since the reading speed is constant irrespective of the exposure time, in the case of setting the exposure time period in units shorter than the reading time, the light that enters photoelectric conversion section in the time other than the exposure time is photoelectrically converted to charges but discarded without being read.

Meanwhile, since the dynamic range can be expanded and the exposure time period can be set to be long in the CMOS image sensor 10 (10A, 10B) as described above, it is possible to prevent LED flicker from occurring. Further, in the CMOS image sensor 10 (10A, 10B), it is possible to prevent occurrence of artifacts and reduction in the resolution in the case of increasing the number of division by a time division method or a spatial division method.

<Modified Examples of First Embodiment to Sixth Embodiment>

Although an example in which two photoelectric conversion sections (the first photodiode $PD_1$ and the second photodiode $PD_2$) having different sensitivities are provided in one pixel is shown in the first embodiment to the sixth embodiment, it may be possible to provide three or more photoelectric conversion sections in one pixel. In this case, it only needs to provide a charge storing unit at least in the photoelectric conversion section having the lowest sensitivity without providing a charge storing unit in the photoelectric conversion section having the highest sensitivity. Further, as long as this condition is satisfied, it is possible to provide two or more photoelectric conversion sections having the same sensitivity.

Although a case where the technology of the present disclosure is applied to the CMOS image sensor in which the unit pixels 20 are arranged in a matrix form has been described as an example in the above-mentioned embodiments, the technology of the present disclosure is not limited to application to the CMOS image sensor. That is, the technology of the present disclosure is applicable to all X-Y address type solid-state image pickup devices in which the unit pixels 20 are two-dimensionally arranged in a matrix form.

Further, the technology of the present disclosure is applicable to all solid-state image pickup devices having a structure in which an in-pixel memory such as a pn junction capacitance and an MIS capacitance is provided between the transfer transistor 22 and the amplification transistor 25 and the charges transferred from the second photodiode $PD_2$ via the transfer transistor 22 are stored in the in-pixel memory.

Further, the technology of the present disclosure is applicable also to any of pixel structures of a front-surface irradiation type structure and a rear-surface irradiation type structure. Note that assuming that a substrate surface on which a wiring layer is formed is a front surface in a semiconductor substrate on which the unit pixel 20 is formed, the pixel structure in which incident light is applied from the surface side is front-surface irradiation type, and the pixel structure in which incident light is applied from the surface side is rear-surface irradiation type.

Further, the technology of the present disclosure is not limited to application to a solid-state image pickup device that detects distribution of the amount of incident light of visible light and images the distribution as an image, and is applicable to all solid-state image pickup devices that images distribution of the incident amount of infrared rays, X-rays, particles, or the like, as an image.

<Electronic Apparatus According to Present Disclosure>

The above-mentioned solid-state image pickup device according to the first embodiment to the sixth embodiment can be used as an imaging unit (image capturing unit) of all electronic apparatuses such as an imaging apparatus such as a digital still camera and a video camera, a portable terminal apparatus having a imaging function such as a mobile phone, and a copier using a solid-state image pickup device as an image reading unit. Note that the solid-state image pickup device may be formed in a form of a one chip, or in a module-like form having an imaging function in which an imaging unit and a signal processing unit or an optical system are collectively packaged. The above-mentioned module-like form mounted on an electronic apparatus, i.e., a camera module may be the imaging apparatus.

[Imaging Apparatus]

Figure 33:
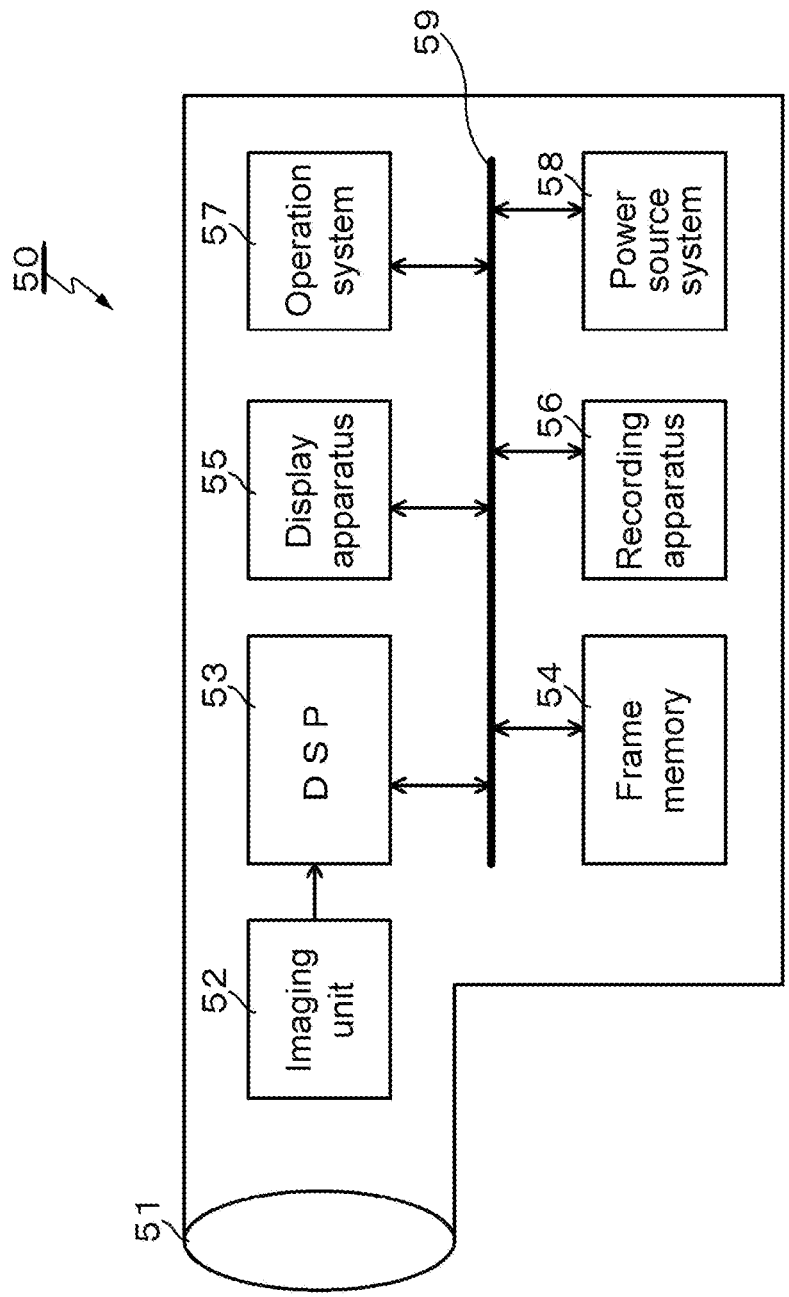
FIG. 33 is a block diagram showing a configuration of an imaging apparatus as an example of an electronic apparatus according to the present disclosure.

FIG. 33 is a block diagram showing a configuration of an imaging apparatus as an example of an electronic apparatus according to the present disclosure. As shown in FIG. 33, an imaging apparatus 50 according to this example includes an optical system 51 including a lens group and the like, an imaging unit 52, a DSP circuit 53, a frame memory 54, a display apparatus 55, a recording apparatus 56, an operation system 57, a power source system 58, and the like. Then, the DSP circuit 53, the frame memory 54, the display apparatus 55, the recording apparatus 56, the operation system 57, and the power source system 58 are connected to each other via a bus line 59.

The optical system 51 captures incident light (image light) from a subject and forms an image on the imaging surface of the imaging unit 52. The imaging unit 52 converts the mount of incident light imaged on the imaging surface by the optical system 51 into an electric signal in units of pixels, and outputs the electric signal as a pixel signal. The DSP circuit 53 performs general camera signal processing, e.g., white balance processing, demosaic processing, and gamma correction processing.

The frame memory 54 is appropriately used for storing data in the process of signal processing in the DSP circuit 53. The display apparatus 55 includes a panel-type display apparatus such as a liquid crystal display apparatus and an organic EL (electro luminescence) display apparatus, and displays a moving image or a still image captured by the imaging unit 52. The recording apparatus 56 stores the moving image or the still image captured by the imaging unit 52 in a recording medium such as a portable semiconductor memory, an optical disc, and an HDD (Hard Disk Drive).

Under the operation by a user, the operation system 57 issues an operation command for various functions of the imaging apparatus 50. The power source system 58 appropriately supplies various kinds of power sources as operation power sources for the DSP circuit 53, the frame memory 54, the display apparatus 55, the recording apparatus 56, and the operation system 57 to these supply targets.

Such an imaging apparatus 50 is applied to a video camera, a digital still camera, and a camera module for a mobile apparatus such as a smartphone and a mobile phone. Then, in this imaging apparatus 50, the above-mentioned solid-state image pickup device including the unit pixel according to the first embodiment to the sixth embodiment can be used as the imaging unit 52. The solid-state image pickup device including the unit pixel according to the first embodiment to the sixth embodiment is capable of expanding the dynamic range by intermittent driving with respect to storing of signal charges. Accordingly, it is possible to improve the image quality of the imaging apparatus 50.

Seventh Embodiment

Figure 34:
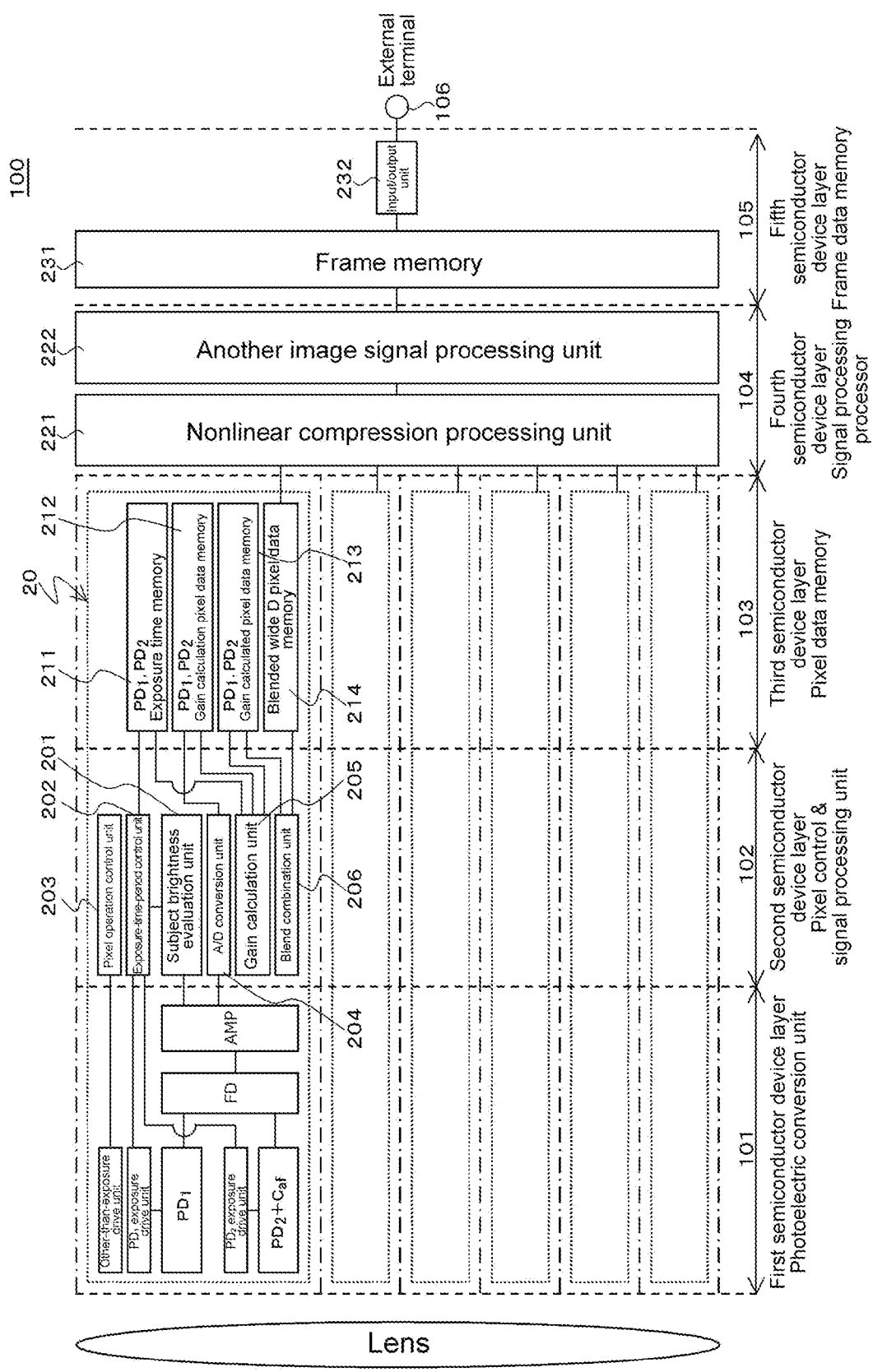
FIG. 34 is a system configuration diagram schematically showing a system configuration of a CMOS image sensor according to a seventh embodiment.

A seventh embodiment is an example of a solid-state image pickup device, e.g., CMOS image sensor, using the technology according to the first embodiment to the sixth embodiment, i.e., technology of performing intermittent driving with respect to storing of signal charges of a photoelectric conversion section. FIG. 34 is a system configuration diagram of a CMOS image sensor according to the seventh embodiment.

[System Configuration]

As shown in FIG. 34, the CMOS image sensor 100 according to the seventh embodiment has a structure in which, for example, five semiconductor device layers (so-called silicon dies) in which semiconductor devices are formed are laminated and signal lines are connected thereto.

Note that in the following description, the side of the incident surface of light to the CMOS image sensor 100 is described as "upper side" and the side opposed to the incident surface is described as "lower side" for convenience.

A first semiconductor device layer 101 is placed on the side (incident side of light to the CMOS image sensor 100, upper side) closest to a lens (corresponding to the lens of the optical system 101 in FIG. 33). On the lower side of the first semiconductor device layer 101, a second semiconductor device layer 102 is placed. On the lower side of the second semiconductor device layer 102, a third semiconductor device layer 103 is placed. On the lower side of the third semiconductor device layer 103, a fourth semiconductor device layer 104 is placed. On the lower side of the fourth semiconductor device layer 104, a fifth semiconductor device layer 105 is placed. On the lower side of the fifth semiconductor device layer 105, an external terminal 106 of the CMOS image sensor 100 is placed.

In FIG. 34, a part surrounded by dotted lines represents one unit pixel 20. The one unit pixel 20 is formed across the first, second, and third semiconductor device layers 101, 102, and 103. The unit pixels 20 each formed across the first, second, and third semiconductor device layers 101, 102, and 103 are arranged in a two-dimensional array of a column direction and a row direction on the surface in parallel with the front surface of each semiconductor device layer. Note that in FIG. 34, only the outline of the internal configuration of the unit pixel 20 is described.

[Internal Configuration of Unit Pixel]

Figure 35:
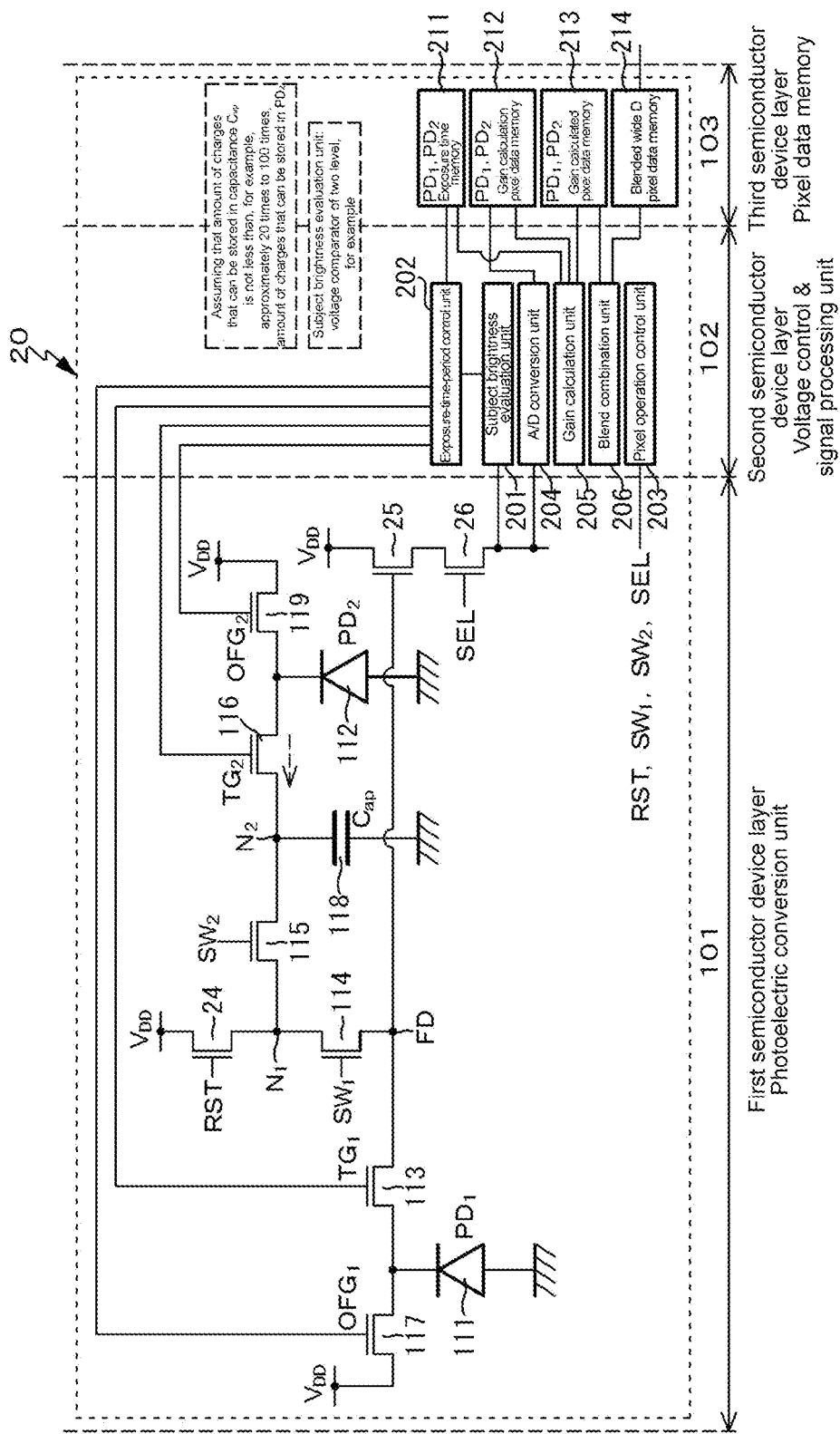
FIG. 35 is an internal configuration diagram of a unit pixel in the CMOS image sensor according to the seventh embodiment.

An example of the internal configuration of the unit pixel 20 in the CMOS image sensor 100 according to the seventh embodiment is shown in FIG. 35. FIG. 35 shows the internal configuration of one unit pixel 20 shown in FIG. 34. The unit pixel 20 includes a part formed in the first semiconductor device layer 101, a part formed in the second semiconductor device layer 102, and a part formed in the third semiconductor device layer 103. The internal configuration of the unit pixel 20 will be specifically described with reference to FIG. 35.

The first semiconductor device layer 101 included in the unit pixel 20 includes a photoelectric conversion section and a transistor (so-called pixel transistor) that drives the photoelectric conversion section. These are referred to as the photoelectric conversion unit. The photoelectric conversion unit includes the following devices. That is, the photoelectric conversion unit includes a first photoelectric conversion section 111, a second photoelectric conversion section 112, a first transfer gate unit 113, a second transfer gate unit 114, a fifth transfer gate unit 115, and a fourth transfer gate unit 116. The first photoelectric conversion section 111 includes the first photodiode $PD_1$, and the second photoelectric conversion section 112 includes the second photodiode $PD_2$.

In the correspondence relationship with the unit pixel 20 according to the fifth embodiment, the first transfer gate unit 113 corresponds to the transfer transistor 21, the second transfer gate unit 114 corresponds to the FD switching transistor $28_1$, the fifth transfer gate unit 115 corresponds to the FD switching transistor $28_2$, and the fourth transfer gate unit 116 corresponds to the transfer transistor 22. Then, the transfer signal $TG_1$ is applied to a gate electrode of the first transfer gate unit 113, the switch signal $SW_1$ is applied to a gate electrode of the second transfer gate unit 114, the switch signal $SW_2$ is applied to a gate electrode of the fifth transfer gate unit 115, and the transfer signal $TG_2$ is applied to a gate electrode of the fourth transfer gate unit 116.

The first photoelectric conversion section 111 has a larger light-receiving area of the photodiode than the second photoelectric conversion section 112. Therefore, in the case where the first photoelectric conversion section 111 and the second photoelectric conversion section 112 perform photoelectric conversion for the same time period, many signal charges are generated in the first photoelectric conversion section 111 than the second photoelectric conversion section 112. Since the first photoelectric conversion section 111 can obtain more signal charges than the second photoelectric conversion section 112, the first photoelectric conversion section 111 includes a photoelectric conversion section having a sensitivity relatively higher than that of the second photoelectric conversion section 112, and the second photoelectric conversion section 112 includes a photoelectric conversion section having a sensitivity relatively lower than that in the first photoelectric conversion section 111.

To the first photoelectric conversion section 111, the first transfer gate unit 113 is connected. Further, to the first photoelectric conversion section 111, a first discharge gate unit 117 is connected. An overflow drain (e.g., power source $V_{DD}$) is connected to the end of the first discharge gate unit 117. The first discharge gate unit 117 is driven by a drive signal $OFG_1$ that is applied to a gate electrode of the first discharge gate unit 117, thereby discharging signal charges of the first photodiode $PD_1$ included in the first photoelectric conversion section 111 to the overflow drain. Also the unit pixel 20 according to the first embodiment to the sixth embodiment can have a configuration including a charge discharging unit corresponding to the first discharge gate unit 117 that discharges signal charges of the first photodiode $PD_1$ to the overflow drain.

The first transfer gate unit 113 and the second transfer gate unit 114 are connected via a floating diffusion (so-called floating diffusion layer) FD. The second transfer gate unit 114 and the fifth transfer gate unit 115 are connected via a first node $N_1$. To the first node $N_1$, the reset transistor (reset gate unit) 24 is connected in addition to the second transfer gate unit 114 and the fifth transfer gate unit 115. To the end of the reset transistor 24, a specific potential line (e.g., power source $V_{DD}$) is connected. The connection relationship between the reset transistor 24, the amplification transistor 25, and the selection transistor 26 is the same as that of the unit pixel 20 according to the first embodiment.

The fifth transfer gate unit 115 and the fourth transfer gate unit 116 are connected via a second node $N_2$. To the second node $N_2$, a charge storing unit 118 is connected in addition to the fifth transfer gate unit 115 and the fourth transfer gate unit 116. The second transfer gate unit 114 and the fifth transfer gate unit 115 couple the potentials of the charge storing unit 118 and the floating diffusion FD. To the second photoelectric conversion section 112, the fourth transfer gate unit 116 is connected. Further, to the second photoelectric conversion section 103, a second discharge gate unit 119 is connected. To the end of the second discharge gate unit 119, an overflow drain (e.g., power source $V_{DD}$) is connected. The second discharge gate unit 119 is driven by a drive signal $OFG_2$ that is applied to a gate electrode of the second discharge gate unit 119.

In the correspondence relationship with the unit pixel 20 according to the fifth embodiment, the second discharge gate unit 119 corresponds to the shutter transistor 23, the charge storing unit 118 corresponds to the capacitive element $C_{ap}$, and the drive signal $OFG_2$ of the second discharge gate unit 119 corresponds to the shutter signal SHG. Further, the floating diffusion FD corresponds to the floating diffusion $FD_{31}$, the first node $N_1$ corresponds to the floating diffusion $FD_{32}$, the second node $N_2$ corresponds to the floating diffusion $FD_{33}$, and the charge storing unit 118 corresponds to the capacitive element $C_{ap}$.

A channel area on the lower portion of the gate electrode of the fourth transfer gate unit 116 has a potential in a slightly positive direction (in other words, the potential is slightly deeper). Accordingly, an overflow path of charges is formed. In the case where charges whose amount exceeds the amount of saturated charge the second photoelectric conversion section 112 are generated as a result of photoelectric conversion in the second photoelectric conversion section 112, charges whose amount exceeds the amount of saturated charge overflow (overflow) from the second photoelectric conversion section 112 to the charge storing unit 118 via the above-mentioned overflow path. The overflowed charges are stored in the charge storing unit 118. Note that the overflow path formed in the channel area on the lower portion of the gate electrode of the fourth transfer gate unit 116 will be referred to simply as overflow pass of the fourth transfer gate unit 116, hereinafter.

The potential of the overflow pass of the fourth transfer gate unit 116 is in a slightly positive direction (in other words the potential is slightly deeper) than the potential of the overflow path of the second discharge gate unit 119. Therefore, in the case where the same gate voltage (e.g., 0 V) is applied to the fourth transfer gate unit 116 and the second discharge gate unit 119, the charges overflowed from the second photoelectric conversion section 112 overflows to the charge storing unit 118 via the overflow pass of the fourth transfer gate unit 116.

Meanwhile, in the case where a negative bias is applied to the gate of the fourth transfer gate unit 116, the overflow pass of the fourth transfer gate unit 116 is closed. Therefore, in the case where a negative bias is applied to the fourth transfer gate unit 116 and 0 V is applied to the second discharge gate unit 119, the charges overflowed from the second photoelectric conversion section 112 are discharged to the overflow drain (e.g., power source $V_{DD}$) via the overflow path of the second discharge gate unit 119.

As the charge storing unit 118, for example, a MIS capacitor or a MOS capacitor can be used. In the case where a MIS capacitor or a MOS capacitor is used as the charge storing unit 118, a first electrode of two electrodes of the charge storing unit 118 is a node electrode connected to the second node $N_2$. A second electrode of the charge storing unit 118 is a grounded electrode that is grounded. Note that the second electrode may be connected to a specific potential other than the ground potential, e.g., a power source potential, as a modified example of the embodiment.

Further, in the case where a MIS capacitor or a MOS is used as the charge storing unit 118, as an example, the second electrode is an impurity area formed on a semiconductor substrate such as a silicon substrate, and a dielectric film forming a capacitance is an oxide film or a nitride film formed on the semiconductor substrate. Further, the first electrode is an electrode formed of a material having conductivity, e.g., polysilicon and metal, on the second electrode and the dielectric form.

Further, in the case where a MIS capacitor or a MOS capacitor is used as the charge storing unit 118, the second electrode is, for example, an impurity area formed on the semiconductor substrate on which the first photoelectric conversion section 111 or the second photoelectric conversion section 112 is formed. In the case where the second electrode is a ground potential, the second electrode is a p-type impurity area electrically connected to a p-type impurity area included in the photodiode of the first photoelectric conversion section 111 or the second photoelectric conversion section 112. In the case where the second electrode is a specific potential other than the ground potential, the second electrode may be an n-type impurity area formed in a p-type impurity area.

In order to make the capacitance per unit area of the charge storing unit 118 larger than the capacitance per unit area of the charge storing units included in the first photodiode $PD_1$ and the second photodiode $PD_2$, it is favorable to form an impurity area as the second electrode on the front surface of the semiconductor substrate rather than inside the semiconductor substrate in the depth direction. Further, in order to make the capacitance per unit area of the charge storing unit 118 larger than the capacitance per unit area of charge storing units included in the first photodiode $PD_1$ and the second photodiode $PD_2$, it is favorable that the impurity concentration of the impurity area as the second electrode is high.

Since the front surface of the semiconductor substrate has more crystal defects or interface states than the inside of the semiconductors substrate in the depth direction in some cases, in the case of using an impurity area formed on the front surface of the semiconductor substrate as the second electrode of the charge storing unit 118, the charge storing units may have noise more than the charge storing units included in the first photodiode $PD_1$ and the second photodiode $PD_2$ that store charges in the semiconductors substrate in the depth direction. Instead, by using an impurity area formed on the surface of the semiconductor substrate as the second electrode of the charge storing unit 118, it is possible to obtain a capacitance (capacitor) having a larger capacitance value per unit area than the charge storing units included in the first photodiode $PD_1$ and the second photodiode $PD_2$ that store charges in the semiconductors substrate in the depth direction.

The unit pixel 20 is characterized by including a charge storing unit in which the amount of charges that can be stored is not less than twice, more specifically, approximately 100 times, for example, the amount of charges that can be stored in the second photoelectric conversion section 112, as the charge storing unit 118. That is, the unit pixel 20 is configured to store most of the charges generated in the second photoelectric conversion section 112 in the charge storing unit 118. Further, the amount of charges that can be stored in the charge storing unit 118 may be not less than twice, more specifically, approximately 100 times, for example, the amount of charges that can be stored in the floating diffusion FD.

In FIG. 34, the second semiconductor device layer 102 included in the unit pixel 20 includes a pixel control unit that performs operation control of the photoelectric conversion unit having the above-mentioned configuration and a pixel signal processing unit that performs signal processing on the signal generated as a result of the photoelectric conversion operation in the photoelectric conversion unit. The pixel control unit includes the following subunits. That is, the pixel control unit includes a subject brightness evaluation unit 201, an exposure-time-period control unit 202, and a pixel operation control unit 203. The pixel signal processing unit includes the following subunits. That is, the pixel signal processing unit includes an A/D (analog/digital) conversion unit 204, a gain calculation unit 205, and a blend combination unit 206.

The subject brightness evaluation unit 201 is means for evaluating the amount of overflowed charges from the second photoelectric conversion section 112 to the charge storing unit 118 via the overflow path, at a certain point in the exposure period. More specifically, when an overflow occurs in the second photoelectric conversion section 112, the voltage of the floating diffusion FD is changed by the overflowed charges. The subject brightness evaluation unit 201 evaluates the amount of overflowed charges by evaluating the voltage of the floating diffusion FD.

Figure 36A:
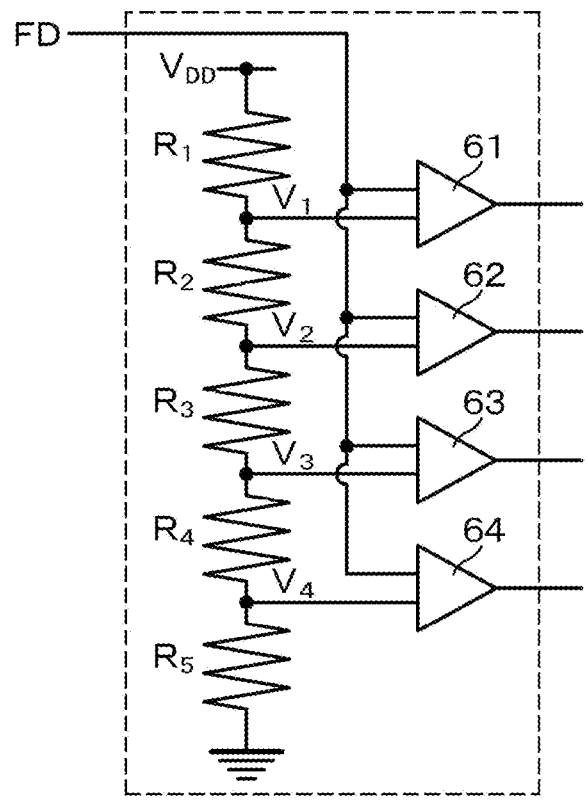
FIG. 36A is a diagram showing a configuration example of a subject brightness evaluation unit using four levels of reference voltage.

The subject brightness evaluation unit 201 may be a voltage comparator that compares the reference voltage of two levels or four levels and the magnitude of the voltage of the floating diffusion FD, for example. For example, five resistances $R_1$ to $R_5$ may be arranged between the power source $V_{DD}$ and the ground in series as shown in FIG. 36A, and four kinds of voltage $V_1$ to $V_4$ generated by the resistance division may be used as the reference voltage of four level. As described above, in order to compare the magnitude of the voltage of the floating diffusion FD and the reference voltage of four levels $V_1$ to $V_4$, only the four kinds of reference voltage $V_1$ to $V_4$ and four voltage comparators 61 to 64 are necessary. In FIG. 36A, by changing the magnitude of the power source $V_{DD}$ or the resistances $R_1$ to $R_5$, it is possible to set the reference voltage of four levels $V_1$ to $V_4$ to the arbitrary magnitude.

Figure 36B:
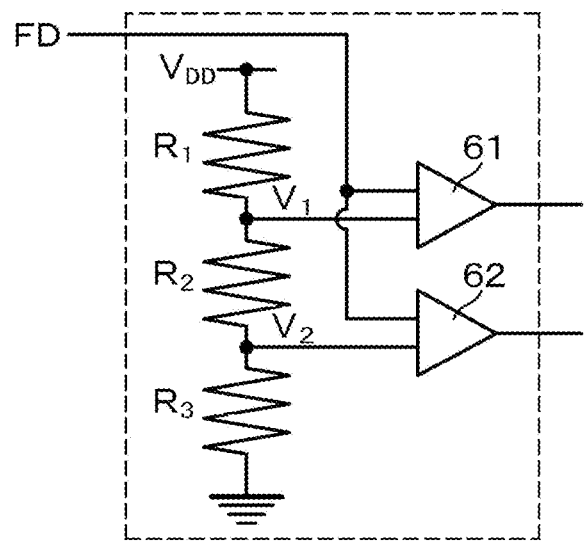
FIG. 36B is a diagram showing a configuration example of a subject brightness evaluation unit using two levels of reference voltage.

For example, three resistances $R_1$ to $R_3$ are arranged between the power source $V_{DD}$ and the ground in series as shown in FIG. 36B, and kinds of voltage $V_1$ and $V_2$ generated by the resistance division may be used as the reference voltage of two levels. As described above, in order to compare the magnitude of the voltage of the floating diffusion FD and the reference voltage of two levels $V_1$ and $V_2$, only the two kinds of reference voltage $V_1$ and $V_2$ and two voltage comparators 61 and 62 are necessary. In FIG. 36B, by changing the magnitude of the power source $V_{DD}$ or the resistances $R_1$ to $R_3$, it is possible to set the reference voltage of two levels $V_1$ and $V_2$ to the arbitrary magnitude.

The exposure-time-period control unit 202 determines, on the basis of the above-mentioned evaluation result of the amount of charges overflowed to the charge storing unit 118 at a certain point in the exposure period, the length of the exposure period from the time when the above-mentioned evaluation is performed in the exposure period. Then, the exposure-time-period control unit 202 controls the transfer signal $TG_2$ and the drive signal $OFG_2$ responsible for starting and stopping the exposure period of the second photoelectric conversion section 112, and the transfer signal $TG_1$ and the drive signal $OFG_1$ responsible for starting and stopping the exposure period of the first photoelectric conversion section 111.

The pixel operation control unit 203 the reset signal RST of the reset transistor 24, the switch signal $SW_1$ of the second transfer gate unit 114, the switch signal $SW_2$ of the fifth transfer gate unit 115, and the selection signal SEL of the selection transistor 26 included in the photoelectric conversion unit.

The A/D conversion unit 204 performs A/D conversion on signal charges that are generated in the second photoelectric conversion section 112 as a result of the exposure operation by the unit pixel 20 and stored in the second photoelectric conversion section 112 and the charge storing unit 118, and signal charges that generated in the first photoelectric conversion section 111 as a result of the exposure operation by the unit pixel 20 and stored in the first photoelectric conversion section 111.

In order to linearly couple the following output characteristic (1) and the output characteristic (2), the gain calculation unit 205 performs signal processing of multiplying the A/D conversion result by a gain on the basis of the A/D conversion result of signal charges and information on the exposure time period for obtaining this.

(1) Output characteristic of the digital value obtained as a result of A/D conversion of signal charges generated in the first photoelectric conversion section with respect to the brightness of a subject (2) Output characteristic of the digital value obtained as a result of A/D conversion of signal charges generated in the second photoelectric conversion section with respect to the brightness of a subject The bit width of image data received by an image display apparatus or an image printing apparatus that is currently on the market is generally 8 bits. The bit width of pixel data linear with respect to the brightness of a subject, which is obtained by multiplying the above-mentioned gain, is larger than the bit width received by the image display apparatus or the image printing apparatus, and is 14 bits or 16 bits, for example. This bit width is nonlinearly compressed to the bit width of image data received by the image display apparatus or the image printing apparatus in a nonlinear compression processing unit to be descried later after performing blend combination to be described later. In the case of nonlinearly compressing the linear pixel data, it may be nonlinearly compressed according to the nonlinear characteristics of human visibility with respect to the subject brightness, for example.

The blend combination unit 206 performs signal processing of blending the output data from the first photoelectric conversion section 111 and the output data from the second photoelectric conversion section 112, which are multiplied by a gain by the gain calculation unit 205. This blending processing may be, for example, well-known α blending processing.

The third semiconductor device layer 103 included in the unit pixel 20 is a pixel data memory. This pixel data memory includes a pixel data memory for writing/reading data of each pixel between the pixel data memory and the above-mentioned pixel control unit, and a pixel data memory for writing/reading data of each pixel between the pixel data memory and the above-mentioned pixel signal processing unit. More specifically, the pixel data memory of the third semiconductor device layer 103 includes an exposure time memory 211, a gain calculation pixel data memory 212, a gain calculated pixel data memory 213, and a blended wide D pixel data memory 214.

The exposure time memory 211 is a memory that writes/reads an exposure time period of the first photoelectric conversion section 111 and the second photoelectric conversion section 112 of each pixel, which is determined as a result of control in the exposure-time-period control unit. The gain calculation pixel data memory 212 is a memory that writes/reads the A/D conversion result of the output of the first photoelectric conversion section 111 and the second photoelectric conversion section 112 of each pixel subjected to A/D conversion by the A/D conversion unit 204. The gain calculated pixel data memory 213 is a memory that writes/reads the output of the first photoelectric conversion section 111 and the second photoelectric conversion section 112 of each pixel after performing the gain multiplication by the gain calculation unit 205. The blended wide D pixel data memory 214 is a memory that writes/reads data after performing blending processing on the output of the first photoelectric conversion section 111 and the second photoelectric conversion section 112 of each pixel by the blend combination unit 206.

The output obtained as a result of the imaging operation by the unit pixel 20 is written to the blended wide D pixel data memory 214, and read by the fourth semiconductor device layer 104 shown in FIG. 34.

Return to description of the system configuration relating to the CMOS image sensor 100 according to the seventh embodiment with reference to FIG. 34. In the first, second, and third semiconductor device layers 101, 102, and 103 included in the CMOS image sensor 100, the unit pixels 20 formed across these three layers are arranged in a two-dimensional array of a column direction and a row direction on the surface in parallel with the front surface of each semiconductor device layer, thereby constituting a pixel array unit (corresponding to the pixel array unit 11 in FIG. 1).

Meanwhile, the fourth semiconductor device layer 104 included in the CMOS image sensor 100 includes a signal processing processor (or signal processing circuit) that performs frame signal processing for creating one image by integrating output results from a plurality of pixels 20 included in the above-mentioned pixel array unit The signal processing processor (or signal processing circuit) includes a nonlinear compression processing unit 221 and an image signal processing unit 222 as subunits. The nonlinear compression processing unit 221 performs processing of nonlinearly compressing the bit width of image data. The image signal processing unit 222 performs image signal processing other than nonlinear compression, e.g., noise reduction, contour emphasis, and encoding processing for compressing the amount of data of output image data.

The fifth semiconductor device layer 105 included in the CMOS image sensor 100 includes a frame memory 231 for the above-mentioned signal processing processor (or signal processing circuit) to store image data used in frame signal processing and output image data created as a result of the frame signal processing. The fifth semiconductor device layer 105 further includes an input/output unit 232 that connects the CMOS image sensor 100 to the outside of the apparatus via the external terminal 106.

[Three-Dimensional Configuration of System]

Figure 37:
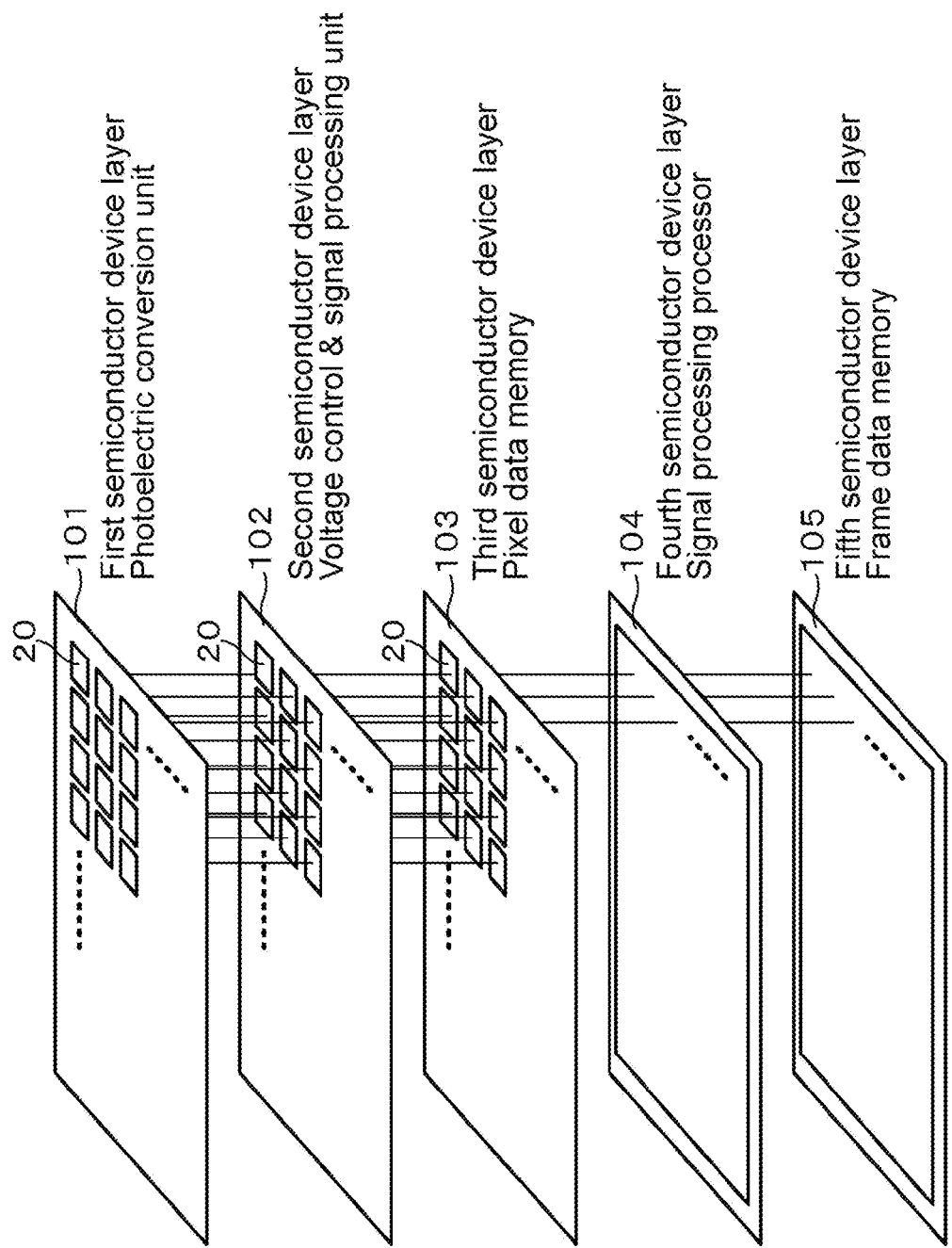
FIG. 37 is a schematic perspective view showing a three-dimensional configuration of a system of the CMOS image sensor according to the seventh embodiment.

Next, the three-dimensional configuration of the system of the CMOS image sensor 100 according to the seventh embodiment will be described using FIG. 37. FIG. 37 is a schematic perspective view showing the three-dimensional configuration of the system of the CMOS image sensor 100 according to the seventh embodiment.

The three-dimensional configuration of the system of the CMOS image sensor 100 according to the seventh embodiment is characterized by (1) the unit pixels 20 are formed across the three layers of the first, second, and third semiconductor device layers 101, 102, and 103, and a plurality of pixels 20 are arranged in a two-dimensional array in the three layers, (2) the fourth semiconductor device layer 104 includes a signal processing processor (or signal processing circuit) that performs frame signal processing, and (3) the fifth semiconductor device layer 105 includes the frame memory 231. In FIG. 37, the first semiconductor device layer 101, the second semiconductor device layer 102, the third semiconductor device layer 103, the fourth semiconductor device layer 104, and the fifth semiconductor device layer 105 are three-dimensionally shown.

[Planar Layout of Unit Pixel]

Figure 38:
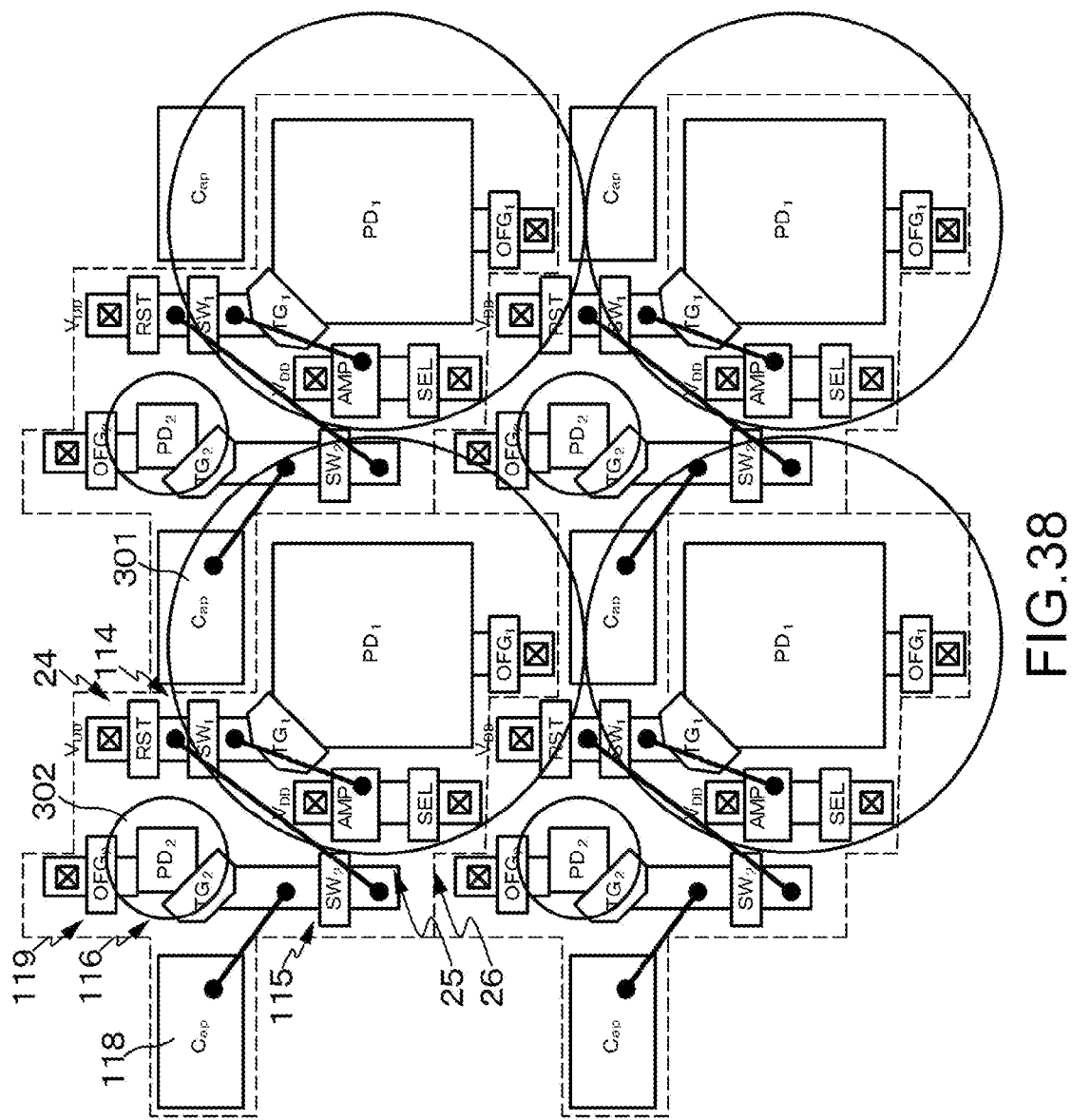
FIG. 38 is a layout diagram showing a planar layout of a photoelectric conversion section and a pixel transistor in a first semiconductor device layer of the CMOS image sensor according to the seventh embodiment.

Next, a planar layout of the unit pixel 20 in the CMOS image sensor 100 according to the seventh embodiment will be described using FIG. 38. FIG. 38 is a layout diagram showing the planar layout of a photoelectric conversion section and a pixel transistor in the first semiconductor device layer 101 in the CMOS image sensor 100 according to the seventh embodiment. In the figure, the planar layout of the four unit pixels 20 is shown. In FIG. 38, dashed lines show the border line between the unit pixels 20.

A large circle placed around the first photodiode $PD_1$ included in the first photoelectric conversion section 111 is a line representing the outer shape of a first on-chip lens 301 placed on the light incident surface of the CMOS image sensor 100. A small circle placed around the second photodiode $PD_2$ included in the second photoelectric conversion section 112 is a line representing the outer shape of a second on-chip lens 302 placed on the light incident surface of the CMOS image sensor 100. The first on-chip lens 301 and the second on-chip lens 302 collect the incident light and cause the collected light to enter the first photodiode $PD_1$ and the second photodiode $PD_2$, respectively.

Since the constituent elements other than the first on-chip lens 301 and the second on-chip lens 302 has already been described in detail in the description with reference to FIG. 35, the description thereof will be omitted here.

[Subject-to-Brightness Evaluation at Certain Point in One Exposure Period]

Next, subject-to-brightness evaluation at a certain point in one exposure period at the time of capturing an image with a wide dynamic range by providing a mechanism for adjusting the exposure time period of the unit pixel 20 for each pixel in the CMOS image sensor 100 according to the seventh embodiment will be described.

Figure 39A:
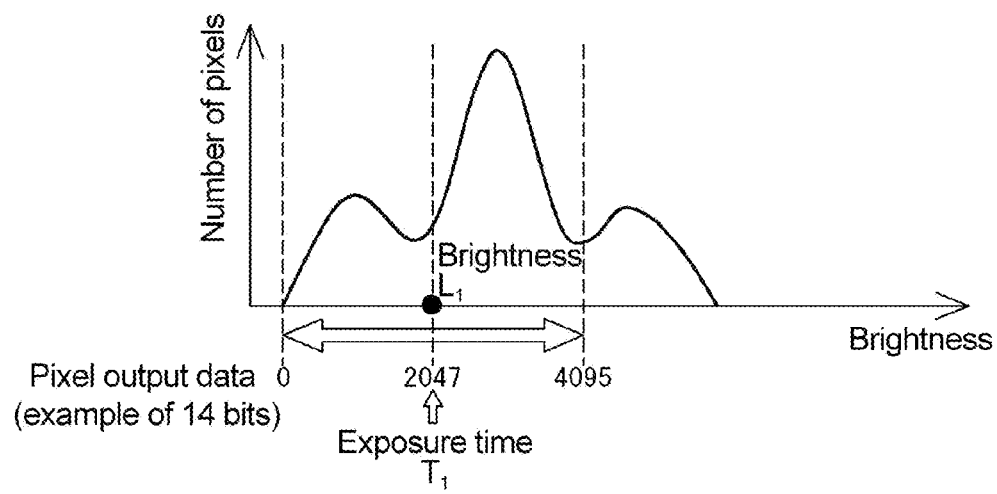
FIG. 39A and FIG. 39B are each a histogram showing brightness distribution of a subject imaged as an image by the CMOS image sensor according to the seventh embodiment.
Figure 39B:
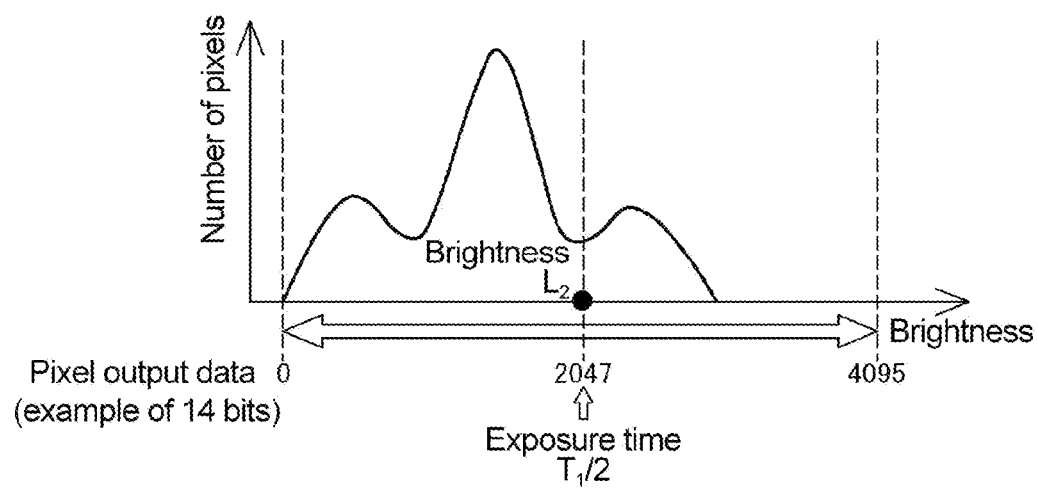

FIG. 39A and FIG. 39B are each a histogram showing brightness distribution of a subject imaged as an image by the CMOS image sensor 100 according to the seventh embodiment. In FIG. 39A and FIG. 39B, a case where image data output by the unit pixel 20 is data of 14 bits is described as an example. In FIG. 39A and FIG. 39B, a solid-white arrow described in parallel with the X-axis represents the range of brightness of a subject, i.e., dynamic range, that the CMOS image sensor 100 can capture an image with gradation without using a wide dynamic range imaging mechanism by intermittent driving (intermittent driving) that is the characteristic of the technology of the present disclosure.

In FIG. 39A, the brightness distribution of a subject is wider than the dynamic range that the CMOS image sensor 100 can capture an image without using intermittent driving. In such a case, when capturing an image without using intermittent driving, it has to set the exposure time so as to be capable of capturing an image with gradation for only a part of the brightness distribution of a subject. In FIG. 39A, as an example of such setting of exposure time, an example in which an exposure time period $T_1$ is set so that a subject of a brightness $L_1$ is set to the center of the brightness range that the CMOS image sensor 100 can capture an image with gradation is shown.

From the subject of the brightness $L_1$ shown in FIG. 39A, a value of 2047 is output as digital data. Then, from the subject of the brightness of the lower limit of the dynamic range described by the solid-white arrow in FIG. 39A, a value of 0 is output as digital data. From the subject of the brightness of the upper limit of the dynamic range described by the solid-white arrow in FIG. 39A, a value of 4095 is output as digital data.

In the case of capturing an image by using the wide dynamic range imaging mechanism by intermittent driving that is the characteristic of the technology of the present disclosure, after setting the exposure time period $T_1$ by the above-mentioned method and starting exposure, at a certain point in the exposure period, the subject brightness evaluation unit 201 included in the unit pixel 20 (see FIG. 34) is used for evaluating, for each pixel, the amount of charges overflowed and stored in the charge storing unit 118. For example, the amount of charges overflowed and stored in the charge storing unit 118 at the point when the time period of 1/10 of the exposure period $T_1$ is elapsed after starting exposure is evaluated for each pixel.

As described above, the unit pixel 20 is characterized by including, as the charge storing unit 118, a charge storing unit in which the amount of charges that can be stored is not less than, for example, approximately 100 times the amount of charges that can be stored in the second photoelectric conversion section 112. That is, the unit pixel 20 is configured to store, in the charge storing unit 118, most of the charges generated in the second photoelectric conversion section 112.

In this regard, the exposure-time-period control unit 202 included in the unit pixel 20 (see FIG. 34) predicts, for each pixel, the amount of charges after the exposure time period $T_1$ is finished, on the basis of the evaluation result of the amount of charges overflowed and stored in the charge storing unit 118 at the point when the time of 1/10 of the exposure period $T_1$ is elapsed. In this way, the exposure-time-period control unit 202 predicts, for each pixel, whether each unit pixel 20 is saturated or each unit pixel 20 has gradation without being saturated after the exposure time period $T_1$ is finished.

Then, in the exposure period in which the amount of charges overflowed and stored in the charge storing unit 118 is evaluated, the exposure-time-period control unit 202 sets the length of the exposure period from the point at which the evaluation is performed, on the basis of the above-mentioned prediction result.

Figure 40:
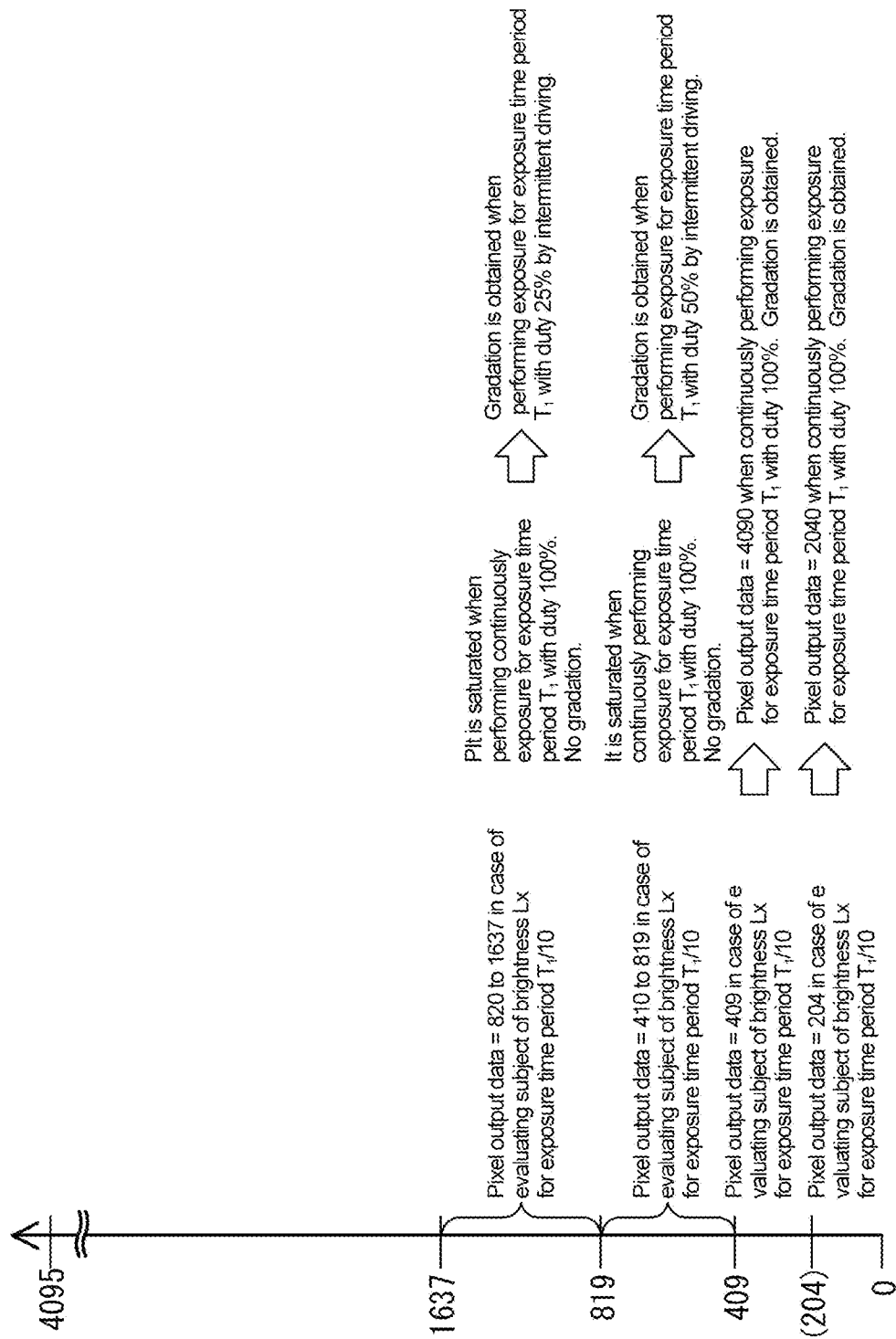
FIG. 40 is an explanatory diagram of evaluation content of the amount of charges by the subject brightness evaluation unit and setting of the length of an exposure time period by an exposure-time-period control unit.

FIG. 40 is an explanatory diagram of evaluation content of the amount of charges by the subject brightness evaluation unit 201 and setting of the length of an exposure time period by an exposure-time-period control unit. The pixel that captures an image of the subject of the brightness $L_1$ in the histogram of the subject brightness distribution shown in FIG. 39A outputs an value of 2047 as digital data, as a result of exposure for the exposure time period $T_1$.

Therefore, as shown in FIG. 40, in the case of evaluating the amount of charges overflowed and stored in the charge storing unit 118 at the point when the time of 1/10 of the exposure period $T_1$ is elapsed for the unit pixel 20, a value of 204 is obtained as digital data from the pixel that captures an image of the subject of the brightness $L_1$.

It is predicted that from the pixel from which a value of 204 is obtained as digital data by evaluating the amount of charges of the charge storing unit 118 at the point when the time of 1/10 of the exposure period $T_1$ is elapsed, a value of approximately 2040 is obtained as digital data after the exposure time period $T_1$ is finished. This value naturally falls within the dynamic range in which the unit pixel 20 can output pixel data of 14 bits with gradation. As a result of the above-mentioned evaluation, the exposure operation of the pixel that is predicted to output data with gradation after the exposure time period $T_1$ is finished is controlled by the exposure-time-period control unit 202 so that the exposure time period becomes $T_1$.

Similarly, it is predicted that from the pixel from which a value of 409 is obtained as digital data as a result of evaluating the amount of charges overflowed and stored in the charge storing unit 118 at the point when the time of 1/10 of the exposure period $T_1$ is elapsed, a value of approximately 4090 is obtained as digital data after the exposure time period $T_1$ is finished. Since it is predicted that this value falls within the dynamic range in which pixel data of 14 bits with gradation can be output, the exposure operation is controlled by the exposure-time-period control unit 202 without using intermittent driving so that the effective exposure time period becomes $T_1$.

Meanwhile, it is predicted that from the pixel from which a value in the range of 410 to 819 is obtained as digital data as a result of evaluating the amount of charges overflowed and stored in the charge storing unit 118 at the point when the time of 1/10 of the exposure period $T_1$ is elapsed, the exposure amount corresponding to a value in the range of 4100 to 8190 is obtained as digital data after the exposure time period $T_1$ is finished. Then, it is predicted that this value does not fall within the dynamic range in which pixel data of 14 bits with gradation can be output. In the pixel with this range, in the exposure period $T_1$, the fourth transfer gate unit 116 is intermittently driven by the exposure-time-period control unit 202 so that the effective exposure time period becomes 50% of $T_1$. By the intermittent driving, pixel data with gradation is obtained also from the above-mentioned pixel.

Further, it is predicted that from the pixel from which a value in the range of not less than 820 is obtained as digital data as a result of evaluating the amount of charges overflowed and stored in the charge storing unit 118 at the point when the time of 1/10 of the exposure period $T_1$ is elapsed, the exposure amount corresponding to a value of 8200 is obtained as digital data after the exposure time period $T_1$ is finished. Then, it is predicted that this value does not fall within the dynamic range in which pixel data of 14 bits with gradation can be output. In the pixel with this range, in the exposure period $T_1$, the fourth transfer gate unit 116 is intermittently driven by the exposure-time-period control unit 202 so that the effective exposure time period becomes 25% of $T_1$. By the intermittent driving, pixel data with gradation is obtained from the pixel from which a value in the range of 820 to 1638 is obtained as digital data among the above-mentioned pixels.

In FIG. 39B, the range of brightness of a subject, i.e. dynamic range, that can be imaged with gradation as a result of using the above-mentioned evaluation of the amount of charges by the subject brightness evaluation unit 201 and intermittent driving by the exposure-time-period control unit 202 is shown by the solid-white arrow placed in parallel with the X-axis. It is understood that the dynamic range is expanded as compared with FIG. 39A.

Figure 41A:
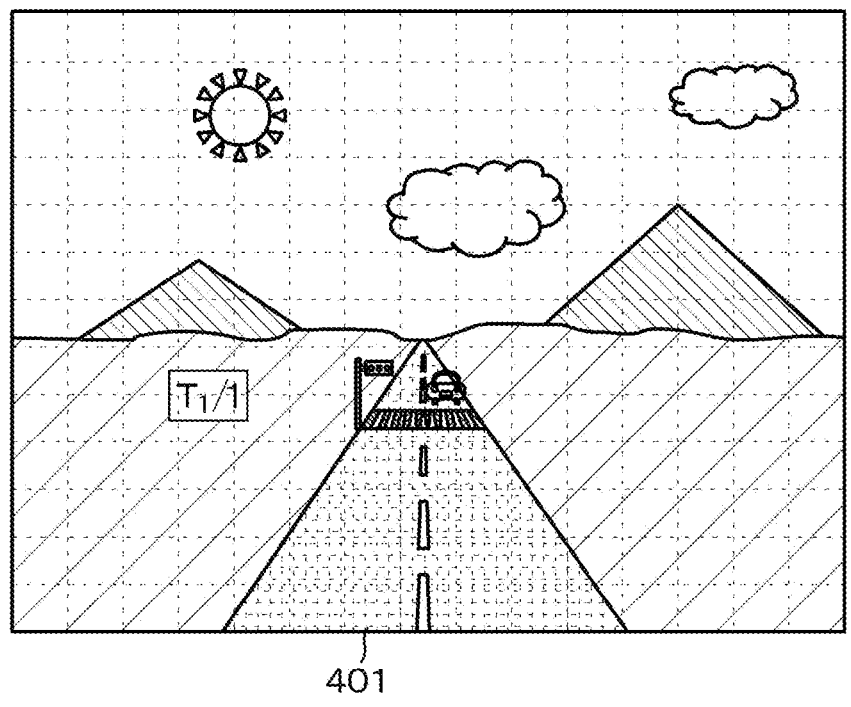
FIG. 41A and FIG. 41B are each a diagram showing a result of setting the length of the exposure time period by the exposure-time-period control unit on the basis of an evaluation result of the amount of charges by the subject brightness evaluation unit.
Figure 41B:
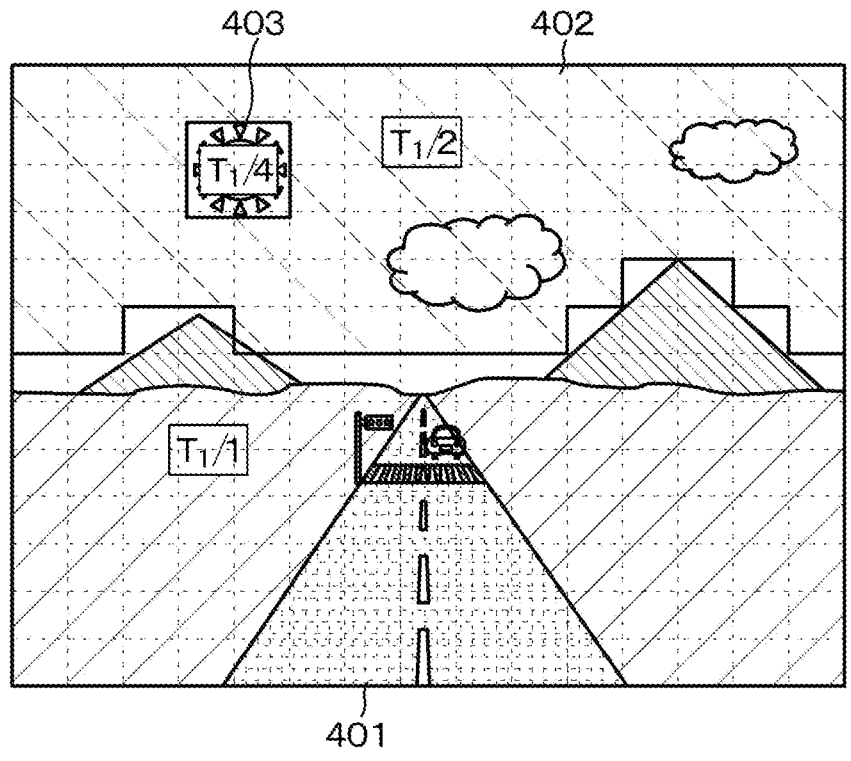

FIG. 41A and FIG. 41B are each a diagram showing a result of setting the length of the exposure time period by the exposure-time-period control unit 202 on the basis of an evaluation result of the amount of charges by the subject brightness evaluation unit 201. In this example, the result of changing the effective exposure time period in the exposure period $T_1$ for each pixel by performing intermittent driving by the exposure-time-period control unit 202 on the basis of the evaluation result of the amount of charges stored in the charge storing unit 118 at the point when the time of 1/10 of the exposure period $T_1$ is elapsed in each pixel that has been supposed to be exposed for the exposure period $T_1$ is shown.

In the images shown in FIGS. 41A and 41B, it is shown that an area in which a ground 401 having average brightness of a subject is imaged is exposed for the exposure time period $T_1$ that is set before starting exposure.

Meanwhile, in the case where it is predicted that the result of evaluating the amount of charges at the point when the time of 1/10 of the exposure period $T_1$ is elapsed does not fall within the dynamic range in which pixel data with gradation can be output when performing exposure for the exposure time period $T_1$, intermittent driving by the exposure-time-period control unit 202 is performed.

Specifically, by performing intermittent driving in the exposure period $T_1$ so that the effective exposure time period becomes 50% of $T_1$, an area that images an area of a sky 402 from which pixel data with gradation is predicted to be obtained is exposed for the exposure period $T_1$ by intermittent driving so that the effective exposure time period becomes 50% of $T_1$.

Further, by performing intermittent driving in the exposure period $T_1$ so that the effective exposure time period becomes 25% of $T_1$, an area that images an area of a sun 403 from which pixel data with gradation is predicted to be obtained is exposed for the exposure period $T_1$ by intermittent driving so that the effective exposure time period becomes 25% of $T_1$.

[Analysis of Pixel Data and Control of Imaging Condition]

Note that the technology for evaluating the saturation level of a pixel and reflecting the control of reducing the exposure time period of the saturated pixel on the next frame of the evaluated image is known. However, for example, assuming the case of mounting an imaging apparatus on a moving means such as an automobile and performing exposure while moving, the following problem occurs. That is, even when evaluating the saturation state of a particular pixel and reflecting the evaluation result on the control of the next frame, the position of a subject has been moved in the next frame. Therefore, a problem that exposure-time-period control based on the saturation is performed on a subject different from the subject of which saturation is evaluated may occur.

Meanwhile, in this embodiment, brightness of a subject is evaluated at a certain point in one exposure period, and the length of the exposure period from the evaluation point in the exposure period is controlled on the basis of the evaluation result. Therefore, according to this embodiment, since evaluation of brightness and control of the exposure period are performed in one exposure period, i.e., in one frame exposure, it is possible to perform exposure control rapidly as compared with the above-mentioned existing technology. Accordingly, even when the subject is being moved, it is possible to obtain operations and effects of being capable of properly adjusting the brightness of the subject to obtain a proper image as compared with the above-mentioned existing technology.

Figure 42:
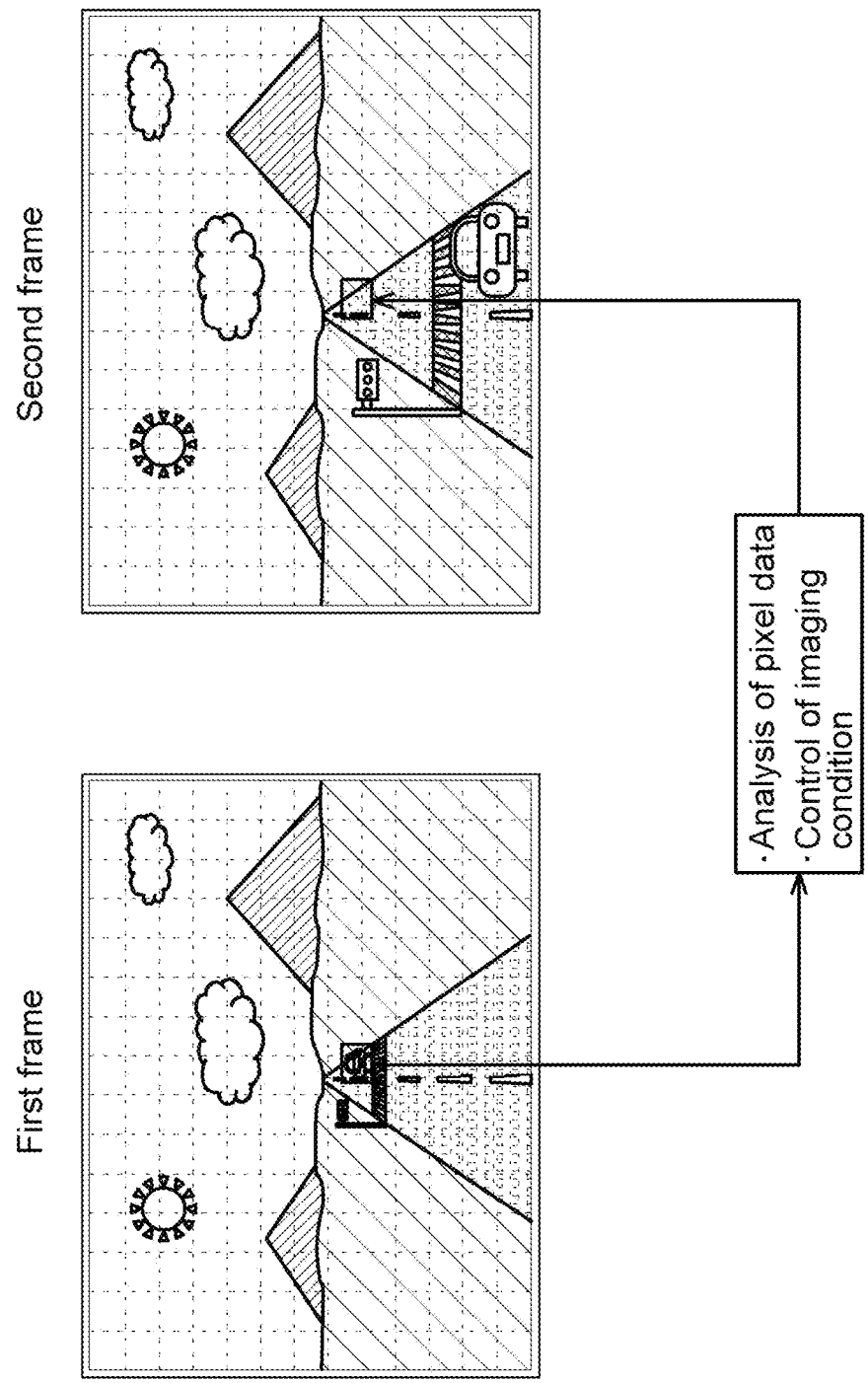
FIG. 42 is an explanatory diagram of analysis of pixel data and control of imaging conditions in the case of mounting an imaging apparatus that does not use intermittent driving on an automobile.
Figure 43:
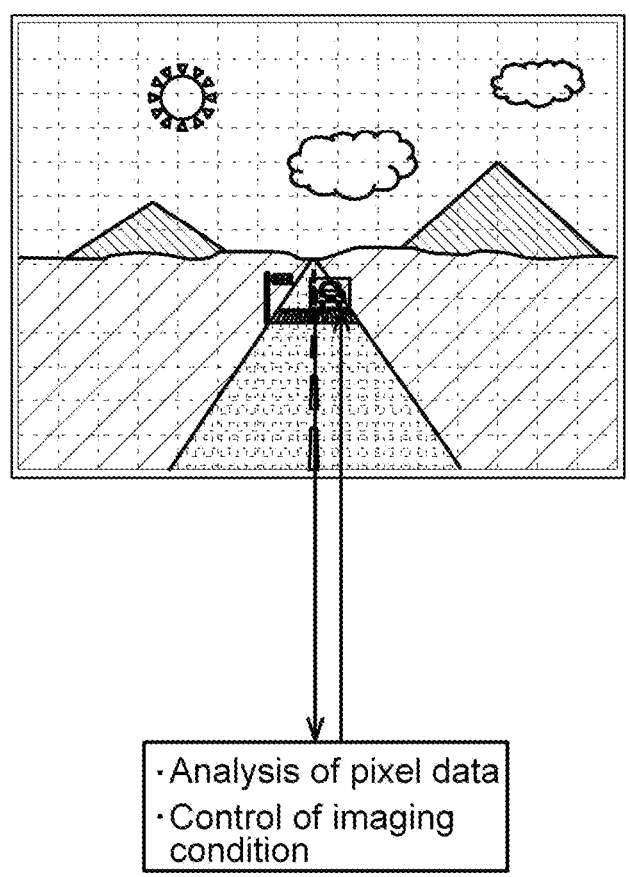
FIG. 43 is an explanatory diagram of analysis of pixel data and control of imaging conditions in the case of mounting an imaging apparatus that uses intermittent driving on an automobile.

The above description will be more specifically described with an example of a case of an imaging apparatus mounted on an automobile with reference to FIG. 42 and FIG. 43.

For example, in the case of an imaging apparatus mounted on an automobile, a subject that is captured as a moving image by the imaging apparatus mounted on a running car is always moving. The imaging apparatus analyzes the image captured in a frame (first frame) of the moving image for each pixel to obtain, for each pixel, an appropriate imaging condition, and feeds back, for each pixel, the obtained imaging condition to a second frame that is the next frame of the first frame as the analysis target. However, as shown in FIG. 42, the subject to be imaged in the second frame is different from that in the first frame in all pixels in the frame. Therefore, the imaging condition fed back to the second frame is not necessarily appropriate for the subject to be imaged in the second frame.

Meanwhile, in the seventh embodiment, as shown in FIG. 43, the imaging apparatus simultaneously starts exposure of all pixels in a frame (first frame) of the moving image, and analyzes, at the point when a certain time period in the exposure period is elapsed, pixel data obtained by imaging by each pixel until that time, for each pixel. Then, the imaging apparatus obtains an appropriate imaging condition as an imaging condition of the future exposure period after the point when the certain time period in the exposure period is elapsed, and feeds back the obtained imaging condition as an imaging condition of the future exposure period in the exposure period. Accordingly, even in the case where a subject is moving, it is possible to obtain an appropriate image by properly adjusting brightness of the subject as compared with the existing technology that does not use intermittent driving.

[Control Flow of Exposure Time Period]

Figure 44:
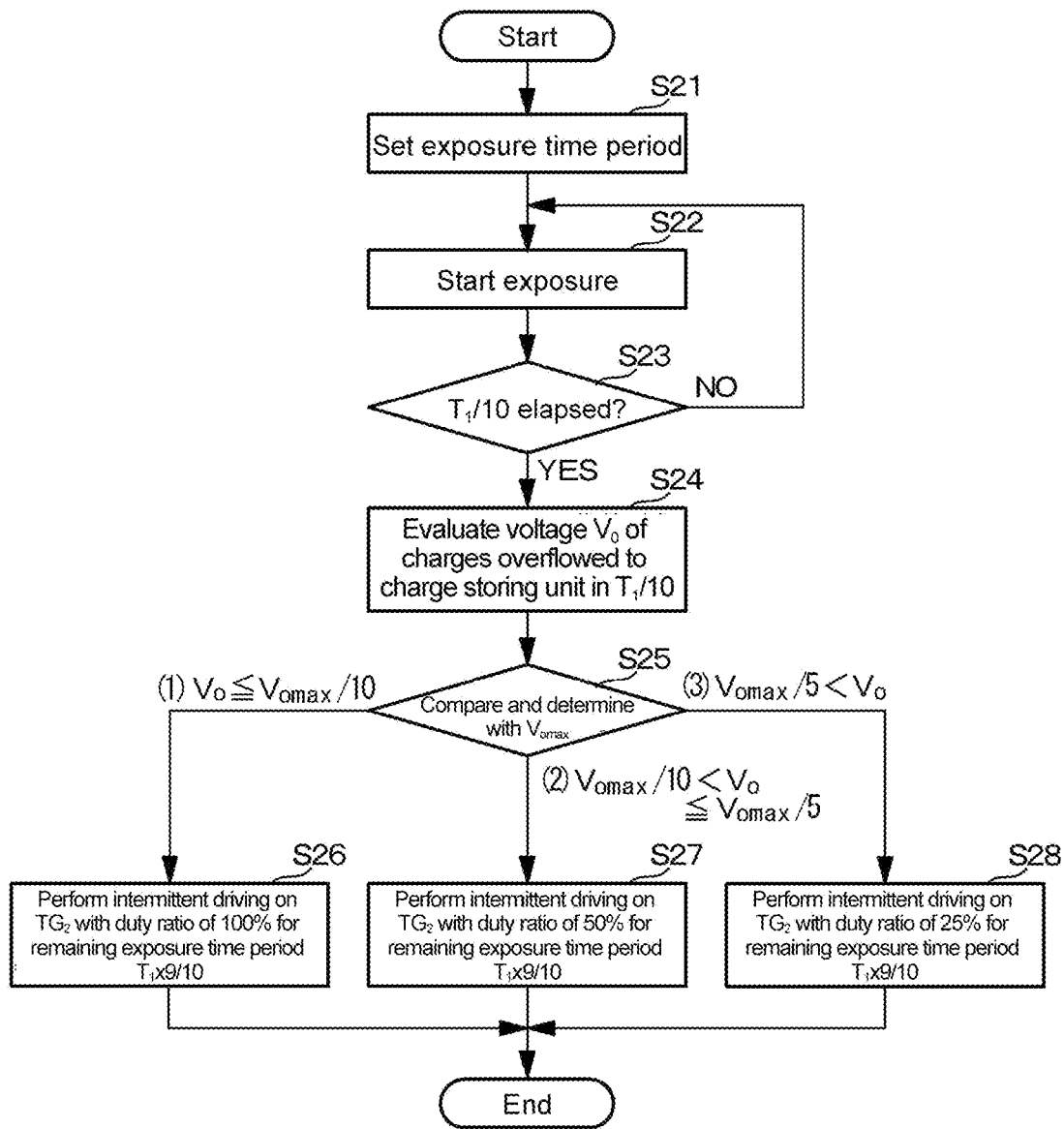
FIG. 44 is a flowchart showing flow of processing of evaluation of the amount of charges by the subject brightness evaluation unit and setting of intermittent driving by the exposure-time-period control unit.

Next, control flow of the exposure time period will be described using FIG. 44. FIG. 44 is a flowchart showing flow of processing of evaluation of the amount of charges by the subject brightness evaluation unit 201 and setting of intermittent driving by the exposure-time-period control unit 202.

First, the exposure-time-period control unit 202 sets an exposure time period (Step S21). Specifically, the exposure-time-period control unit 202 sets the exposure time period $T_1$ so as to obtain a value $D_h$ of 50% of saturated pixel data $D_s$ by exposing a subject of a median value (brightness $L_1$) in the subject brightness range in which gradation is desired to be reproduced. Then, the exposure-time-period control unit 202 starts exposure with the set exposure time period $T_1$ (Step S22).

When the time of $T_1/10$ after starting exposure is elapsed (Step S23), the subject brightness evaluation unit 201 evaluates voltage $V_o$ of charges overflowed to the charge storing unit 118 in $T_1/10$ (Step S24), and determines (comparison determination) the magnitude relationship with the value obtained by multiplying a maximum value $V_{omax}$ of input voltage that can be A/D converted by the A/D conversion unit 204 (see FIG. 34) by a coefficient (Step S25). In the correspondence with FIG. 40, the maximum value $V_{omax}$ is input voltage from which digital data corresponding to the maximum value 4095 obtained by A/D conversion is obtained.

In Step S25, determination of (1) $V_o \leq V_{omax}/10$, (2) $V_{omax}/10 < V_o \leq V_{omax}/5$, and (3) $V_{omax}/5 < V_o$ is performed. Note that in the correspondence with FIG. 40, $V_{omax}/10$ is input voltage from which digital data corresponding to a value 490 that is a threshold value of determination where data with gradation can be output without performing intermittent driving after the exposure period $T_1$ is finished is obtained. In the correspondence with FIG. 40, $V_{omax}/5$ is input voltage from which digital data corresponding to a value 819 that is a threshold value of determination where data with gradation can be output by performing 50% intermittent driving after the exposure period $T_1$ is finished is obtained.

The pixel operation control unit 203 controls a duty ratio of the transfer signal $TG_2$ that is a pulse signal for driving the fourth transfer gate unit 116 in accordance with the determination result in Step S25. Specifically, in the case where the determination result is (1) $V_o \leq V_{omax}$, the transfer signal $TG_2$ is driven with a duty ratio 100% for the remaining time $T_1 \times 9/10$ of the exposure period (Step S26). In the case where the determination result is (2) $V_{omax}/10 < V_o V_{omax}/5$, the transfer signal $TG_2$ is driven with a duty ratio 50% for the remaining time $T_1 \times 9/10$ of the exposure period (Step S27). In the case where the determination result is (3) $V_{omax}/5 < V_o$, the transfer signal $TG_2$ is driven with a duty ratio 25% for the remaining time $T_1 \times 9/10$ of the exposure period (Step S28).

The control of the exposure time period of the first photoelectric conversion section 111 and the second photoelectric conversion section 112 included in the unit pixel 20 will be more specifically described below.

(Case where Exposure is Continued with Duty Ratio=100%)

Figure 45:
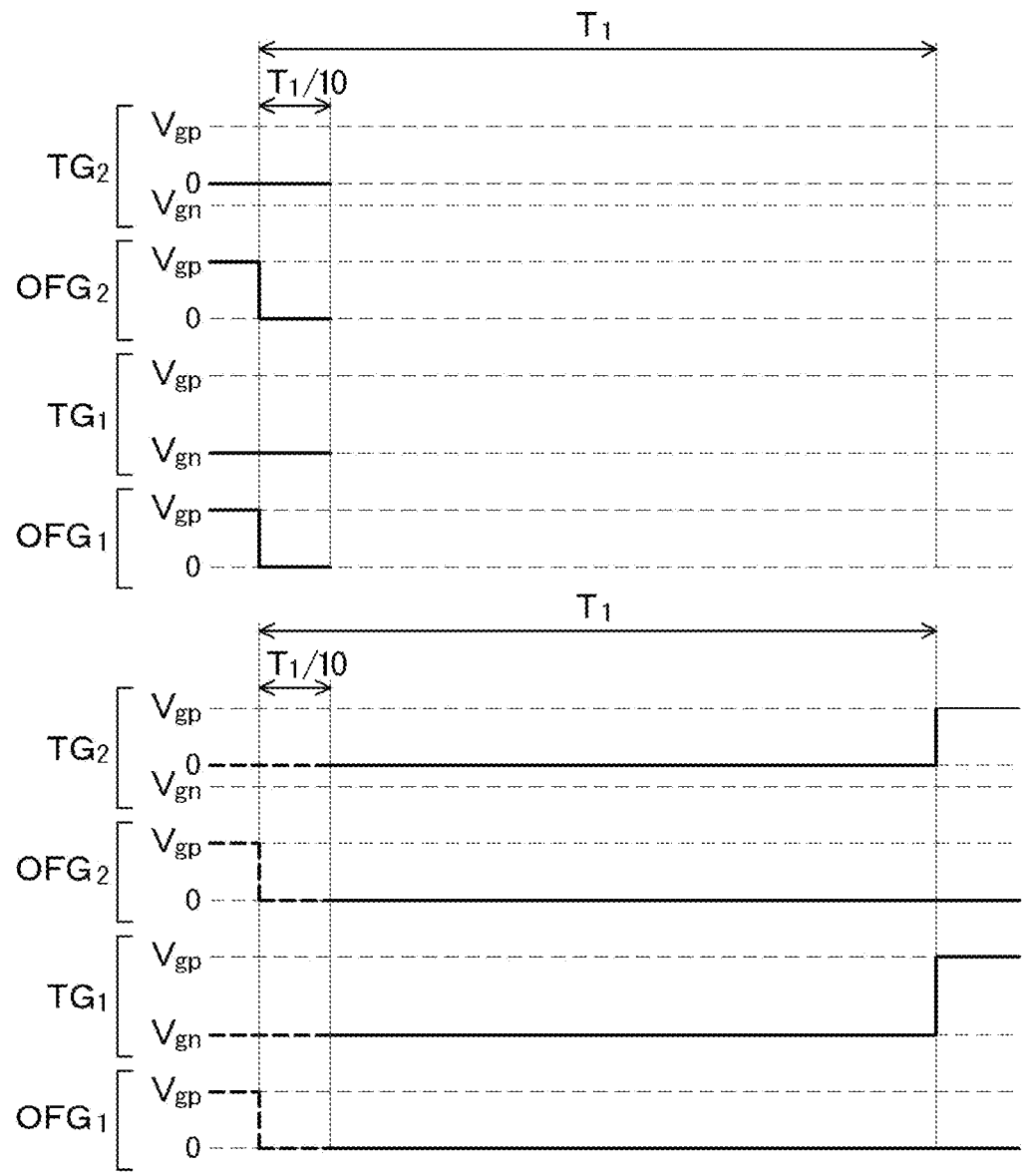
FIG. 45 is a timing waveform chart relating to control of an exposure time period of a first photoelectric conversion section and a second photoelectric conversion section in the case where a duty ratio=100%.

First, a case where exposure is continued with a duty ratio=100% will be described using FIG. 45. FIG. 45 is a timing waveform chart relating to control of an exposure time period of the first photoelectric conversion section 111 and the second photoelectric conversion section 112 in the case where the duty ratio=100%. In FIG. 45, an example of driving a pixel is shown. It is predicted that pixel data with gradation is obtained from the pixel even in the case of performing an exposure operation so that the effective exposure time period becomes $T_1$ without using intermittent driving, as a result of evaluation by the subject brightness evaluation unit 201.

The exposure operation of the first photoelectric conversion section 111 is controlled by the transfer signal $TG_1$ for driving the first transfer gate unit 113 and the drive signal $OFG_1$ for driving the first discharge gate unit 117. Before starting exposure, when the drive signal $OFG_1$ is active, all charges in the photodiode $PD_1$ have been discharged while the first photoelectric conversion section 111 is connected to an overflow drain (e.g., power source $V_{DD}$) connected to the end of the first discharge gate unit 117.

Then, the drive signal $OFG_1$ becomes inactive, and thus, storing of charges generated in the first photoelectric conversion section 111 as a result of photoelectric conversion is started. In other words, an exposure operation is started. After the exposure time period $T_1$ is elapsed, the transfer signal $TG_1$ becomes active, the charges stored in the first photoelectric conversion section 111 during the exposure period are transferred to the floating diffusion. Accordingly, one exposure operation by the first photoelectric conversion section 111 is finished.

The exposure operation of the second photoelectric conversion section 112 is controlled by the transfer signal $TG_2$ for driving the fourth transfer gate unit 116 and the drive signal $OFG_2$ for driving the second discharge gate unit 119. While the transfer signal $TG_2$ is 0 V, charges can be overflowed from the second photoelectric conversion section 112 to the charge storing unit 118 via the overflow path formed in the channel area of the fourth transfer gate unit 116.

While the transfer signal $TG_2$ is a negative bias $V_{gn}$, this overflow path is closed and charges cannot be overflowed from the second photoelectric conversion section 112 to the charge storing unit 118. While the transfer signal $TG_2$ is a positive bias $V_{gp}$, all charges stored in the second photoelectric conversion section 112 as a result of photoelectric conversion are transferred to the charge storing unit 118.

Before starting exposure, when the transfer signal $TG_2$ is active, all charges in the photodiode $PD_2$ have been discharged while the second photoelectric conversion section 112 is connected to an overflow drain (e.g., power source $V_{DD}$) connected to the end of the second discharge gate unit 119.

The transfer signal $TG_2$ becomes inactive, and thus, storing of charges generates in the second photoelectric conversion section 112 as a result of photoelectric conversion on light is started. In other words, an exposure operation is started. In the exposure period, the transfer signal $TG_2$ is 0 V. Accordingly, in the exposure period, charges overflowed from the second photoelectric conversion section 112 are overflowed to the charge storing unit 118 via the overflow pass of the fourth transfer gate unit 116. After the exposure time period $T_1$ is elapsed, the transfer signal $TG_2$ becomes active, and charges stored in the second photoelectric conversion section 112 in the exposure period are transferred to the charge storing unit 118. Accordingly, one exposure operation of the second photoelectric conversion section 112 is finished.

Note that the exposure operation of the first photoelectric conversion section 111 and the exposure operation of the second photoelectric conversion section 112 are started at the same timing, performed for the same time period, and finished at the same timing. This operation provides the following operations and effects.

That is, blending processing is performed, for each pixel, on image data output from the first photoelectric conversion section 111 and image data output from the second photoelectric conversion section 112 by the blend combination unit 206 included in each pixel, and a piece of pixel data is created as a result.

Now, it is assumed that a subject to be imaged is a moving subject that moves in the exposure period or the CMOS image sensor 100 is mounted on a moving means such as an automobile and performs exposure while moving. At this time, in the case where the exposure period in which the exposure operation of the first photoelectric conversion section 111 is performed and the exposure period in which the exposure operation of the second photoelectric conversion section 112 do not match, the position of a subject in an image obtained from the first photoelectric conversion section 111 and the position of a subject in an image obtained from the second photoelectric conversion section 112 are displaced from each other in some cases. In the case of performing blend combination on images in which the positions of the subjects are displaced from each other, an image in which the sharpness of the outline of the subject is reduced may be created.

Meanwhile, in this embodiment, as shown in a timing waveform chart of FIG. 45, the exposure period in which the exposure operation of the first photoelectric conversion section 111 is performed and the exposure period in which the exposure period of the second photoelectric conversion section 112 are caused to match to perform exposure. Accordingly, since the position of a subject in an image obtained from the first photoelectric conversion section 111 and the position of a subject in an image obtained from the second photoelectric conversion section 112 match, it is possible to obtain an image in which the sharpness of the outline of the subject is high by performing blend combination on these images.

(Case where Exposure by Intermittent Driving with Duty Ratio=50% is Performed)

Figure 46:
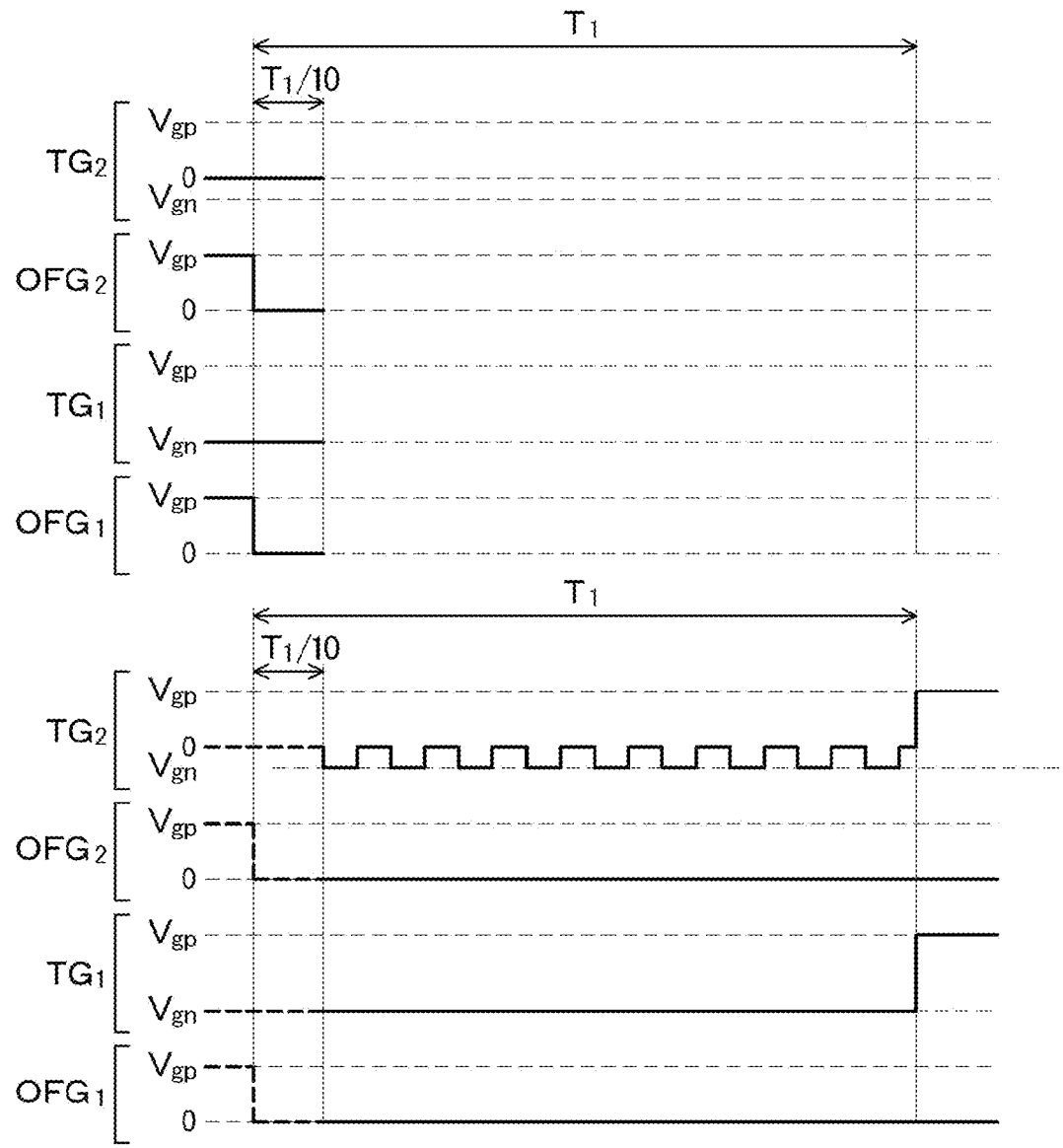
FIG. 46 is a timing waveform chart relating to control of the exposure time period of the first photoelectric conversion section and the second photoelectric conversion section in the case where the duty ratio=50%.

Next, a case where exposure is continued with a duty ratio=50% will be described using FIG. 46. FIG. 46 is a timing waveform chart relating to control of the exposure time period of the first photoelectric conversion section 111 and the second photoelectric conversion section 112 in the case where the duty ratio=50%.

The exposure operation of the first photoelectric conversion section 111 is the same as the operation based on the timing waveform chart of FIG. 46. Therefore, description of the operation will be omitted here.

Before starting exposure, when the drive signal $OFG_2$ is active, all charges in the photodiode $PD_2$ have been discharged while the second photoelectric conversion section 112 is connected to an overflow drain (e.g., power source $V_{DD}$) connected to the end of the second discharge gate unit 119. The drive signal $OFG_2$ becomes inactive, and thus, storing of charges generated in the second photoelectric conversion section 112 as a result of photoelectric conversion is started. In other words, an exposure operation is started.

After starting exposure, at the point when the time of 1/10 of the exposure period $T_1$ is elapsed, the subject brightness evaluation unit 201 evaluates the amount of charges stored in the charge storing unit 118, and the exposure-time-period control unit 202 starts the exposure operation by intermittent driving of 50%.

The exposure operation by intermittent driving of 50% is performed as follows. That is, the exposure period $T_1$ is divided into a plurality of sub-exposure periods. It is favorable that the number of division is large (e.g., not less than 10) rather than extremely small (e.g., two) because when imaging a moving subject, exposure can be performed by sequentially and accurately grasping the moving subject with a short exposure time period.

During intermittent driving of 50% in each divided sub-exposure period, both the transfer signal $TG_2$ and the drive signal $OFG_2$ are set to 0 V. In this case, charges overflowed from the second photoelectric conversion section 112 in this time period are overflowed to the charge storing unit 118 via the overflow path of the fourth transfer gate unit 116. In other words, charges generated in the second photoelectric conversion section 112 as a result of photoelectric conversion in this time period are stored in the charge storing unit 118, and output as pixel data after the exposure period is finished.

Meanwhile, during the remaining period of 50% in each divided sub-exposure period, the transfer signal $TG_2$ is set to the negative bias $V_{gn}$, and the drive signal $OFG_2$ is set to 0 V. In this case, charges overflowed from the second photoelectric conversion section 112 in this time period are discharged to the overflow drain via the overflow path of the second discharge gate unit 119. Charges generated in the second photoelectric conversion section 112 as a result of photoelectric conversion in this time period are discharged, and thus, the charge storing unit 118 becomes hard to be saturated. Thus, operations and effects of expanding the range in which image data with gradation is obtained, i.e., dynamic range, are obtained.

Further, also in the operation based on the timing waveform chart of FIG. 46, the exposure operation of the first photoelectric conversion section 111 and the exposure operation of the second photoelectric conversion section 112 are started at the same timing, performed for the same time period, and finished at the same timing, similarly to the operation based on timing waveform chart of FIG. 45. Accordingly, in the case where a moving subject is imaged by the first photoelectric conversion section 111 and the second photoelectric conversion section 112 and blend combination is performed on both images, it is possible to obtain an image with a high sharpness because the positions of subjects in both images match.

(Case where Exposure by Intermittent Driving with Duty Ratio=25% is Performed)

Figure 47:
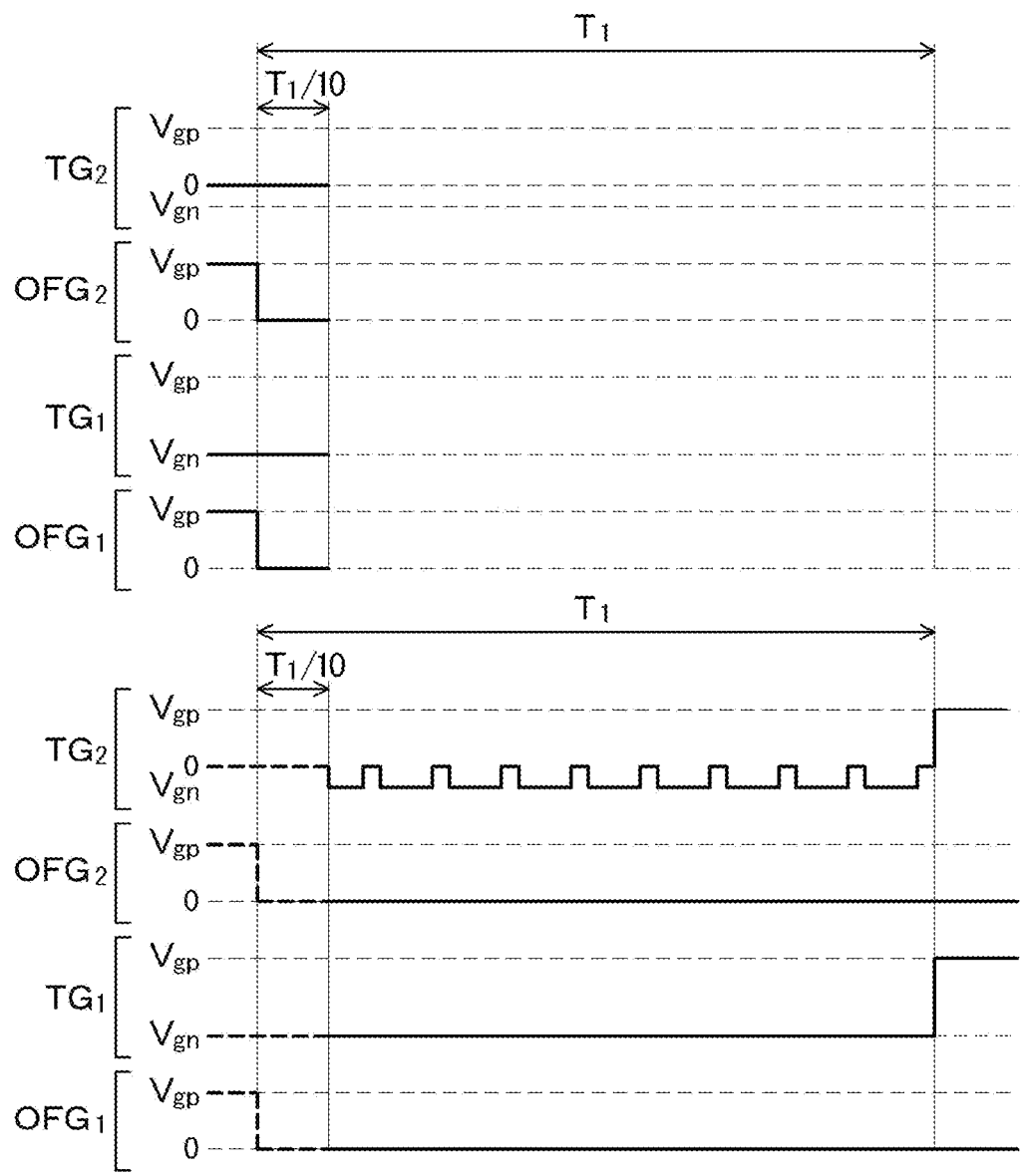
FIG. 47 is a timing waveform chart relating to control of the exposure time period of the first photoelectric conversion section and the second photoelectric conversion section in the case where the duty ratio=25%.

Next, Next, a case where exposure is continued with a duty ratio=25% will be described using FIG. 47. FIG. 47 is a timing waveform chart relating to control of the exposure time period of the first photoelectric conversion section 111 and the second photoelectric conversion section 112 in the case where the duty ratio=25%.

The exposure operation of the first photoelectric conversion section 111 is the same as the operation based on the timing waveform chart of FIG. 45. Therefore, description of the operation will be omitted here.

In the exposure operation of the second photoelectric conversion section 112, both the transfer signal $TG_2$ and the drive signal $OFG_2$ are set to 0 V during intermittent driving of 25% in each sub-exposure period obtained by dividing the exposure period $T_1$ into a plurality of sub-exposure periods. Then, during the remain time of 75%, the transfer signal $TG_2$ is set to the negative bias $V_{gn}$, and the drive signal $OFG_2$ is set to 0 V. Other than that, it is the same as the operation based on the timing waveform chart of FIG. 46.

(Regarding Output of First and Second Photoelectric Conversion Sections Obtained by Exposure Operation)

Figure 48:
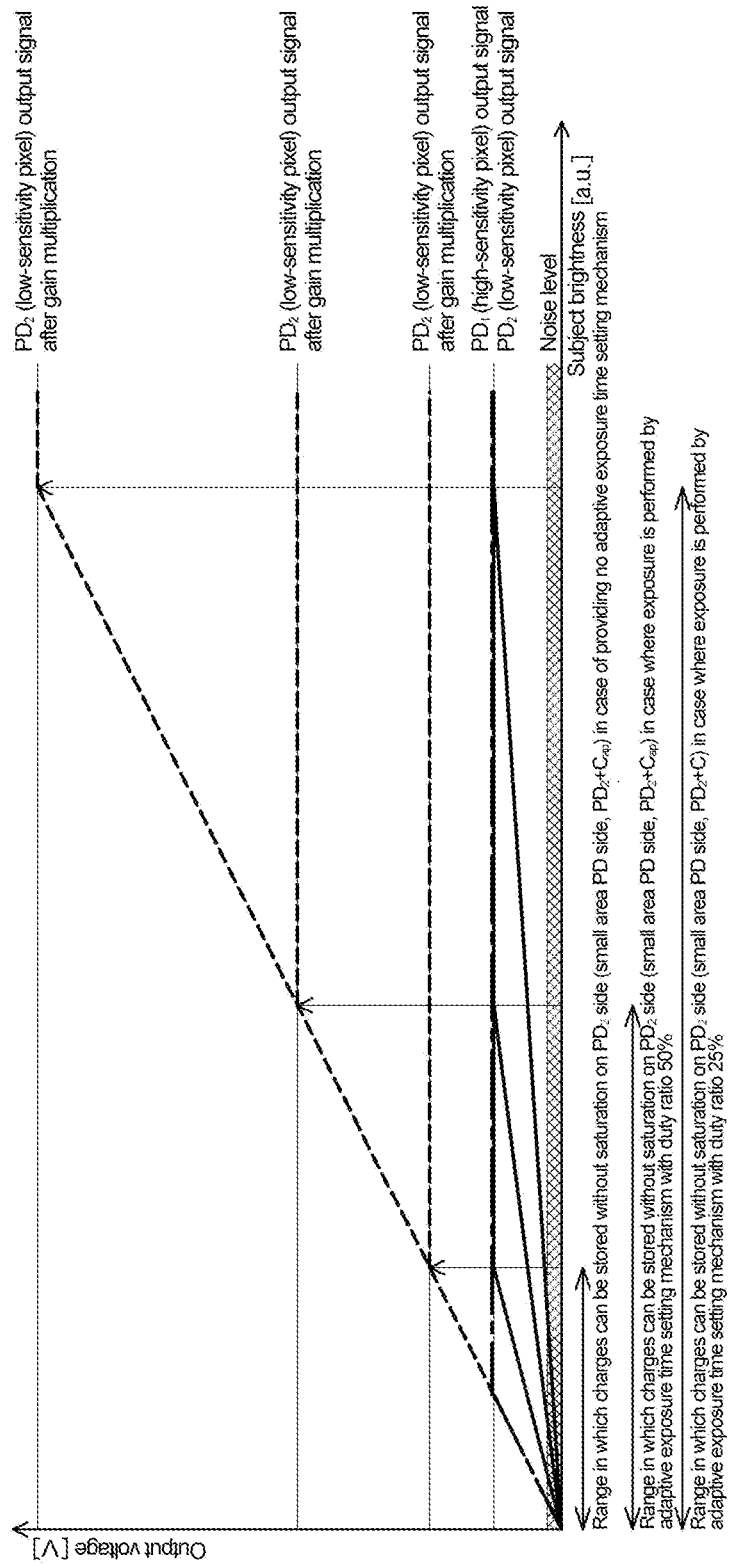
FIG. 48 is a diagram obtained by plotting output voltage obtained by an exposure operation of the first photoelectric conversion section and the second photoelectric conversion section of the CMOS image sensor according to the seventh embodiment.

Now, output of the first photoelectric conversion section 111 and the second photoelectric conversion section 112 obtained by the exposure operation will be described using FIG. 48. FIG. 48 is a diagram obtained by plotting output voltage obtained by the exposure operation of the first photoelectric conversion section 111 and the second photoelectric conversion section 112. In FIG. 48, the horizontal axis represents the brightness of a subject imaged by the unit pixel 20, and the vertical axis represents voltage output from the floating diffusion FD of the unit pixel 20 to the A/D conversion unit 204, i.e., value corresponding to digital data output from the A/D conversion unit 204.

As described above, the first photoelectric conversion section 111 has a larger light-receiving area of the photodiode than the second photoelectric conversion section 112. Therefore, in the case of performing a photoelectric conversion operation for the same time period on both the first photoelectric conversion section 111 and the second photoelectric conversion section 112, the first photoelectric conversion section 111 can obtain signal charges more than the second photoelectric conversion section 112. In other words, the first photoelectric conversion section 111 is a photoelectric conversion section that is easy to saturate and has a small dynamic range while having a high sensitivity.

Meanwhile, the second photoelectric conversion section 112 is a photoelectric conversion section that obtains signal charges less than the first photoelectric conversion section 111, i.e., a photoelectric conversion section that is hard to saturate and has a large dynamic range while having a low sensitivity. Then, in this embodiment, intermittent driving is used with respect to the second photoelectric conversion section 112, as a method of further expanding the dynamic range by making the charge storing unit 118 that stores signal charges harder to saturate.

In FIG. 48, the alternate long and short dash line represents output characteristics with respect to the subject brightness in the first photoelectric conversion section 111. Further, in FIG. 48, of three solid lines having different slopes, the solid line having the largest slope represents output characteristics with respect to the subject brightness in the second photoelectric conversion section 112 in the case where no intermittent driving is performed (in other words, intermittent driving with a duty ratio of 100% is performed).

Of the three solid lines having different slopes, the solid line having the second largest slope represents output characteristics with respect to the subject brightness in the second photoelectric conversion section 112 in the case where intermittent driving with a duty ratio of 50% is performed. Of the three solid lines having different slopes, the solid line having the smallest slope represents output characteristics with respect to the subject brightness in the second photoelectric conversion section 112 in the case where intermittent driving with a duty ratio of 25% is performed.

In FIG. 48, also noise level is schematically shown in parallel with the X-axis. As can be seen from FIG. 48, by introducing intermittent driving, operations and effects of expanding the dynamic range of the second photoelectric conversion section 112 are obtained. Meanwhile, in the case of performing intermittent driving, the slope of the output characteristics described in FIG. 48 becomes small. In other words, as the duty ratio is reduced by introducing intermittent driving, the dynamic range is expanded. Meanwhile, in the case of imaging a subject having certain brightness, as the duty ratio is reduced by introducing intermittent driving, the value of a signal to be obtained is reduced, i.e., S/N is reduced. The smaller the subject brightness is, the smaller the size of the signal is. Therefore, the influence of the reduction in S/N is increased.

In order to solve this problem, in this embodiment, the following configuration is employed instead of outputting, as it is, the image whose duty ratio is reduced by introducing intermittent driving. That is, the configuration where the first photoelectric conversion section 111 having a high sensitivity and excellent S/N is provided in each pixel, blend combination is performed on an image obtained from the second photoelectric conversion section 112 whose dynamic range is expanded by introducing intermittent driving and an image obtained from the first photoelectric conversion section 111 having excellent S/N, and the combined image is output is employed.

The human visibility with respect to a subject having low brightness is higher than that with respect to a subject having high brightness. Therefore, instead of outputting, as it is, an image obtained from the second photoelectric conversion section 112 whose dynamic range is expanded by introducing intermittent driving, an image obtained by performing blend combination on the image obtained from the second photoelectric conversion section 112 and an image obtained from the first photoelectric conversion section 111 having a high sensitivity and excellent S/N is output. Accordingly, with the CMOS image sensor 100 according to this embodiment, it is possible to obtain excellent operations and effects of obtaining an image having an excellent dynamic range and excellent S/N, in which noise that the human eye can perceive is reduced.

Note that in order to perform blend combination on an image obtained from the first photoelectric conversion section 111 and an image obtained from the second photoelectric conversion section 112, the following processing is performed before performing the blend combination. That is, processing of multiplying the slope of the output characteristics of the second photoelectric conversion section 112 with respect to the subject brightness by a gain so that the slope becomes equal to the slope of the output characteristics of the first photoelectric conversion section 111 with respect to the subject brightness. Specifically, as shown in FIG. 34, the unit pixel 20 includes the gain calculation unit 205 for each pixel.

The gain calculation unit 205 performs processing of multiplying, for each pixel, gains corresponding to the difference of the slope of output characteristics due to the difference of the sensitivity between the first photoelectric conversion section 111 and the second photoelectric conversion section 112 and the difference of output characteristics due to the difference of the exposure time period for each pixel. By the processing, the slope of output characteristics of the second photoelectric conversion section 112 with respect to the subject brightness is made equal to the slope of output characteristics of the first photoelectric conversion section 111 with respect to the subject brightness.

The broken lines described in FIG. 48 show the output characteristics of the second photoelectric conversion section 112 with respect to the subject brightness after multiplying the gain. The slope of output characteristics represented by broken lines is made to correspond to output characteristics of the first photoelectric conversion section 111 with respect to the subject brightness. Accordingly, even in the case where there is a difference of the sensitivity between the first photoelectric conversion section 111 and the second photoelectric conversion section 112 or a difference of the exposure time period, operations and effects of obtaining a blended image in which these differences are eliminated after the blending.

Modified Example 1 of Seventh Embodiment

Figure 49:
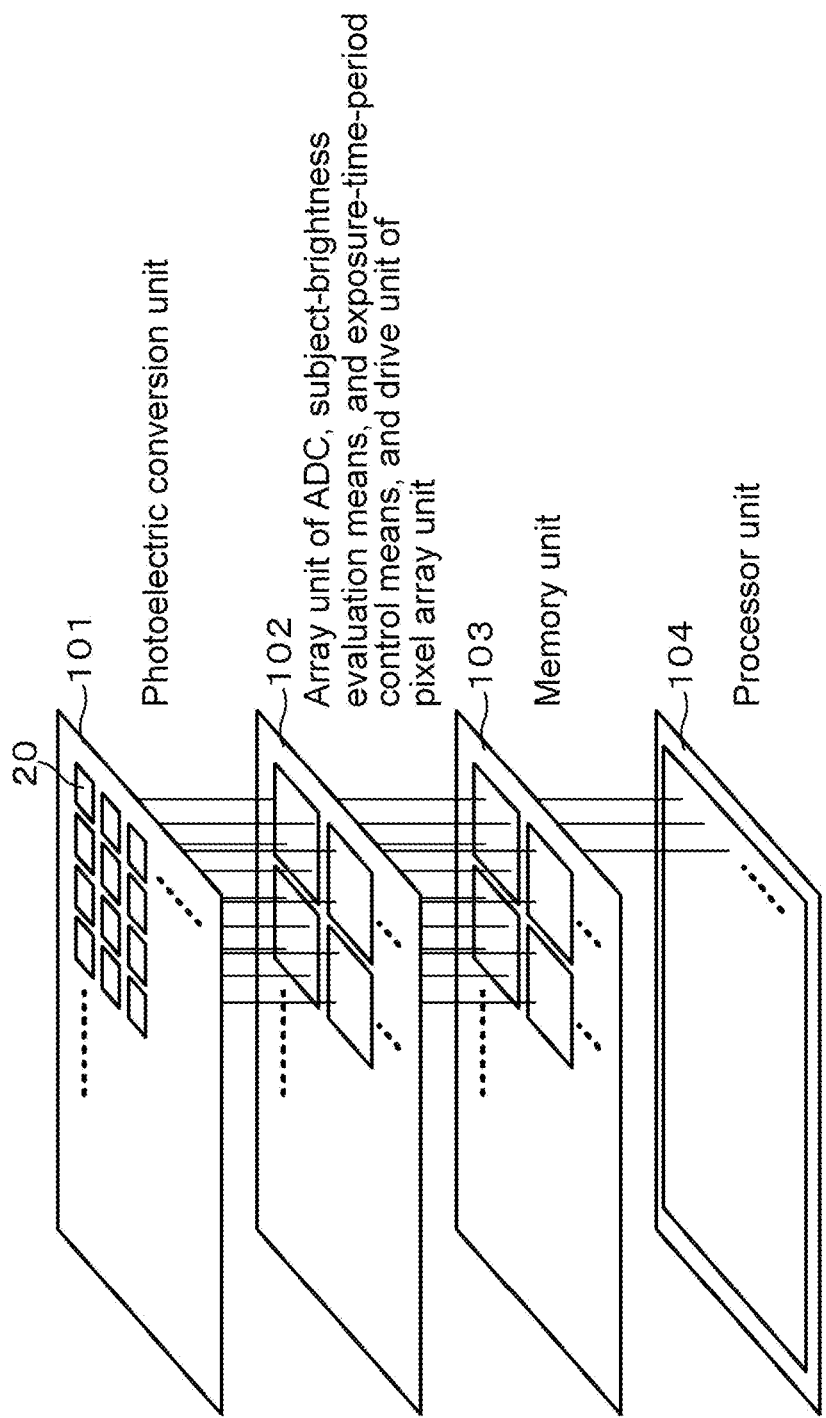
FIG. 49 is a schematic perspective view showing a three-dimensional configuration of a system of the CMOS image sensor according to a modified example 1 of the seventh embodiment.

A modified example 1 of the seventh embodiment is an example in which one pixel control unit and one pixel signal processing unit formed in the second semiconductor device layer 102 are responsible for controlling a plurality of unit pixels 20 and signal processing. The three-dimensional configuration of the system of the CMOS image sensor 100 according to the modified example 1 of the seventh embodiment is shown in FIG. 49.

In the seventh embodiment, the pixel control unit and the pixel signal processing unit formed in the second semiconductor device layer are included in each unit pixel 20. Meanwhile, in the modified example 1 of the seventh embodiment, one pixel control unit and one pixel signal processing unit formed in the second semiconductor device layer are responsible for control and signal processing in units of a plurality of pixels 20. Along with this, also the memory formed in the third semiconductor device layer 103 is provided corresponding to the pixel control unit and the pixel signal processing unit responsible for controlling the plurality of unit pixels 20 and signal processing.

With the CMOS image sensor 100 according to the above-mentioned modified example 1 of the seventh embodiment, it is possible to increase the area of one pixel control unit and one pixel signal processing unit. Accordingly, since more transistors can be mounted on the pixel control unit and the pixel signal processing unit, operations and effects of realizing more advanced functions are provided.

Modified Example 2 of Seventh Embodiment

Figure 50:
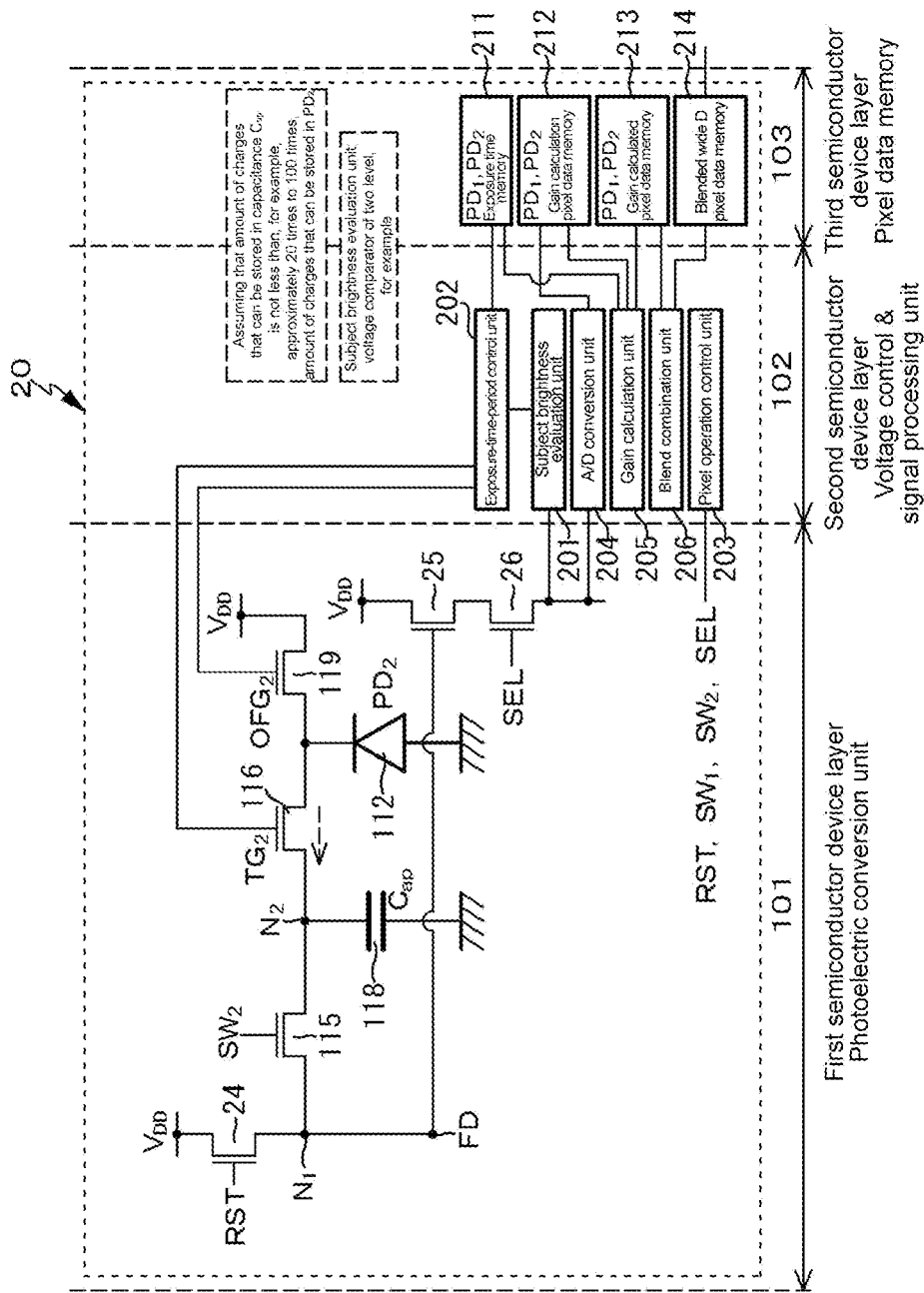
FIG. 50 is an internal configuration diagram of a unit pixel in a CMOS image sensor according to a modified example 2 of the seventh embodiment.

A modified example 2 of the seventh embodiment is an example in which the unit pixel 20 includes one photoelectric conversion section. FIG. 50 is an internal configuration diagram of the unit pixel 20 in the CMOS image sensor 100 according to the second modified example of the seventh embodiment.

As shown in FIG. 50, the unit pixel 20 according to the modified example 2 of the seventh embodiment includes only the second photoelectric conversion section 112 as a photoelectric conversion section, and the first photoelectric conversion section 111 shown in FIG. 35 is omitted. The configurations of the second photoelectric conversion section 112 and its surroundings are the same as those of the unit pixel 20 described in FIG. 35.

That is, the second photoelectric conversion section 112, the fourth transfer gate unit 116 having the overflow path, the charge storing unit 118, the discharge gate unit 119, and the subject brightness evaluation unit 201 as the amount-of-charge evaluation section and the exposure-time-period control unit 202 as the exposure-time-period control section formed in the second semiconductor device layer 102 are provided. The charge storing unit 118 is capable of storing charges more than (e.g., 100 times the amount of charges that can be stored in the second photoelectric conversion section 112) the amount of charges that can be stored in the second photoelectric conversion section 112.

In the unit pixel 20 having the above-mentioned configuration according to the modified example 2 of the seventh embodiment, intermittent driving for expanding the dynamic range with respect to the second photoelectric conversion section 112 can be performed in the same way as that of the intermittent driving described in the seventh embodiment. Since the method of evaluating charges overflowed from the second photoelectric conversion section 112 and a method of performing intermittent driving on the second photoelectric conversion section are the same as those in the seventh embodiment, description thereof will be omitted.

Figure 51:
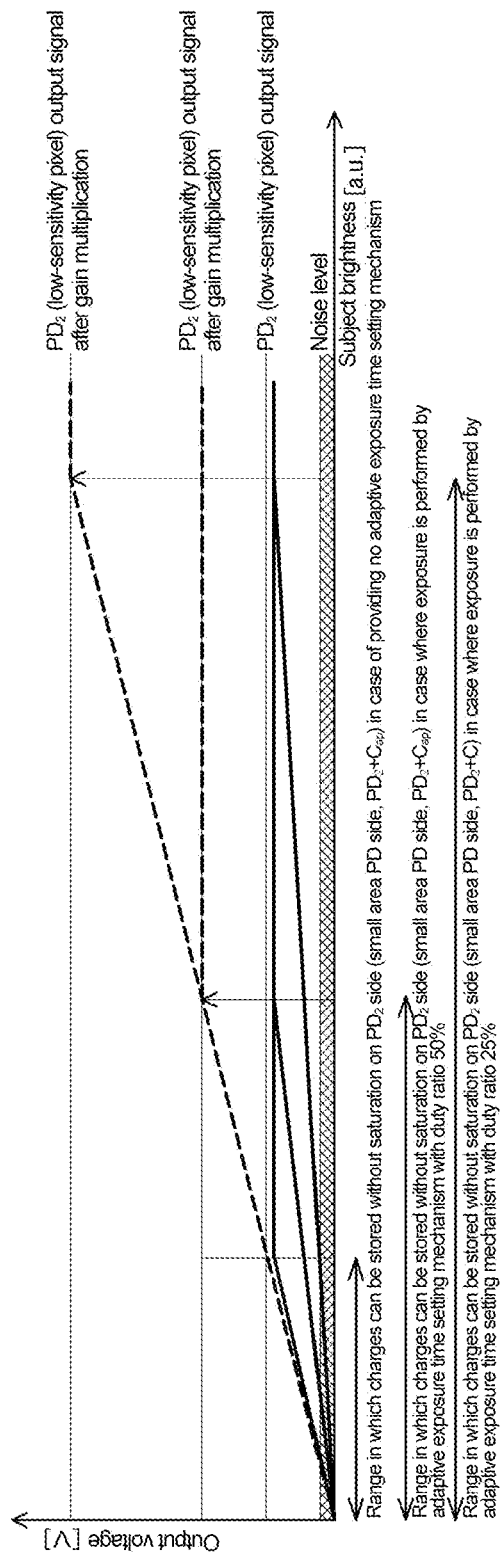
FIG. 51 is a diagram obtained by plotting output voltage obtained by an exposure operation of a second photoelectric conversion section of a CMOS image sensor according to a modified example 2 of the seventh embodiment.

In the modified example 2 of the seventh embodiment, output of the second photoelectric conversion section 112 obtained by an exposure operation will be described using FIG. 51. FIG. 51 is a diagram obtained by plotting output voltage obtained by an exposure operation of the second photoelectric conversion section 112.

In the modified example 2, a mechanism that intermittently performs exposure for each pixel depending on the brightness of a subject to obtain an image having a high dynamic range is provided similarly to the seventh embodiment. Before outputting images captured in time periods different for each pixel, gain calculation for eliminating the difference of the exposure time period is performed. Similarly to FIG. 48, solid lines described in FIG. 51 represent output characteristics in the case of performing intermittent driving with duty ratios of 100%, 50%, and 25%. The above-mentioned gain calculation is performed on the output characteristics for each pixel, gain calculation for making the slopes of output characteristics equal to each other is performed irrespective of the duty ratio of intermittent driving as described by broken lines in FIG. 51, and the image after the calculation is output.

Modified Example 3 of Seventh Embodiment

Figure 52:
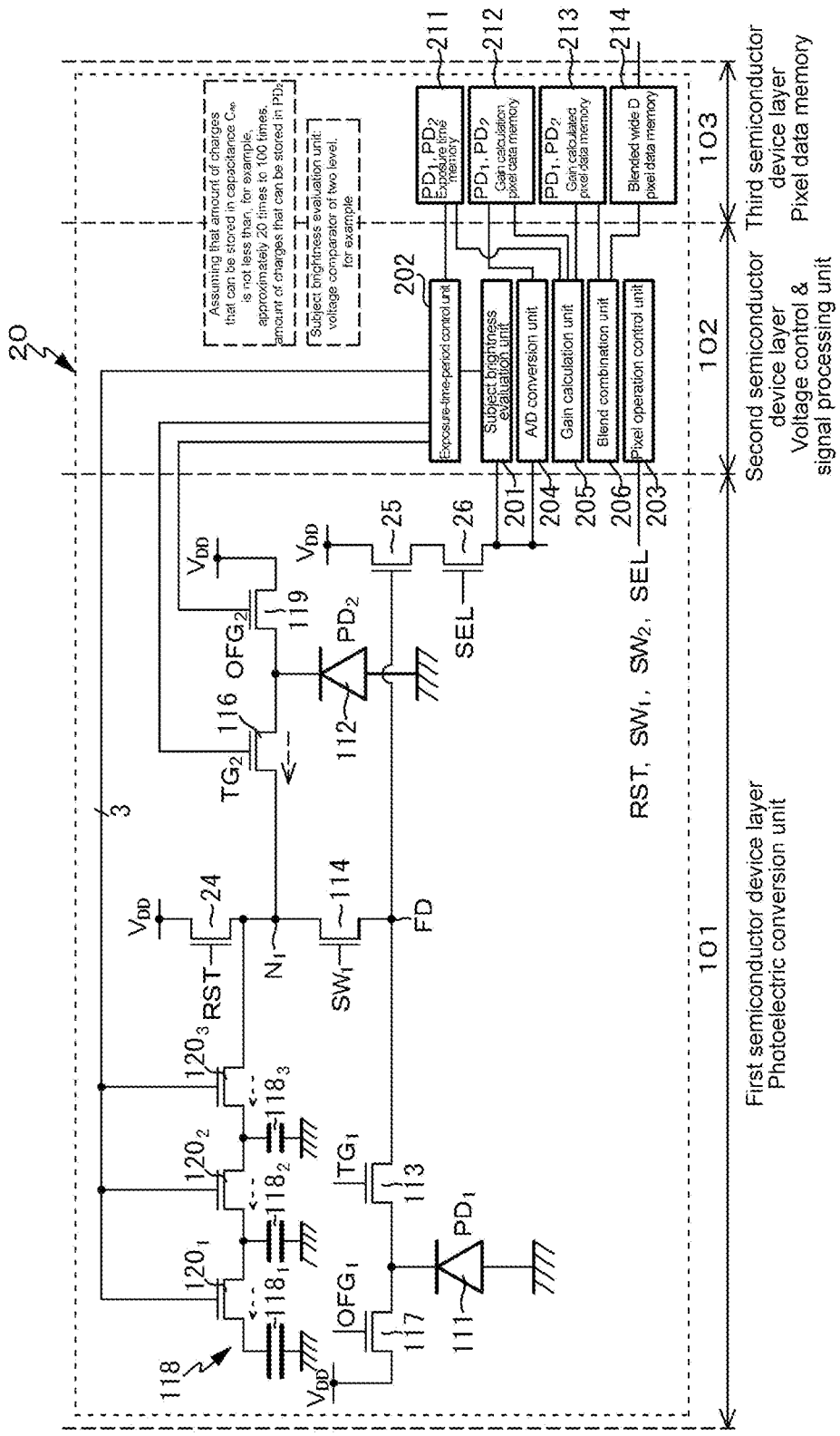
FIG. 52 is an internal configuration diagram of a unit pixel in a CMOS image sensor according to a modified example 3 of the seventh embodiment.

A modified example 3 of the seventh embodiment is an example in which the magnitude of the capacitance of the charge storing unit is changed for each pixel depending on the subject brightness. FIG. 52 is an internal configuration diagram of the unit pixel 20 in the CMOS image sensor 100 according to the modified example 3 of the seventh embodiment.

Also in the modified example 3, one unit pixel 20 is formed across the first, second, and third semiconductor device layers 101, 102, and 103 similarly to the seventh embodiment. Then, in these first, second, and third semiconductor device layers 101, 102, and 103, a plurality of unit pixels 20 are arranged in a two-dimensional array of a column direction and a row direction.

In the modified example 3 described in FIG. 52, the unit pixel 20 includes a mechanism that changes the magnitude of the capacitance of the charge storing unit 118 for each pixel. Specifically, the charge storing unit 118 includes a plurality of charge storing units, e.g., three charge storing units $118_1$, $118_2$, and $118_3$. These three charge storing units $118_1$, $118_2$, and $118_3$ are connected in parallel to each other via transfer gate units $120_1$, $120_2$, and $120_3$ arranged therebetween.

In the case where a large capacitance is required as the capacitance of the charge storing unit 118, the transfer gate units $120_1$, $120_2$, and $120_3$ are made conductive, and the three charge storing units $118_1$, $118_2$, and $118_3$ are connected in parallel to each other to increase the magnitude of the capacitance. In the case where the required magnitude of the capacitance is small, the transfer gate units $120_1$, $120_2$, and $120_3$ between the charge storing units $118_1$, $118_2$, and $118_3$ are made nonconductive to disconnect the capacitance.

Control of conduction/non-conduction of the transfer gate units $120_1$, $120_2$, and $120_3$ is performed under control by the exposure-time-period control unit 202. That is, the exposure-time-period control unit 202 has also a function of a capacitance control unit that controls the magnitude of the capacitance of the charge storing unit 118.

In the above-mentioned seventh embodiment, the unit pixel 20 evaluates, at a certain point in the exposure period, the amount of charges stored in the charge storing unit 118 until that time by using the subject brightness evaluation unit 201, and controls the length of the future exposure period depending on the magnitude of the brightness of a subject.

In the modified example 3, controls is performed such that the unit pixel 20 evaluates, at a certain point in the exposure period, the amount of charges stored in the charge storing unit 118 until that time by using the subject brightness evaluation unit 201, and changes, for each pixel, the magnitude of the capacitance of the charge storing unit 118 included in the unit pixel 20 depending on the magnitude of the brightness of a subject.

In the case where the brightness of a subject is high, in order to prevent the charge storing unit 118 from being saturated, and obtain data with gradation, it is preferable that the value of the capacitance of the charge storing unit 118 is large. However, in the case of transferring signal charges obtained as a result of a photoelectric conversion operation to the floating diffusion FD for charge-voltage conversion, output voltage of the floating diffusion FD is reduced, i.e., sensitivity is reduced as the capacitance of the charge storing unit 118 is larger.

In this regard, in the modified example 3, in the case where it is predicted that the charge storing unit 118 is not saturated, output with a high sensitivity is obtained from the floating diffusion FD by performing control such that the magnitude of the capacitance of the charge storing unit 118 is reduced. A large capacitance is not required as the capacitance of the charge storing unit 118, in the case where the brightness of a subject is small. As can be seen from the output characteristics in FIG. 49, in the case where the brightness of a subject is small, since the signal is smaller than that in the case where the brightness of the subject is high, S/N is inferior to that in the case where the brightness of the subject is high.

Meanwhile, the human visibility with respect to a subject having small brightness is higher than that with respect to a subject having high brightness. In the pixel that images a subject with small brightness, in which the signal is small and S/N is inferior, irrespective of the high human visibility, the modified example 3 provides operations and effects of improving the S/N by reducing the capacitance of the charge storing unit 118 used in the unit pixel 20.

Modified Example 4 of Seventh Embodiment

In a modified example 4 of the seventh embodiment, both (1) means for evaluating the brightness of a subject and changing the exposure time period according to the result, which is provided in the seventh embodiment, and (2) means for evaluating the brightness of a subject and changing the capacitance of the charge storing unit 118 according to the result, which is provided in the modified example 3 of the seventh embodiment, are provided for each pixel (not shown).

In the modified example 4, the range of brightness of a subject in which an image can be captured with gradation is expanded by maximizing the capacitance of the charge storing unit 118 and performing an intermittent exposure operation in the pixel that images a subject with large brightness, thereby making it possible to capture an image with a wide dynamic range.

At the same time, in the modified example 4, an exposure operation is continued in the exposure period without performing an intermittent exposure operation in the pixel that images a subject with small brightness, thereby obtaining as many signal charges as possible. Further, by reducing the capacitance of the charge storing unit 118 to reduce the capacitance in the case where signal charges are transferred to the floating diffusion FD and charge-voltage conversion is performed, large output voltage is obtained from the floating diffusion FD. This makes it possible to capture an image with high S/N.

As described above, by providing both of the above-mentioned (1) and (2) for each pixel, the modified example 4 provides operations and effects of making it possible to capture an image with a wide dynamic range and high S/N in the case of imaging subjects including a subject with large brightness and a subject with small brightness.

Also the above-mentioned solid-state image pickup device according to the seventh embodiment and the modified examples thereof can be used as an imaging unit of the electronic apparatus such as an imaging apparatus described in FIG. 33, similarly to the solid-state image pickup device according to the first embodiment to the sixth embodiment. The solid-state image pickup device according to the seventh embodiment and the modified examples thereof is capable of expanding the dynamic range by intermittent driving with respect to storing of signal charges, similarly to the solid-state image pickup device according to the first embodiment to the sixth embodiment. Accordingly, it is possible to improve the image quality of the imaging apparatus 50.

It should be noted that the present technology may take the following configurations.

[1] A solid-state image pickup device, including:
a pixel array unit, unit pixels being arranged in the pixel array unit, the unit pixels each including a plurality of photoelectric conversion sections; and
a driving unit that changes a sensitivity ratio of the plurality of photoelectric conversion sections by performing intermittent driving with respect to storing of signal charges of the plurality of photoelectric conversion sections.

[2] The solid-state image pickup device according to [1] above, in which
the plurality of photoelectric conversion sections each include a first photoelectric conversion section and a second photoelectric conversion section, and
the unit pixels each include a charge-voltage conversion section, a first transfer gate unit, a second transfer gate unit, and a discharge gate unit, the first transfer gate unit transferring charges photoelectrically converted by the first photoelectric conversion section to the charge-voltage conversion section, the second transfer gate unit transferring charges photoelectrically converted by the second photoelectric conversion section to the charge-voltage conversion section, the discharge gate unit discharging the charges photoelectrically converted by the second photoelectric conversion section.

[3] The solid-state image pickup device according to [2] above, in which
the discharge gate unit discharges the charges photoelectrically converted by the second photoelectric conversion section to the first photoelectric conversion section.

[4] The solid-state image pickup device according to [2] or [3] above, in which
the intermittent driving is intermittent driving by a pulse signal for driving the discharge gate unit and the second transfer gate unit.

[5] The solid-state image pickup device according to any one of [2] to [4] above, in which
the driving unit causes the second transfer gate unit and the discharge gate unit to alternately operate with the same frequency in an exposure period so that conduction periods of the second transfer gate unit and the discharge gate unit do not overlap.

[6] The solid-state image pickup device according to [3] above, in which
a gate electrode forming the discharge gate unit is provided to overlap with a part of the first photoelectric conversion section.

[7] The solid-state image pickup device according to [3] above in which
the discharge gate unit includes two gate units arranged in series between the second photoelectric conversion section and the first photoelectric conversion section, and
of the two gate units, the gate unit on a side of the first photoelectric conversion section includes a gate electrode provided to overlap with a part of the first photoelectric conversion section.

[8] The solid-state image pickup device according to [2] or [3] above, in which
the unit pixels each include an amplification transistor, a reset transistor, and a first switching gate unit, the amplification transistor outputting voltage converted by the charge-voltage conversion section, the reset transistor resetting the charge-voltage conversion section, the first switching gate unit being provided between the first transfer gate unit and the reset transistor, and
the charge-voltage conversion section has a first area and a second area, the first area being surrounded by the first transfer gate unit, the amplification transistor, and the first switching gate unit, the second area being surrounded by the first switching gate unit, the reset transistor, and the second transfer gate unit.

[9] The solid-state image pickup device according to [8] above, in which
the first switching gate unit is capable of switching a high-conversion efficiency mode and a low-conversion efficiency mode with respect to the charge-voltage conversion section when reading signal charges of the first photoelectric conversion section.

[10] The solid-state image pickup device according to [8] or [9] above, in which
the unit pixels each include a capacitive element connected to the second area.

[11] The solid-state image pickup device according to [2] or [3] above, in which
the unit pixels each include an amplification transistor, a reset transistor, and a second switching gate unit, the amplification transistor outputting voltage converted by the charge-voltage conversion section, the reset transistor resetting the charge-voltage conversion section, the second switching gate unit being provided between the second transfer gate unit and the reset transistor, and the charge-voltage conversion section has a first area and a second area, the first area being surrounded by the first transfer gate unit, the amplification transistor, and the second switching gate unit, the second area being located between the second transfer gate unit and the second switching gate unit.

[12] The solid-state image pickup device according to [11] above, in which the unit pixels each include a capacitive element connected to the second area.

[13] The solid-state image pickup device according to [2] or [3] above, in which the unit pixels each include an amplification transistor, a reset transistor, a first switching gate unit, and a second switching gate unit, the amplification transistor outputting voltage converted by the charge-voltage conversion section, the reset transistor resetting the charge-voltage conversion section, the first switching gate unit being provided between the first transfer gate unit and the reset transistor, the second switching gate unit being provided between the second transfer gate unit and the reset transistor, and the charge-voltage conversion section has a first area, a second area, and a third area, the first area being surrounded by the first transfer gate unit, the amplification transistor, and the first switching gate unit, the second area being surrounded by the first switching gate unit, the second switching gate unit, and the reset transistor, the third area being located between the second transfer gate unit and the second switching gate unit.

[14] The solid-state image pickup device according to [13] above, in which the unit pixels each include a capacitive element connected to the third area.

[15] The solid-state image pickup device according to [1] above, in which the plurality of photoelectric conversion sections each include a first photoelectric conversion section and a second photoelectric conversion section, the unit pixels each include a charge storing unit, a first transfer gate unit, second and third transfer gate units, a fourth transfer gate unit, a discharge gate unit, an exposure-time-period control section, and an amount-of-charge evaluation section, the first transfer gate unit transferring charges photoelectrically converted by the first photoelectric conversion section to the charge-voltage conversion section, the second and third transfer gate units each coupling potentials of the charge storing unit and the charge-voltage conversion section, the fourth transfer gate unit transferring charges photoelectrically converted by the second photoelectric conversion section to the charge storing unit, the discharge gate unit discharging the charges photoelectrically converted by the second photoelectric conversion section, the exposure-time-period control section controlling an exposure time period of an exposure operation in the second photoelectric conversion section by controlling conduction/non-conduction of the fourth transfer gate unit and the discharge gate unit, the amount-of-charge evaluation section evaluating an amount of charges stored in the charge storing unit at a point in a period of one exposure operation in the second photoelectric conversion section, an overflow path is formed on a lower portion of a gate electrode of the fourth transfer gate unit, the overflow path transferring charges overflowed from the second photoelectric conversion section to the charge storing unit, and the exposure-time-period control section controls, depending on an evaluation result of the amount-of-charge evaluation section, the exposure time period after evaluation by the amount-of-charge evaluation section in the one exposure operation in the second photoelectric conversion section.

[16] A solid-state image pickup device, including:

a pixel array unit including unit pixels, the unit pixels each including a photoelectric conversion section;

a driving unit that performs intermittent driving with respect to storing of signal charges of the photoelectric conversion section; and a control system that controls an exposure time period of the photoelectric conversion section on the basis of a signal level obtained from the photoelectric conversion section.

[17] The solid-state image pickup device according to [16] above, in which the control system includes a subject brightness evaluation section and an exposure-time-period control section, the subject brightness evaluation section evaluating brightness of a subject on the basis of the signal level obtained from the photoelectric conversion section, the exposure-time-period control section controlling an exposure time period by controlling a pulse width of a pulse signal that performs intermittent driving with respect to storing of signal charges of the photoelectric conversion section on the basis of an evaluation result of the subject brightness evaluation section.

[18] A solid-state image pickup device, including:

a pixel array unit including unit pixels, the unit pixels each including a photoelectric conversion section, in which the unit pixels each include a charge storing unit, a transfer gate unit, a discharge gate unit, an exposure-time-period control section, and an amount-of-charge evaluation section, the transfer gate unit transferring charges photoelectrically converted by the photoelectric conversion section to the charge storing unit, the discharge gate unit discharging the charges photoelectrically converted by the photoelectric conversion section, the exposure-time-period control section controlling an exposure time period of an exposure operation in the photoelectric conversion section by controlling conduction/non-conduction of the transfer gate unit and the discharge gate unit, the amount-of-charge evaluation section evaluating an amount of charges stored in the charge storing unit at a point in a period of one exposure operation in the photoelectric conversion section, and the exposure-time-period control section controls, depending on an evaluation result of the amount-of-charge evaluation section, the exposure time period after evaluation by the amount-of-charge evaluation section in the one exposure operation by the photoelectric conversion section.

[19] A method of driving a solid-state image pickup device, including:

in driving the solid-state image pickup device including a pixel array unit, unit pixels being arranged in the pixel array unit, the unit pixels each including a plurality of photoelectric conversion sections, changing a sensitivity ratio of the plurality of photoelectric conversion sections by performing intermittent driving with respect to storing of signal charges of the plurality of photoelectric conversion sections.

[20] An electronic apparatus, including:

a solid-state image pickup device including a pixel array unit, unit pixels being arranged in the pixel array unit, the unit pixels each including a plurality of photoelectric conversion sections, and a driving unit that changes a sensitivity ratio of the plurality of photoelectric conversion sections by performing intermittent driving with respect to storing of signal charges of the plurality of photoelectric conversion sections.

REFERENCE SIGNS LIST 10 (10A, 10B), 100 CMOS image sensor
11 pixel array unit
12 vertical driving unit
13 column processing unit
14 vertical driving unit
15 system control unit
16 ($16_1$ to $16_m$) pixel drive line
17 ($17_1$ to $17_n$) vertical signal line
18 signal processing unit
19 data storing unit
20 unit pixel
21, 22 transfer transistor (transfer gate unit)
23, 27 shutter transistor (discharge gate unit)
24 reset transistor
25 amplification transistor
26 selection transistor
28 ($28_1$, $28_2$) FD switching transistor
31 subject brightness evaluation section
32 exposure-time-period control section
50 imaging apparatus
51 optical system
52 imaging unit
53 DSP circuit
54 frame memory
55 display apparatus
56 recording apparatus
57 operation system
58 power source system
59 bus line
101 first semiconductor device layer
102 second semiconductor device layer
103 third semiconductor device layer
104 fourth semiconductor device layer
105 fifth semiconductor device layer
111 first photoelectric conversion section
112 second photoelectric conversion section
113 first transfer gate unit
114 second transfer gate unit
115 third transfer gate unit
116 fourth transfer gate unit
117 first discharge gate unit
118 charge storing unit
119 second discharge gate unit
201 subject brightness evaluation unit
202 exposure-time-period control unit
203 pixel operation control unit
204 A/D (analog/digital) conversion unit
205 gain calculation unit
206 blend combination unit
211 exposure time memory 211
212 gain calculation pixel data memory
213 gain calculated pixel data memory
214 blended wide D pixel data memory
221 nonlinear compression processing unit
222 image signal processing unit
301 first on-chip lens
302 second on-chip lens
$C_{ap}$ capacitive element
FD, $FD_1$, $FD_2$ floating diffusion
$PD_1$ first photodiode
$PD_2$ second photodiode

The invention claimed is:

1. An imaging device comprising:
   a pixel comprising:
   a first photoelectric converter;
   a first transfer transistor coupled to the first photoelectric converter;
   a first capacitance coupled to the first transfer transistor;
   a reset transistor coupled to the first capacitance;
   a second photoelectric converter;
   a second transfer transistor coupled to the second photoelectric converter;
   a second capacitance coupled to the second transfer transistor;
   a third transfer transistor coupled between the first and the second capacitances;
   a fourth transfer transistor coupled between the first and the second photoelectric converters;
   an amplification transistor coupled to the first capacitance, wherein a sensitivity of the first photoelectric converter is higher than a sensitivity of the second photoelectric converter;
   a third capacitance coupled to the reset transistor; and
   a fifth transfer transistor coupled between the third capacitance and the first capacitance.

2. The imaging device according to claim 1, wherein the pixel further comprises a selection transistor coupled to the amplification transistor.

3. The imaging device according to claim 1, wherein the reset transistor is configured to reset the first and the second capacitances.

4. The imaging device according to claim 1, wherein the reset transistor is configured to reset the first, the second and the third capacitances.

5. The imaging device according to claim 1, wherein the second capacitance is configured to receive a power source voltage.

6. The imaging device according to claim 1, wherein a light receiving surface of the first photoelectric converter is larger than a light receiving surface of the second photoelectric converter.

7. An imaging device, comprising:
   a pixel including:
   a first photoelectric converter disposed in a first region of a substrate;
   a second photoelectric converter disposed in a second region of the substrate, wherein the second region is diagonal to the first region in a plan view;
   a first transfer transistor at a third region of the substrate and coupled to the first photoelectric converter;
   a first capacitance at the third region and coupled to the first transfer transistor;
   a reset transistor at a fourth region of the substrate and coupled to the first capacitance, wherein the fourth region is diagonal to the third region in the plan view;
   a second transfer transistor at the fourth region and coupled to the second photoelectric converter;
   a second capacitance at the fourth region and coupled to the second transfer transistor;
   a third transfer transistor at the fourth region and disposed between the first and the second capacitances in the plan view;
   a fourth transfer transistor coupled between the first and the second photoelectric converter, wherein the fourth transfer transistor bridges the first region and the second region in the plan view; and an amplification transistor at the third region and coupled to the first capacitance, wherein a sensitivity of the first photoelectric converter is higher than a sensitivity of the second photoelectric converter.

8. The imaging device according to claim 7, wherein the pixel further comprises a third capacitance coupled to the reset transistor.

9. The imaging device according to claim 8, wherein the pixel further comprises a fifth transfer transistor at the third region and coupled between the third capacitance and the first capacitance.

10. The imaging device according to claim 7, wherein the pixel further comprises a selection transistor at the fourth region and coupled to the amplification transistor.

11. The imaging device according to claim 7, wherein the reset transistor is configured to reset the first and the second capacitances.

12. The imaging device according to claim 8, wherein the reset transistor is configured to reset the first, the second and the third capacitances.

13. The imaging device according to claim 7, wherein the second capacitor is configured to receive a power source voltage.

14. The imaging device according to claim 7, wherein, in the plan view, a surface area of the first photoelectric converter is greater than a surface area of the second photoelectric converter.

15. An imaging device comprising:
a pixel comprising:
a first photoelectric converter;
a first transfer transistor coupled to the first photoelectric converter;
a first capacitance coupled to the first transfer transistor;
a reset transistor coupled to the first capacitance;
a second photoelectric converter;
a second transfer transistor coupled to the second photoelectric converter;
a second capacitance coupled to the second transfer transistor;
a third transfer transistor coupled between the first and the second capacitances;
a fourth transfer transistor coupled between the first and the second photoelectric converters;
an amplification transistor coupled to the first capacitance;
a third capacitance coupled to the reset transistor; and
a fifth transfer transistor coupled between the third capacitance and the first capacitance; and
a driving unit that drives the second transfer transistor and the fourth transfer transistor to adjust a sensitivity ratio of the first photoelectric converter to the second photoelectric converter.

16. The imaging device according to claim 15, wherein the driving unit adjusts the sensitivity ratio by reducing a sensitivity of the second photoelectric converter during an exposure period.

17. The imaging device according to claim 16, wherein the driving unit reduces the sensitivity of the second photoelectric converter by discharging charge generated by the second photoelectric converter through the second capacitance.

18. The imaging device according to claim 17, wherein the driving unit alternates OFF/ON states of the second transistor and the fourth transistor during the exposure period to discharge the charge through the second capacitance.

* * * * *